US012796211B2

(12) United States Patent
Lee et al.

(10) Patent No.: US 12,796,211 B2
(45) Date of Patent: Nov. 10, 2026

(54) DISPLAY DEVICE AND MANUFACTURING METHOD FOR THE SAME

(71) Applicant: Samsung Display Co., Ltd., Yongin-si (KR)

(72) Inventors: Hyun-Ju Lee, Yongin-si (KR); Heejin Kang, Yongin-si (KR); Wooyoung Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 276 days.

(21) Appl. No.: 18/425,780

(22) Filed: Jan. 29, 2024

(65) Prior Publication Data

US 2024/0284699 A1 Aug. 22, 2024

(30) Foreign Application Priority Data

Feb. 3, 2023 (KR) ........................ 10-2023-0015158

(51) Int. Cl.

| | |
|---|---|
| ***H10K 50/155*** | (2023.01) |
| ***H10K 50/165*** | (2023.01) |
| ***H10K 50/17*** | (2023.01) |
| ***H10K 59/131*** | (2023.01) |
| ***H10K 102/00*** | (2023.01) |

(52) U.S. Cl.

CPC ......... *H10K 50/155* (2023.02); *H10K 50/165* (2023.02); *H10K 50/171* (2023.02); *H10K 59/131* (2023.02); *H10K 2102/351* (2023.02)

(58) Field of Classification Search

CPC . H10W 50/86; H10W 50/155; H10W 50/165; H10W 50/166; H10W 50/171; H10W 59/123; H10W 59/131; H10K 2102/351

See application file for complete search history.

(56) References Cited

U.S. PATENT DOCUMENTS

| | | | | |
|---|---|---|---|---|
| 9,692,013 | B2 | 6/2017 | Lee et al. | |
| 11,545,643 | B2 | 1/2023 | Yang et al. | |
| 2018/0294319 | A1 | 10/2018 | Liu | |
| 2019/0326542 | A1* | 10/2019 | Yang | H10K 50/15 |
| 2021/0313537 | A1* | 10/2021 | Yang | H10K 50/15 |
| 2021/0408429 | A1 | 12/2021 | Yang et al. | |
| 2022/0165807 | A1* | 5/2022 | Hamada | H10K 50/13 |
| 2022/0238608 | A1 | 7/2022 | Moon et al. | |
| 2023/0030918 | A1 | 2/2023 | Lee et al. | |

FOREIGN PATENT DOCUMENTS

| | | | |
|---|---|---|---|
| CN | 107068718 | A | 8/2017 |
| KR | 10-1074665 | B1 | 10/2011 |
| KR | 10-2015-0060391 | A | 6/2015 |
| KR | 10-2019-0123829 | A | 11/2019 |
| KR | 10-2022-0109547 | A | 8/2022 |

* cited by examiner

*Primary Examiner* — David C Spalla

(74) *Attorney, Agent, or Firm* — Womble Bond Dickinson (US) LLP

(57) ABSTRACT

A display device includes a base layer including first and second pixel areas, and a non-pixel area, a first electrode on base layer, a first light emitting stack on first electrode and including a first emission layer, a n-type charge generating layer on first light emitting stack, a p-type charge generating layer on the n-type charge generating layer, a second light emitting stack including a hole transport region on the p-type charge generating layer, and a second emission layer on hole transport region, and a second electrode on the second light emitting stack.

20 Claims, 31 Drawing Sheets

DISPLAY DEVICE AND MANUFACTURING METHOD FOR THE SAME

CROSS-REFERENCE TO RELATED APPLICATION

This application claims priority to and the benefit of Korean Patent Application No. 10-2023-0015158, filed on Feb. 3, 2023, in the Korean Intellectual Property Office, the entire content of which is hereby incorporated by reference.

BACKGROUND

1. Field

Embodiments of the present disclosure herein relate to a display device and a manufacturing method for the same, and for example, to a display device having improved reliability and a manufacturing method for the same.

2. Description of the Related Art

Electronic devices providing images to users, such as cellular phones, digital cameras, laptop computers, navigations and televisions include display devices for displaying images.

In display devices, pixels are divided into red, green and blue pixels for displaying different colors, and an emission layer with the corresponding color of each corresponding pixel may be formed for each pixel. Generally, an emission layer is formed by a deposition method utilizing a shadow mask, but defects including mask sagging may occur, and accordingly, a process of forming an emission layer and other organic layers commonly over all pixels through an open mask has been developed.

However, when an organic layer is formed commonly, lateral leakage current may occur between adjacent pixels due to the organic layer provided in common, and thus, color mixing between adjacent pixels and luminance defects may be generated. SUMMARY Aspects of embodiments of the present disclosure are directed toward a display device which is capable of preventing or reducing color mixing between adjacent pixels and luminance deterioration.

Additional aspects will be set forth in part in the description which follows and, in part, will be apparent from the description, or may be learned by practice of the presented embodiments of the disclosure.

An embodiment of the present disclosure provides a display device including a base layer in which multiple pixel areas including a first pixel area and a second pixel area adjacent to the first pixel area, and a non-pixel area around (e.g., surrounding) the multiple pixel areas, a first electrode disposed on the base layer, a first light emitting stack disposed on the first electrode and including a first emission layer, an n-type or kind charge generating layer (e.g., an n-charge generating or generation layer) disposed on the first light emitting stack, a p-type or kind charge generating layer (e.g., a p-charge generating or generation layer) disposed on the n-type or kind charge generating layer, a second light emitting stack including a hole transport region disposed on the p-type or kind charge generating layer, and a second emission layer disposed on the hole transport region, and a second electrode disposed to the second light emitting stack, wherein the p-type or kind charge generating layer includes a first p-type or kind charge generating layer overlapping with the first pixel area, and a second p-type or kind charge generating layer overlapping with the second pixel area and separately disposed from the first p-type or kind charge generating layer, and the hole transport region includes a 1-1$^{st}$ hole transport region overlapping with the first pixel area, and a 1-2$^{nd}$ hole transport region overlapping with the second pixel area and separately disposed from the 1-1$^{st}$ hole transport region.

In an embodiment, the first emission layer may include a 1-1$^{st}$ emission layer overlapping with the first pixel area, and a 1-2$^{nd}$ emission layer overlapping with the second pixel area, and the second emission layer includes a 2-1$^{st}$ emission layer overlapping with the first pixel area, and a 2-2$^{nd}$ emission layer overlapping with the second pixel area.

In an embodiment, the 2-1$^{st}$ emission layer and the 2-2$^{nd}$ emission layer may be separately disposed from each other.

In an embodiment, the n-type or kind charge generating layer may be a common layer disposed on the 1-1$^{st}$ emission layer and the 1-2$^{nd}$ emission layer.

In an embodiment, a thickness of the 1-2$^{nd}$ emission layer may be greater than a thickness of the 1-1$^{st}$ emission layer, and a thickness of the 2-2$^{nd}$ emission layer may be greater than a thickness of the 2-1$^{st}$ emission layer.

In an embodiment, the n-type or kind charge generating layer may have a constant thickness in the first pixel area and the second pixel area, and disposed to have a step on the 1-1$^{st}$ emission layer and the 1-2$^{nd}$ emission layer, and the step may be defined as a height difference between a top surface of the n-type or kind charge generating layer overlapping with the first pixel area and a top surface of the n-type or kind charge generating layer overlapping with the second pixel area.

In an embodiment, the 1-1$^{st}$ emission layer and the 1-2$^{nd}$ emission layer may be configured to emit a first light, and the 2-1$^{st}$ emission layer and the 2-2$^{nd}$ emission layer may be configured to emit a second light which is different from the first light.

In an embodiment, the first light may be blue light, and the second light may be red light or green light.

In an embodiment, the second p-type or kind charge generating layer may be overlapped with at least a portion of the first p-type or kind charge generating layer on a plane, and the overlapping portion with the first p-type or kind charge generating layer on the plane among the second p-type or kind charge generating layer may be separately disposed from the first p-type or kind charge generating layer on a cross-section.

In an embodiment, the first p-type or kind charge generating layer and the second p-type or kind charge generating layer on the cross-section may be separately disposed with at least one among the 1-1$^{st}$ hole transport region and the 1-2$^{nd}$ hole transport region therebetween.

In an embodiment, a buffer layer disposed between the n-type or kind charge generating layer and the p-type or kind charge generating layer may be further included.

In an embodiment, the second light emitting stack may further include an electron transport region disposed between the second emission layer and the second electrode, and the first light emitting stack may further include a first hole transport region disposed between the first electrode and the first emission layer, and a first electron transport region disposed on the first emission layer.

In an embodiment, the multiple pixel areas may further include a third pixel area adjacent to the second pixel area, the p-type or kind charge generating layer may further include a third p-type or kind charge generating layer which is overlapping with the third pixel area and is separately disposed from the first p-type or kind charge generating layer and the second p-type or kind charge generating layer, and the hole transport region may further include a 1-$3^{rd}$ hole transport region which is disposed on the third p-type or kind charge generating layer and is separately disposed from the first of the 1-$1^{st}$ hole transport region and the 1-$2^{nd}$ hole transport region.

According to another embodiment of the present disclosure, a display device may include a base layer in which multiple pixel areas including a first pixel area configured to emit a first light and a second pixel area configured to emit a second light which is different from the first light, and a non-pixel area around (e.g., surrounding) the multiple pixel areas, a first electrode disposed on the base layer, a 1-$1^{st}$ emission layer disposed on the first electrode and overlapping with the first pixel area, a 1-$2^{nd}$ emission layer disposed on the first electrode and overlapping with the second pixel area, an n-type or kind charge generating layer disposed on the 1-$1^{st}$ emission layer and the 1-$2^{nd}$ emission layer, a first p-type or kind charge generating layer disposed on the n-type or kind charge generating layer and overlapping with the first pixel area, a second p-type or kind charge generating layer disposed on the n-type or kind charge generating layer, overlapping with the second pixel area, and separately disposed from the first p-type or kind charge generating layer, a 1-$1^{st}$ hole transport region disposed on the first p-type or kind charge generating layer, a 1-$2^{nd}$ hole transport region disposed on the second p-type or kind charge generating layer and separately disposed from the 1-$1^{st}$ hole transport region, a 2-$1^{st}$ emission layer disposed on the 1-$1^{st}$ hole transport region, a 2-$2^{nd}$ emission layer disposed on the 1-$2^{nd}$ hole transport region, and a second electrode disposed on the 2-$1^{st}$ emission layer and the 2-$2^{nd}$ emission layer.

In an embodiment, the second p-type or kind charge generating layer may be overlapped with at least a portion of the first p-type or kind charge generating layer on a plane (e.g., in a plan view), and the overlapping portion with the first p-type or kind charge generating layer on the plane (e.g., in the plan view) among the second p-type or kind charge generating layer may be separately disposed from the first p-type or kind charge generating layer on a cross-section (e.g., in a cross-sectional view).

According to another embodiment of the present disclosure, a method of manufacturing a display device may include preparing a substrate in which multiple pixel areas including a first pixel area and a second pixel area adjacent to the first pixel area, and a non-pixel area around (e.g., surrounding) the multiple pixel areas, forming a first electrode on the substrate, forming a 1-$1^{st}$ emission layer overlapping with the first pixel area and a 1-$2^{nd}$ emission layer overlapping with the second pixel area on the first electrode, forming an n-type or kind charge generating layer on the 1-$1^{st}$ emission layer and the 1-$2^{nd}$ emission layer, forming a first organic pattern including a first p-type or kind charge generating layer, a 1-$1^{st}$ hole transport region, and a 2-$1^{st}$ emission layer which overlaps with the first pixel area on the n-type or kind charge generating layer, by utilizing a first mask in which a first opening part overlapping with the first pixel area is defined, forming a second organic pattern including a second p-type or kind charge generating layer, a 1-$2^{nd}$ hole transport region, and a 2-$2^{nd}$ emission layer which overlaps with the second pixel area on the n-type or kind charge generating layer, by utilizing a second mask in which a second opening part overlapping with the second pixel area is defined, and forming a second electrode on the first organic pattern and the second organic pattern.

In an embodiment, the forming of the first organic pattern may include disposing (e.g., applying) the first mask on the n-type or kind charge generating layer, forming the first p-type or kind charge generating layer overlapping with the first pixel area on the n-type or kind charge generating layer, forming the 1-$1^{st}$ hole transport region on the first p-type or kind charge generating layer, forming 2-$1^{st}$ emission layer on the 1-$1^{st}$ hole transport region, and removing the first mask.

In an embodiment, the forming of the second organic pattern may include disposing the second mask on the n-type or kind charge generating layer, forming the second p-type or kind charge generating layer overlapping with the second pixel area on the n-type or kind charge generating layer, forming the 1-$2^{nd}$ hole transport region on the second p-type or kind charge generating layer, forming the 2-$2^{nd}$ emission layer on the 1-$2^{nd}$ hole transport region, and removing the second mask.

In an embodiment, during forming the second p-type or kind charge generating layer, the second p-type or kind charge generating layer may be formed to overlap with at least a portion of the first p-type or kind charge generating layer on a plane, and the portion overlapping with the first p-type or kind charge generating layer on the plane among the second p-type or kind charge generating layer may be separated from the first p-type or kind charge generating layer.

In an embodiment, the forming of the n-type or kind charge generating layer may be performed by utilizing an open mask in which an opening part overlapping with the first pixel area and the second pixel area is defined.

BRIEF DESCRIPTION OF THE DRAWINGS

The accompanying drawings are included to provide a further understanding of the present disclosure and are incorporated in and constitute a part of this specification. The drawings illustrate embodiments of the present disclosure and, together with the description, serve to explain principles of the present disclosure. In the drawings.

DETAILED DESCRIPTION

Figure 1:
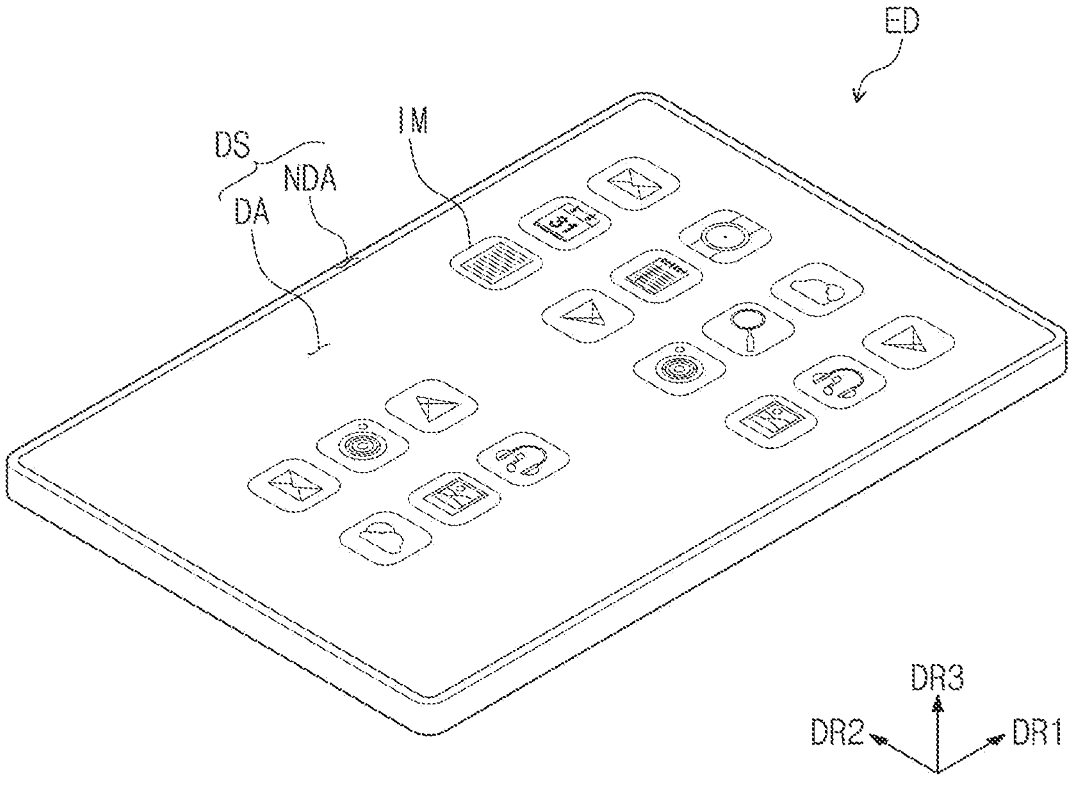
FIG. 1 is a combined perspective view of an electronic device according to an embodiment of the present disclosure.

Hereinafter, embodiments of the present disclosure will be explained referring to attached drawings.

In the description, when an element (or a region, a layer, a part, etc.) is referred to as being "on", "connected with" or "combined with" another element, it can be directly connected with/bonded on the other element, or intervening third elements may also be disposed.

Like reference numerals refer to like elements throughout, and duplicative descriptions thereof may not be provided. In some embodiments, in the drawings, the thicknesses, ratios, and dimensions of elements are exaggerated for effective explanation of technical contents. Additionally, "and/or" may include one or more combinations that may define relevant elements.

It will be understood that, although the terms first, second, etc. may be utilized herein to describe one or more suitable elements, these elements should not be limited by these terms. These terms are only utilized to distinguish one element from another element. For example, a first element could be termed a second element without departing from the teachings of the present disclosure. Similarly, a second element could be termed a first element. As utilized herein, the singular forms are intended to include the plural forms as well, unless the context clearly indicates otherwise.

In some embodiments, the terms "below", "beneath", "on" and "above" are utilized for explaining the relation of elements shown in the drawings. The terms are relative concept and are explained based on the direction shown in the drawing.

In the description, it will be further understood that the terms "comprises" and/or "comprising," when utilized in this specification, specify the presence of stated features, numerals, steps, operations, elements, parts, or the combination thereof, but do not preclude the presence or addition of one or more other features, numerals, steps, operations, elements, parts, or the combination thereof.

In the description, "disposed directly on" may refer to that there are no additional layers, films, regions, plates, etc. between a layer, a film, a region, a plate, etc. and another part. For example, "disposed directly on" may refer to that two layers or two members are disposed without utilizing an additional member such as an adhesive member between the two.

Unless otherwise defined, all terms (including technical and scientific terms) utilized herein have the same meaning as commonly understood by one of ordinary skill in the art to which this present disclosure belongs. In some embodiments, it will be further understood that terms, such as those defined in commonly utilized dictionaries, should be interpreted as having a meaning that is consistent with their meaning in the context of the relevant art and will not be interpreted in an idealized or overly formal sense unless expressly so defined herein.

As utilized herein, the term "and/or", "or", etc., may include any and all combinations of one or more of the associated listed items. Throughout the disclosure, the expression "at least one of a, b or c", "at least one of a, b, and/or c", "at least one selected from among a, b, and c", "at least one among a, b, or c", etc., (three or more item case), indicates only a, only b, only c, both (e.g., simultaneously) a and b, both (e.g., simultaneously) a and c, both (e.g., simultaneously) b and c, all of a, b, and c, or variations thereof.

In the present specification, "A and/or B", "A or B", etc., may represent A or B, or A and B. The expression "at least one of A and B", "one of A and B", "one selected from A and B", etc., (two item case) indicates only A, only B, both (e.g., simultaneously) A and B, or variations thereof.

As used herein, the term "substantially," "about," and similar terms are used as terms of approximation and not as terms of degree, and are intended to account for the inherent deviations in measured or calculated values that would be recognized by those of ordinary skill in the art. "About" or "substantially", as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" or "substantially" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The display device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the [device] may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the example embodiments of the present disclosure.

Hereinafter, the display device according to an embodiment of the present disclosure will be explained referring to the drawings.

Figure 2:
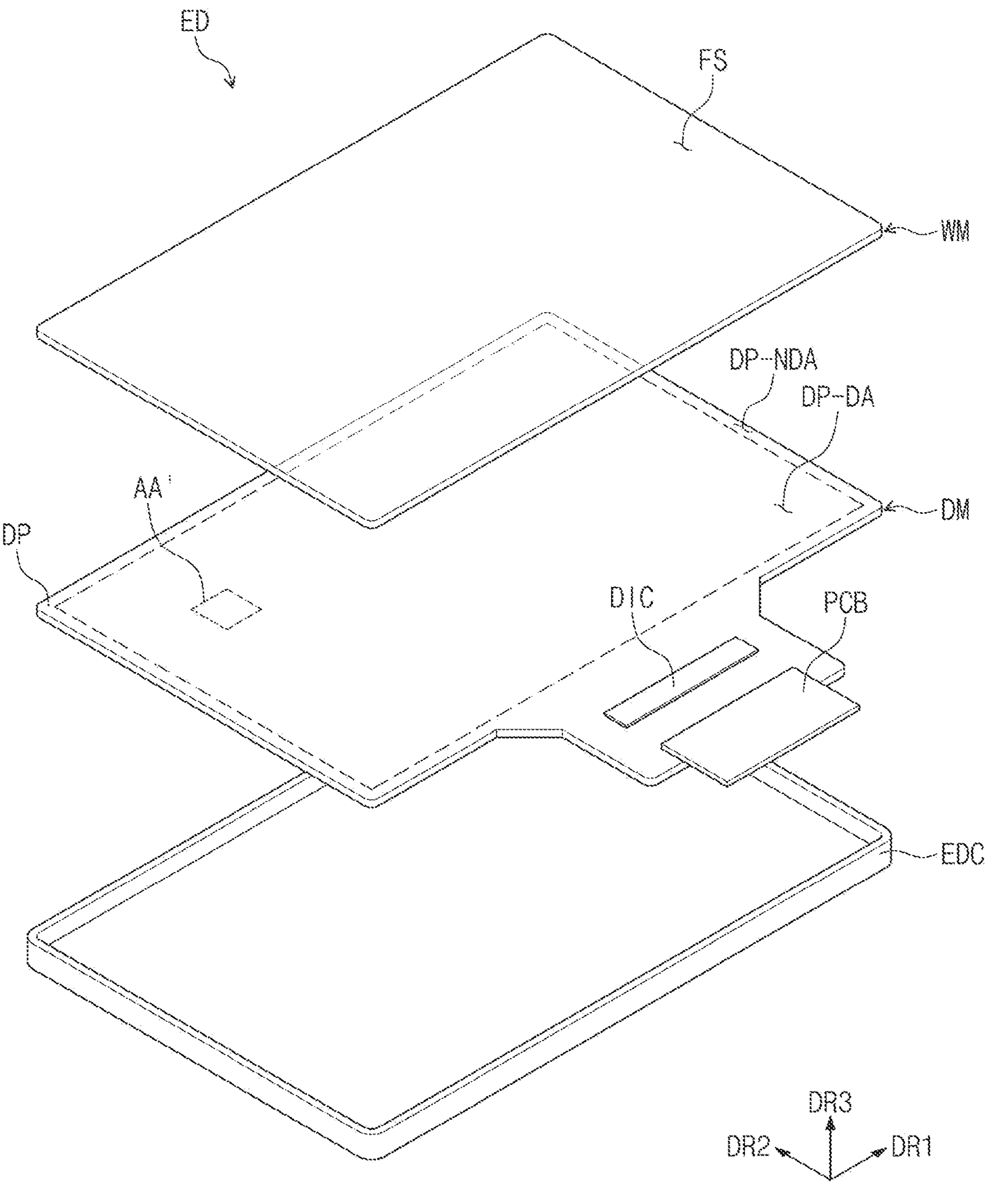
FIG. 2 is an exploded perspective view of an electronic device according to an embodiment of the present disclosure.

FIG. 1 is a combined perspective view of an electronic device according to an embodiment of the present disclosure. FIG. 2 is an exploded perspective view of an electronic device according to an embodiment of the present disclosure.

Referring to FIG. 1, an electronic device ED may be a device activated by electrical signals. The electronic device ED may display an image IM and sense an external pressure. The electronic device ED may include one or more suitable embodiments. For example, the electronic device ED may include tablets, laptops, computers, cellular phones, televisions, etc. In an embodiment, a tablet is shown as an illustration for the electronic device ED. However, the electronic device of an embodiment may not be limited thereto but may be a cellular phone. In some embodiments, the electronic device of an embodiment may be large-sized display devices such as laptops, monitors and televisions. In some embodiments, FIG. 1 shows a rigid electronic device ED as an embodiment, but the electronic device ED is not limited thereto but may be a flexible electronic device of which its shape in at least one area changes according to the mode of use.

The electronic device ED may display an image IM toward a third direction DR3 on a display surface DS that is parallel to a first direction DR1 and a second direction DR2. The display surface DS displaying an image IM may correspond to the front surface of the electronic device ED, and may correspond to the front surface FS of a window WM. Hereinafter, the same reference symbol may be utilized for the display surface of the electronic device ED, the front surface and the front surface of the window WM. The image IM may include a still image as well as a dynamic image. In FIG. 1, multiple icons are shown as embodiments of the image IM.

In this embodiment, based on the displaying direction of the image IM, the front surface (or top surface) and rear surface (or bottom surface) of each member may be defined. The front surface and the rear surface may be opposed to a third direction DR3, and the normal direction of the front surface and the rear surface may be parallel to the third direction DR3. The separated distance between the front surface and the rear surface in the third direction DR3 may correspond to the thickness of the electronic device ED in the third direction DR3. In some embodiments, the directions indicated by the first to third directions DR1, DR2 and DR3 have relative concept and may be changed to other directions. Hereinafter, the first to third directions are directions indicated by the first to third directions DR1, DR2 and DR3, and the same reference symbols are utilized. In some embodiments, in the description, "on a plane" or "in a plan view" may refer to when seen on a plane defined by the first direction DR1 and the second direction DR2.

The electronic device ED according to an embodiment of the present disclosure may sense the input of a user applied from exterior. The input of a user includes one or more suitable types (kinds) of external inputs including a part of body, light, heat, or pressure. The electronic device ED may sense the input of a user applied to the side surface or rear surface of the electronic device ED according to the structure of the electronic device ED, but is not limited to any one embodiment.

As shown in FIG. 2, the electronic device ED includes a window WM, a display module DM, and an external case EDC. In this embodiment, the window WM and the external case EDC are combined to constitute the appearance of the electronic device ED. In this embodiment, the external case EDC, the display module DM, and the window WM may be stacked in order (e.g., sequentially) along the third direction DR3.

The window WM may include an optically clear material. The window WM may include an insulating panel. For example, the window WM may be constituted by glass, plastic, or a combination thereof.

The front surface FS of the window WM defines the front surface of the electronic device ED, as explained previously.

The window WM may include a bezel area and a transmission area. The transmission area may be an optically clear area. For example, the transmission area may be an area having the transmittance of visible light of about 90% or more.

The bezel area may be an area having a relatively lower light transmittance when compared to the transmission area. The bezel area defines the shape of the transmission area. The bezel area is adjacent to the transmission area and may surround the transmission area. The bezel area may have a certain color. The bezel area may be overlapped with the non-display area DP-NDA of a display panel DP, which will be explained in more detail later. The bezel area may cover the non-display area DP-NDA of the display panel DP to block or reduce the external recognition of the non-display area DP-NDA. In some embodiments, these are explained as embodiments, and in the window WM according to an embodiment of the present disclosure, the bezel area may not be provided.

The display module DM may include at least a display panel DP. In FIG. 2, only the display panel DP is shown among the stacked structure of the display module DM, but the display module DM may substantially further include multiple elements disposed on and under the display panel DP. The stacked structure of the display module DM will be explained in more detail later.

The display panel DP includes a display area DP-DA and a non-display area DP-NDA, corresponding to the display area DA (see FIG. 1) and the non-display area NDA (see FIG. 1) of the electronic device ED. In the description, "area/portion and area/portion correspond" refers to an overlap state, but is not limited to the same areas. The display module DM may include a driving chip DIC disposed on the non-display area DP-NDA. The display module DM may further include a printed circuit board PCB combined with the non-display area DP-NDA. The printed circuit board PCB may be electrically connected with pads disposed in the non-display area DP-NDA of the display panel DP through an anisotropic conductive adhesive layer.

The driving chip DIC may include driving devices for driving the pixel of the display panel DP, for example, a data driving circuit. In FIG. 2, a structure in which the driving chip DIC is installed on the display panel DP is shown, but an embodiment of the present disclosure is not limited thereto. For example, the driving chip DIC may be installed on the printed circuit board PCB.

An external case EDC may receive the display module DM and may be combined with the window WM. The external case EDC may protect the elements received in the external case EDC, such as the display module DM.

Figure 3A:
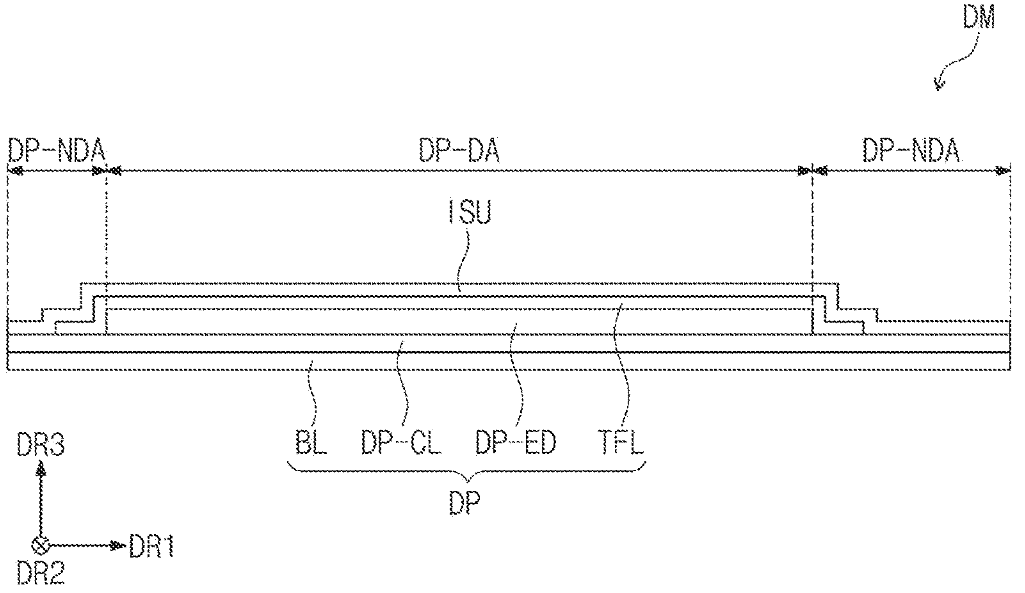
FIG. 3A is a cross-sectional view of a display module according to an embodiment of the present disclosure.
Figure 3B:
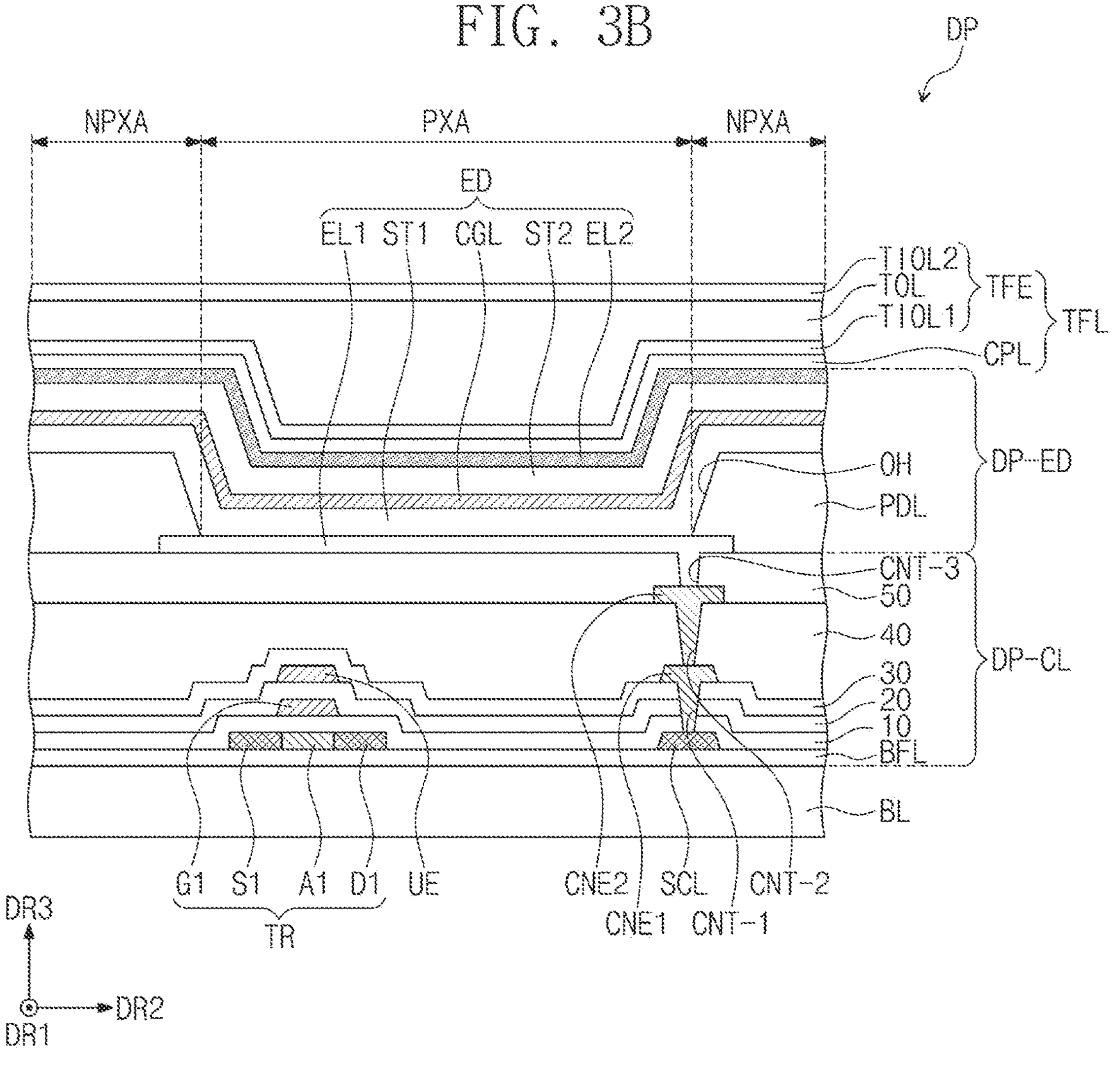
FIG. 3B is an enlarged cross-sectional view of a portion of a display panel according to an embodiment of the present disclosure.
Figure 3C:
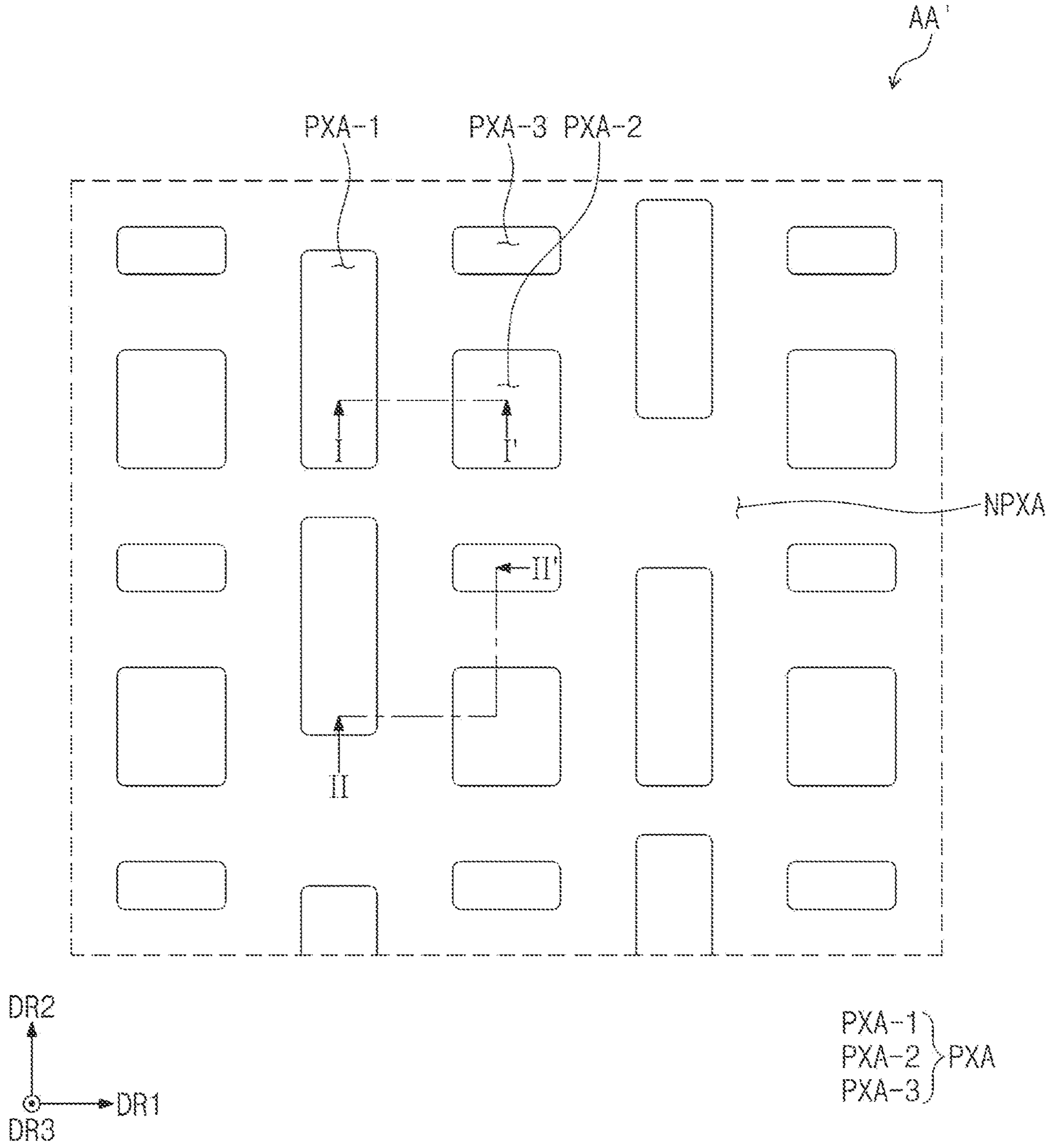
FIG. 3C is an enlarged plan view of a display module according to an embodiment of the present disclosure.
Figure 4:
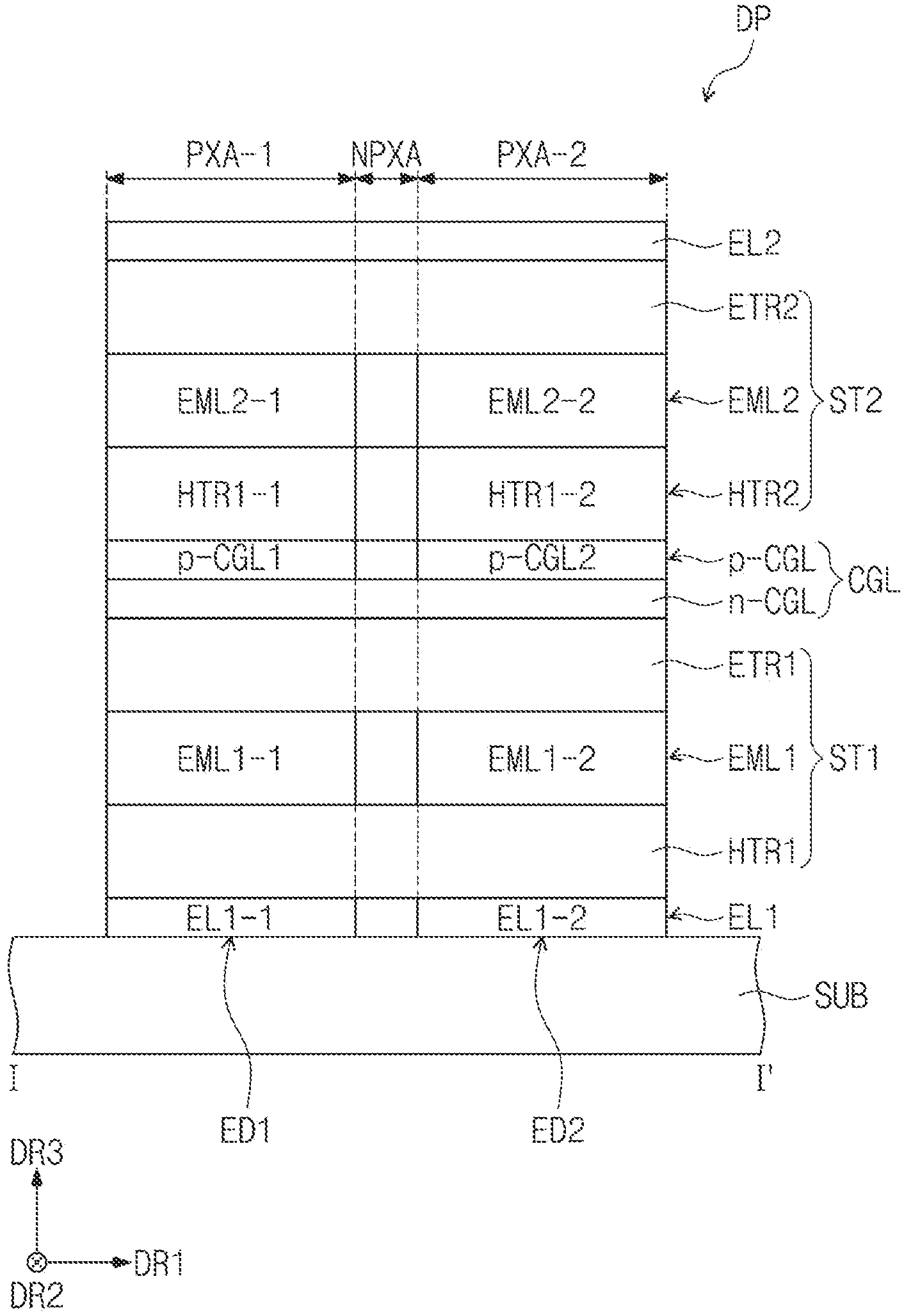
FIG. 4-FIG. 8 are cross-sectional views schematically showing light emitting elements included in a display panel of an embodiment.
Figure 5:
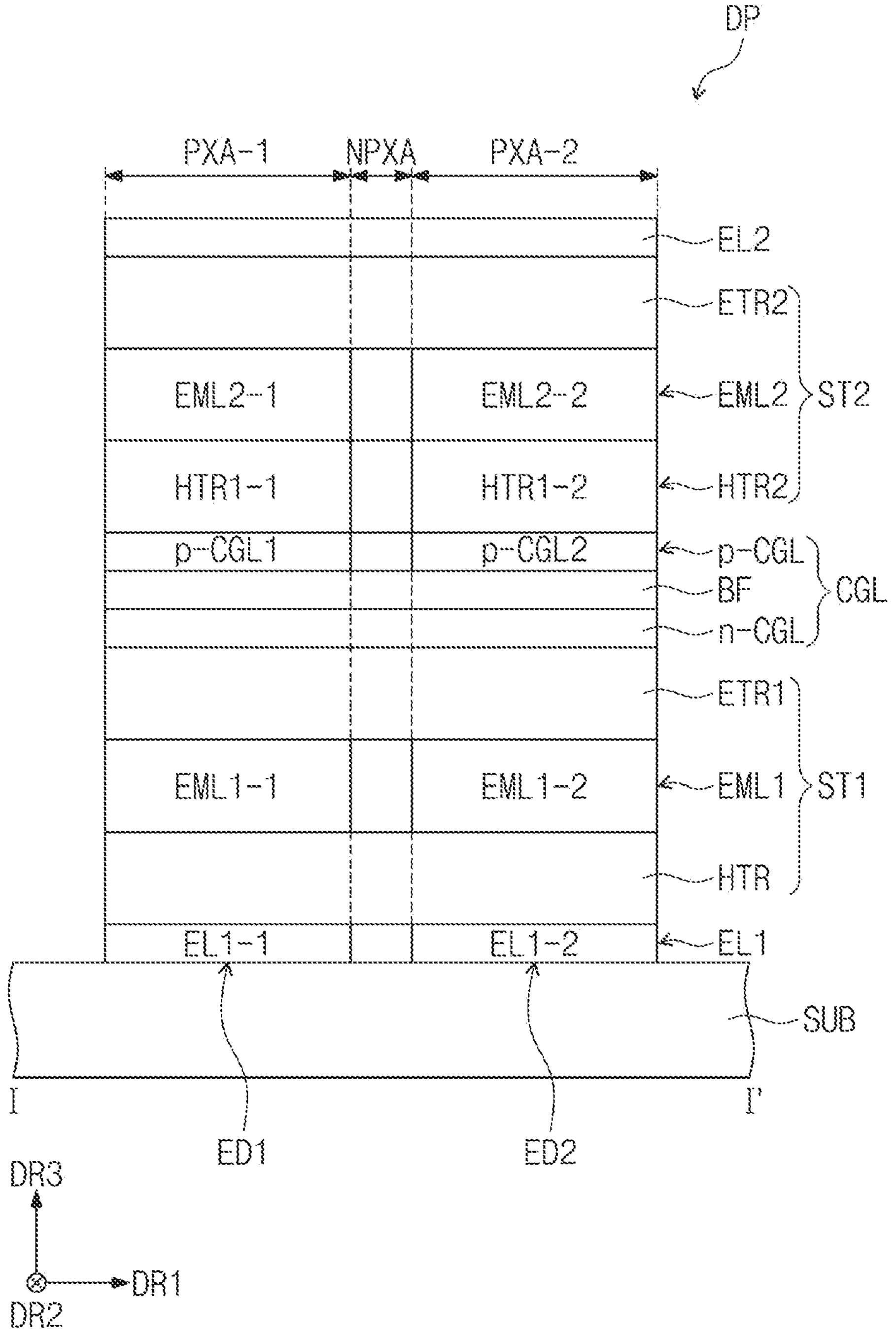
Figure 6:
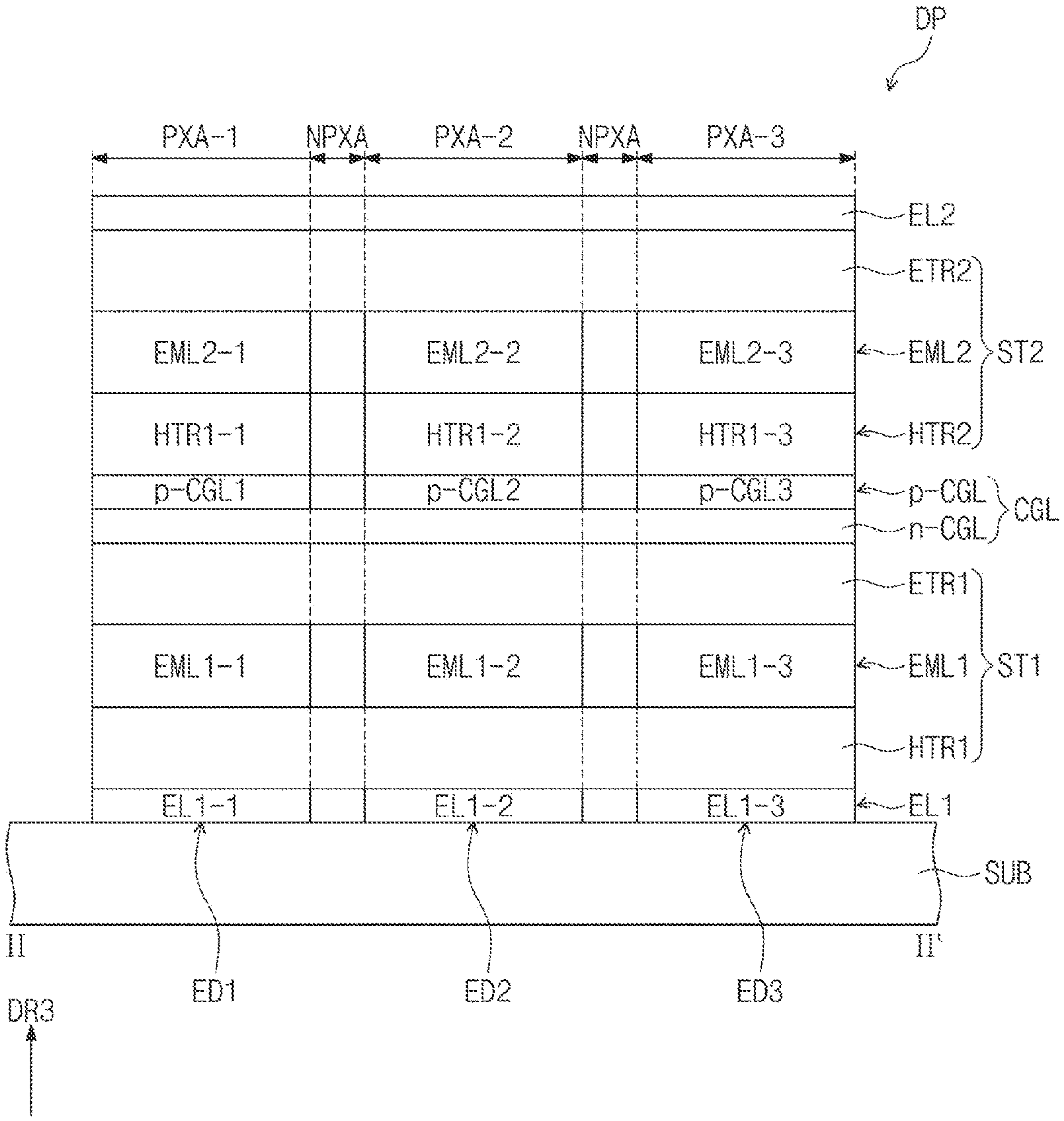
Figure 7:
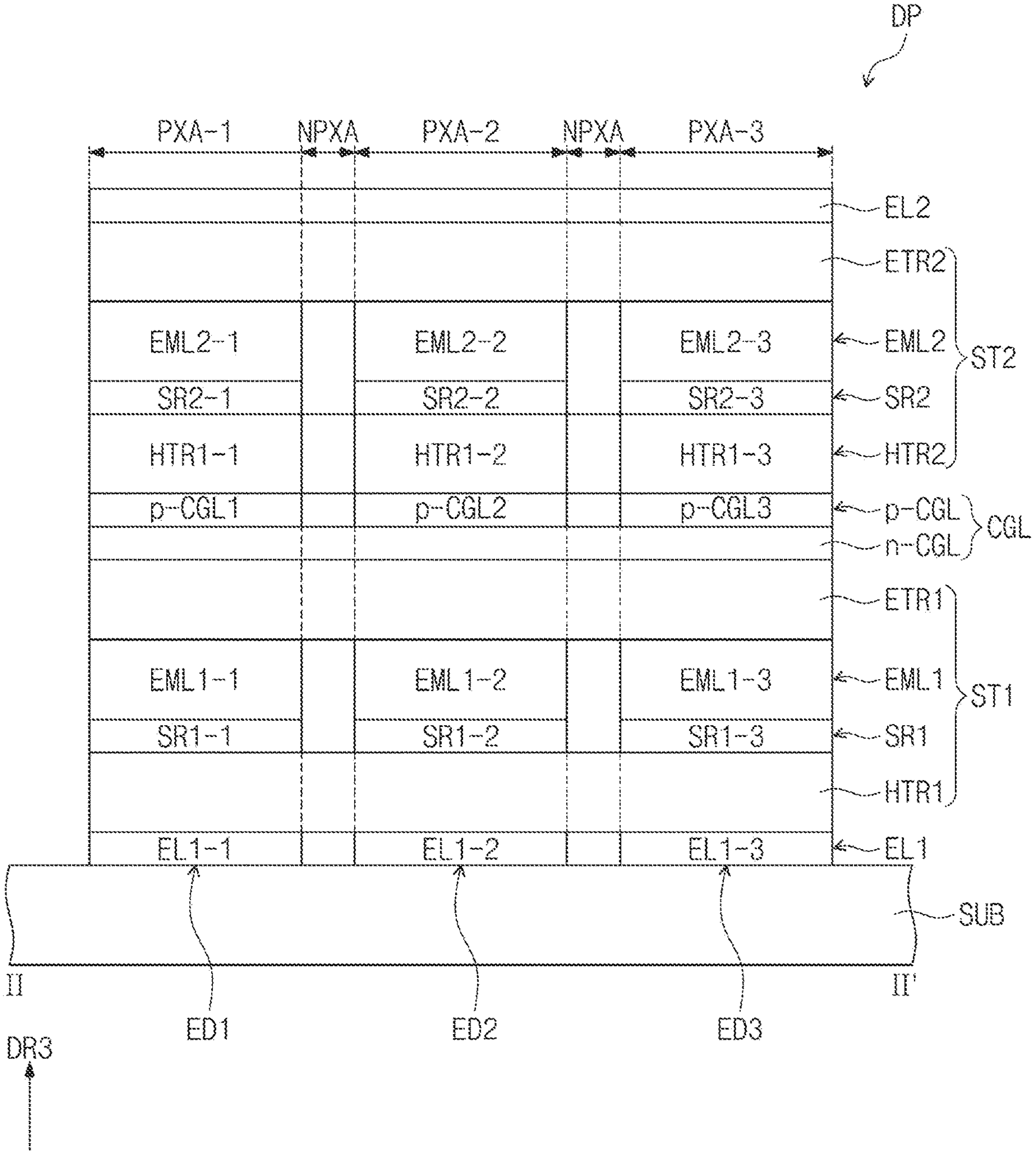
Figure 8:
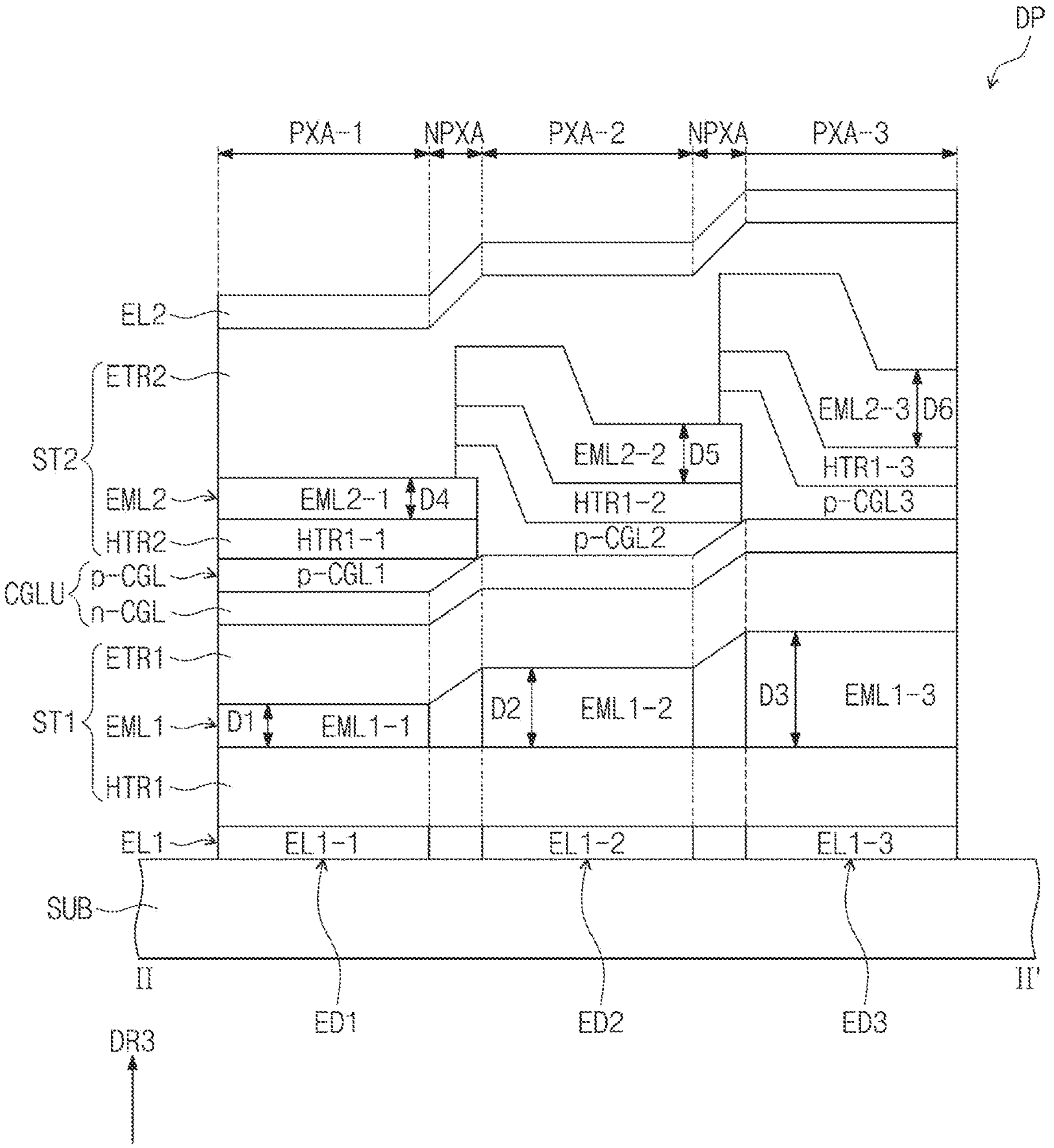

FIG. 3A is a cross-sectional view of a display module according to an embodiment of the present disclosure. FIG. 3B is a cross-sectional view of a portion of a display panel included in the display module according to an embodiment of the present disclosure. FIG. 3C is an enlarged plan view of a portion of the display module according to an embodiment of the present disclosure. In FIG. 3B, in a pixel included in the display panel of an embodiment, a light emitting element and a transistor included in the pixel are shown as an embodiment. FIG. 4 to FIG. 8 are cross-sectional views schematically showing light emitting elements included in the display panel of an embodiment. FIG. 4 and FIG. 5 show the cross-sections cut along a cutting line I-I', shown in FIG. 3C. FIG. 6 to FIG. 8 show the cross-sections cut along a cutting line II-II', shown in FIG. 3C.

Referring to FIG. 3A, a display module DM may include a display panel DP and an input sensing unit ISU. The display panel DP may be an element substantially producing an image IM (see FIG. 1). The image IM (see FIG. 1) produced by the display panel DP may be recognized by an external user through the display area DA (see FIG. 1).

The display panel DP may be a light emitting-type or kind display panel, without specific limitation. For example, the display panel DP may be an organic light emitting display panel or an inorganic light emitting display panel. The organic light emitting display panel may be a display panel in which an emission layer includes an organic light emitting material. The inorganic light emitting display panel may be a display panel in which an emission layer includes a quantum dot, a quantum rod, or a micro LED. Hereinafter, the display panel DP will be explained as the organic light emitting display panel.

The input sensing unit ISU may be disposed on the display panel DP. The input sensing unit ISU may sense external pressure applied from the exterior. The external pressure may include one or more suitable types (kinds) of inputs provided from the exterior of the electronic device ED (see FIG. 1). The external input may be provided in one or more suitable types (kinds). For example, the external input may include external input applied near the electronic device ED or adjacent with a certain distance (for example, hovering) as well as contact by a part of body including the hand of a user. In some embodiments, one or more suitable types (kinds) including force, pressure, light, etc., may be included, without limitation.

The input sensing unit ISU may be formed on the display panel DP via a substantially continuous process. In this case, the input sensing unit ISU may be disposed directly on the display panel DP. In some embodiments, in the description, "element B is disposed directly on element A" may refer to that a third element is not disposed between element A and element B. For example, an adhesive layer may not be disposed between the input sensing unit ISU and the display panel DP.

The display panel DP may include a base layer BL, a circuit layer DP-CL disposed on the base layer BL, a light emitting element layer DP-ED, and an upper insulating layer TFL.

The base layer BL may provide a base surface on which the circuit layer DP-CL, the light emitting element layer DP-ED, and the upper insulating layer TFL are disposed. The base layer BL may be a rigid substrate or a flexible substrate of which bending, folding, rolling, etc., are possible. The base layer BL may be a glass substrate, a metal substrate, or a polymer substrate. However, an embodiment of the present disclosure is not limited thereto, and the base layer BL may include an inorganic layer, an organic layer or a composite material layer.

The base layer BL may have a multilayer structure. For example, the base layer BL may include a first synthetic resin layer, an inorganic layer of a multilayer or a single layer, and a second synthetic resin layer disposed on the inorganic layer of a multilayer or a single layer. Each of the first and second synthetic resin layers may include a polyimide-based resin, without specific limitation.

The circuit layer DP-CL may be disposed on the base layer BL. The circuit layer DP-CL may include multiple insulating layers, multiple conductive layers, and a semiconductor layer. The multiple conductive layers of the circuit layer DP-CL may constitute signal lines or the control circuit of a pixel.

The light emitting element layer DP-ED may be disposed on the circuit layer DP-CL. The light emitting element layer DP-ED may include light emitting elements. The light emitting element layer DP-ED may include, for example, organic light emitting elements. However, this is an illustration, and the light emitting element layer DP-ED according to an embodiment of the present disclosure may include inorganic light emitting elements, organic-inorganic light emitting elements, or a liquid crystal layer.

The upper insulating layer TFL may include a capping layer and an encapsulating layer, which will be explained in more detail later. The encapsulating layer may include an organic layer and multiple inorganic layers encapsulating the organic layer.

The upper insulating layer TFL may be disposed on the light emitting element layer DP-ED and may protect the light emitting element layer DP-ED from foreign materials such as moisture, oxygen, and dust particles. The upper insulating layer TFL may encapsulate the light emitting element layer DP-ED to block or reduce moisture and oxygen introduced into the light emitting element layer DP-ED. The upper insulating layer TFL may include at least one inorganic layer. The upper insulating layer TFL may include an organic layer and multiple inorganic layers encapsulating the organic layer. The upper insulating layer TFL may include a structure of inorganic layer/organic layer/inorganic layer, stacked in order (e.g., sequentially).

The input sensing unit ISU is disposed on the upper insulating layer TFL. The input sensing unit ISU may be formed on the upper insulating layer TFL through a substantially continuous process. The input sensing unit ISU may be disposed directly on the display panel DP. For example, no adhesive member may be disposed between the input sensing unit ISU and the display panel DP. The input sensing unit ISU may be disposed to contact an inorganic layer disposed at the uppermost of the upper insulating layer TFL.

Though not shown separately, the display module DM according to an embodiment of the present disclosure may further include a protection member disposed under the display panel DP, and a reflection preventing or reducing member disposed on the top surface of the input sensing unit ISU. The reflection preventing or reducing member may reduce the reflectance of external light. The reflectance preventing or reducing member may be disposed directly on the input sensing unit ISU through a substantially continuous process.

The reflection preventing or reducing member may include a light shielding pattern overlapping with a reflection structure disposed under the reflection preventing or reducing member. The reflection preventing or reducing member may further include a color filter. The color filter may be disposed between light shielding patterns, and may include a first color filter, a second color filter and a third color filter, corresponding to a first color pixel, a second color pixel and a third color pixel, respectively.

As shown in FIG. 3A, the display panel DP may be divided into a display area DP-DA and a non-display area DP-NDA on a plane. The display area DP-DA of the display panel DP may be an area displaying an image, and the non-display area DP-NDA may be an area in which a driving circuit, a driving wiring, etc., are disposed. In the display area DP-DA, light emitting elements of respective multiple pixels may be disposed. The display area DP-DA may be overlapped with at least a portion of the transmission area of the widow WM (see FIG. 2), and the non-display area DP-NDA may be covered by the bezel area of the window WM. The display area DP-DA and the non-display area DP-NDA of the display panel DP may correspond to the display area DA and the non-display area NDA of the electronic device ED shown in FIG. 1, respectively.

Referring to FIG. 3A and FIG. 3B, in the display panel DP of an embodiment, the circuit layer DP-CL, the light emitting element layer DP-ED, and the upper insulating layer TFL may be disposed in order (e.g., sequentially) on the base layer BL. Through FIG. 3B, the configuration on the circuit layer DP-CL, the light emitting element layer DP-ED, and the upper insulating layer TFL will be explained in more detail.

The circuit layer DP-CL includes at least one insulating layer and a circuit device. The circuit device includes a signal line, the driving circuit of a pixel, etc. Through the forming process of an insulating layer, a semiconductor layer and a conductive layer by coating and deposition, and the patterning process of the insulating layer, the semiconductor layer and the conductive layer by a photolithography process, the circuit layer DP-CL may be formed.

A buffer layer BFL may include at least one inorganic layer stacked. On the buffer layer BFL, a semiconductor pattern is disposed. The buffer layer BFL improves the coupling force between the base layer BL and the semiconductor pattern.

The semiconductor pattern may include polysilicone. However, an embodiment of the present disclosure is not limited thereto, and the semiconductor pattern may include amorphous silicon or metal oxides. In FIG. 3B, only some semiconductor patterns are shown, and semiconductor patterns may be further disposed in other areas of the pixel on a plane. The semiconductor patterns may be arranged with a specific rule over the pixels.

The semiconductor pattern has different electrical properties according to the doping or not. The semiconductor pattern may include a first area A1 having a low doping concentration and low conductivity, and second areas S1 and D1, having relatively high doping concentration and conductivity. One of the second area S1 may be disposed at one side of the first area A1, and the other second area D1 may be disposed at the other side of the first area A1. The second areas S1 and D1 may be doped with an n-type or kind dopant (e.g., an n-charge dopant) or a p-type or kind dopant (e.g., a p-charge dopant). A p-type or kind transistor (e.g., a p-channel transistor) includes a doping area doped with the p-type or kind dopant. The first area A1 may be a non-doping area or may be doped at a lower concentration in contrast to the second areas S1 and D1.

The second areas S1 and D1 substantially have the role of electrodes or signal lines. One of the second area S1 may correspond to the source of a transistor TR, and one of the second area D1 may be a drain. In FIG. 3B, a portion of a connecting signal line SCL formed from a semiconductor pattern is shown. Though not shown separately, the connecting signal line SCL may be connected with the drain of the transistor TR on a plane.

A first insulating layer 10 may be disposed on the buffer layer BFL. The first insulating layer 10 is commonly overlapped with multiple pixels disposed in the display area DP-DA and covers the semiconductor pattern. The first insulating layer 10 may be an inorganic layer and/or an organic layer, and may have a single layer or a multilayer structure. The first insulating layer 10 may include at least one of aluminum oxide, titanium oxide, silicon oxide, silicon oxynitride, zirconium oxide or hafnium oxide. The insulating layer of a circuit layer DP-CL which will be explained in more detail later may be an inorganic layer and/or organic layer and may have a single layer or multilayer structure as well as the first insulating layer 10.

A gate G1 is disposed on the first insulating layer 10. The gate G1 may be a portion of a metal pattern. The gate G1 is overlapped with the first area A1. In the doping process of the semiconductor pattern, the gate G1 may play the role of a mask.

The second insulating layer 20 may be disposed on the first insulating layer 10, and may cover the gate G1. The second insulating layer 20 may be commonly overlapped with the pixels. An upper electrode UE may be disposed on the second insulating layer 20. The upper electrode UE may be overlapped with the gate G1. The upper electrode UE may include multiple metal layers. In an embodiment of the present disclosure, the upper electrode UE may not be provided.

A third insulating layer 30 may be disposed on the second insulating layer 20 and may cover the upper electrode UE. A first connecting electrode CNE1 may be disposed on the third insulating layer 30. The first connecting electrode CNE1 may be connected with a connecting signal line SCL through a contact hole CNT-1 passing through the first to third insulating layers 10 to 30.

A fourth insulating layer 40 may be disposed on the third insulating layer 30, and a fifth insulating layer 50 may be disposed on the fourth insulating layer 40. The fourth insulating layer 40 may be an organic layer. A second connecting electrode CNE2 may be disposed on the fourth insulating layer 40. The second connecting electrode CNE2 may be connected with the first connecting electrode CNE1 through a contact hole CNT-2 passing through the fourth insulating layer 40.

A fifth insulating layer 50 may be disposed on the fourth insulating layer 40, and may be an organic layer. A third connecting electrode CNE3 may be disposed on the fifth insulating layer 50. The third connecting electrode CNE3 may be connected with the second connecting electrode CNE2 through a contact hole CNT-3 passing through the fifth insulating layer 50.

A sixth insulating layer 60 may be disposed on the fifth insulating layer 50 and may cover the third connecting electrode CNE3. The sixth insulating layer 60 may be an organic layer.

A light emitting element ED may be disposed on the sixth insulating layer 60. The light emitting element ED may include a first electrode EL1, a hole transport region HTR, an emission layer EML, an electron transport region ETR, and a second electrode EL2, stacked in order (e.g., sequentially).

The first electrode EL1 of the light emitting element ED may be disposed on the sixth insulating layer 60. The first electrode EL1 may be connected with the third connecting electrode CNE3 through a contact hole CNT-4 passing through the sixth insulating layer 60. In a pixel definition layer PDL, a pixel opening part OH is defined, and the pixel definition layer PDL exposes at least a portion of the first electrode EL1. The pixel definition layer PDL may be an organic layer.

As shown in FIG. 3B, the display area DP-DA may include a pixel area PXA and a non-pixel area NPXA adjacent to the pixel area PXA. The non-pixel area NPXA may surround the pixel area PXA. In this embodiment, the pixel area PXA is defined to correspond to some areas of the first electrode EL1 exposed by the pixel opening part OH.

Referring to FIG. 3B, the light emitting element ED included in the display panel of an embodiment may include multiple light emitting stacks ST1 and ST2, and a charge generating layer CGL disposed between the multiple light emitting stacks ST1 and ST2. The light emitting element ED of an embodiment may include a first electrode EL1, a first light emitting stack ST1, a charge generating layer CGL, and a second light emitting stack ST2, stacked in order (e.g., sequentially). In some embodiments, in FIG. 3B, the light emitting element ED includes two light emitting stacks ST1 and ST2, and one charge generating layer CGL disposed therebetween, but an embodiment of the present disclosure is not limited thereto. The light emitting element ED may include three or more light emitting stacks, without limitation.

Referring to FIG. 3B, and FIG. 4 to FIG. 8 together, each of multiple light emitting stacks ST1 and ST2 may include emission layers EML1 and EML2, and hole transport regions HTR1 and HTR2, and electron transport regions ETR1 and ETR2 disposed with the emission layers EML1 and EML2 therebetween. For example, as shown in FIG. 4 to FIG. 8, the first light emitting stack ST1 may include a first emission layer EML1, and the second light emitting stack ST2 may include a second emission layer EML2. For example, the light emitting element ED may be a light emitting element having a tandem structure including multiple light emitting stacks including emission layers.

Light emitted from each of multiple light emitting stacks ST1 and ST2 in an embodiment shown in FIG. 3B may be light having the same wavelength. For example, light emitted from each of the multiple light emitting stacks ST1 and ST2 may be blue light. However, an embodiment of the present disclosure is not limited thereto, and the wavelength regions of light emitted from the multiple light emitting stacks ST1 and ST2 may be different from each other. For example, at least one among the multiple light emitting stacks ST1 and ST2 may be configured to emit blue light, and the remainder may be configured to emit green light. A light emitting element ED including the multiple light emitting stacks ST1 and ST2 emitting light in different wavelength regions may be configured to emit white light.

A charge generating layer CGL may be disposed between neighboring light emitting stacks ST1 and ST2.

The second electrode EL2 may be disposed on a second electron transport region ETR2. The second electrode EL2 may have the shape of one body and be commonly disposed in multiple pixels.

The upper insulating layer TFL may be disposed on the light emitting element layer DP-ED and may include multiple thin films. According to an embodiment, the upper insulating layer TFL may include a capping layer CPL and an encapsulating layer TFE disposed on the capping layer CPL. The capping layer CPL is disposed on the second electrode EL2 and makes contact with the second electrode EL2. The capping layer CPL may include an organic material. The capping layer CPL may have a refractive index of about 1.6 or more in a wavelength range of about 550 nm to about 660 nm.

The encapsulating layer TFE may include a first inorganic encapsulating layer TIOL1, an organic encapsulating layer TOL disposed on the first inorganic encapsulating layer TIOL1, and a second inorganic encapsulating layer TIOL2 disposed on the organic encapsulating layer TOL. The first inorganic encapsulating layer TIOL1 and the second inorganic encapsulating layer TIOL2 protect the light emitting element layer DP-ED from humidity/oxygen, and the organic encapsulating layer TOL protects the light emitting element layer DP-ED from foreign materials such as dust particles.

FIG. 3C is an enlarged plan view of a portion of a display module according to an embodiment of the present disclosure. In FIG. 3C, the arrangement of the multiple pixel areas are enlarged in area AA', shown in FIG. 2.

Referring to FIG. 3C, in the display panel DP of an embodiment, the display area DP-DA may include multiple pixel areas PXA and a non-pixel area NPXA around (e.g., surrounding) the multiple pixel areas PXA. The multiple pixel areas PXA may include a first pixel area PXA-1, a second pixel area PXA-2, and a third pixel area PXA-3. The first pixel area PXA-1, the second pixel area PXA-2, and the third pixel area PXA-3 may display light of different wavelengths. The first pixel area PXA-1 may display a first light that has a blue wavelength, the second pixel area PXA-2 may display a second light that has a red wavelength and the third pixel area PXA-1 may display a third light that has a green wavelength.

In some embodiments, the multiple pixel areas PXA may be areas divided by the above-described pixel definition layer PDL (see FIG. 3B). The non-pixel area NPXA is an area among the neighboring pixel areas PXA and may be an area corresponding to the pixel definition layer PDL (see FIG. 3B). In some embodiments, in the description, each of the multiple pixel areas PXA may correspond to a "pixel". The multiple pixel areas PXA may be divided to correspond to pixel opening parts OH (see FIG. 3B), defined by the pixel definition layer PDL (see FIG. 3B).

As shown in FIG. 3C, the first pixel area PXA-1 may constitute a first pixel group arranged (with the first pixel areas separated from each other) along a second direction DR2, and the second pixel area PXA-2 and the third pixel area PXA-3 may constitute a second pixel group, alternately arranged with each other along the second direction DR2. The first pixel group including the first pixel area PXA-1 and the second pixel group including the second pixel area PXA-2 and the third pixel area PXA-3 may be separated with each other along a first direction DR1. For example, the first pixel group and the second pixel group may be alternately arranged with each other along the first direction DR1.

The multiple pixel areas PXA-1, PXA-2 and PXA-3 may have different areas according to the wavelength of the light emitted by the multiple pixel areas PXA-1, PXA-2, and PXA-3. For example, as shown in FIG. 3C, the first pixel area PXA-1 emitting the first light may have the largest area, and the third pixel area PXA-3 emitting the third light may have the smallest area. However, an embodiment of the present disclosure is not limited thereto. The pixel areas PXA-1, PXA-2 and PXA-3 may have the same area, or the pixel areas PXA-1, PXA-2 and PXA-3 may be defined to have a different area ratio from that shown in FIG. 3C. The multiple pixel areas PXA-1, PXA-2 and PXA-3 may be configured to emit light with colors different from the above-described light of the blue wavelength, the light of the red wavelength, and the light of the green wavelength.

Each of the multiple pixel areas PXA-1, PXA-2 and PXA-3 may have a square shape with rounded edges on a plane. In an embodiment, each of the first pixel area PXA-1 and the third pixel area PXA-3 may have a square shape with rounded edges, long sides extended in the second direction DR2 and short sides extended in the first direction DR1. In an embodiment, the second pixel area PXA-2 may have a square shape with rounded edges, long sides extended in the first direction DR1 and short sides extended in the second direction DR2.

FIG. 4 to FIG. 8 are cross-sections (e.g., cross-sectional views) showing a portion of a display panel DP of an embodiment. In FIG. 4 to FIG. 8, light emitting elements included in the display panel DP of an embodiment are schematically shown. FIG. 4 to FIG. 8 show embodiments in which each of the light emitting elements ED1, ED2 and ED3 include two light emitting stacks. For example, each of the light emitting elements ED1, ED2 and ED3 includes two stacks corresponding to a first light emitting stack ST1 and a second light emitting stack ST2. However, an embodiment of the present disclosure is not limited thereto. For example, each of the light emitting elements ED1, ED2 and ED3 may include three or more light emitting stacks.

Referring to FIG. 4 to FIG. 8, the light emitting elements ED1, ED2 and ED3 may be disposed to be overlapped with the pixel areas PXA-1, PXA-2 and PXA-3. The pixel areas PXA-1, PXA-2 and PXA-3 may be areas emitting light produced in the light emitting elements ED1, ED2 and ED3.

The pixel areas PXA-1, PXA-2 and PXA-3 may include the first pixel area PXA-1, the second pixel area PXA-2, and the third pixel area PXA-3, separately disposed from each other. The light emitting elements ED1, ED2 and ED3 may include the first light emitting element ED1 overlapping with the first pixel area PXA-1, the second light emitting element ED2 overlapping with the second pixel area PXA-2, and the third light emitting element ED3 overlapping with the third pixel area PXA-3.

The first pixel area PXA-1 may be a blue light pixel area, the second pixel area PXA-2 may be a green light pixel area, and the third pixel area PXA-3 may be a red light pixel area. However, an embodiment of the present disclosure is not limited thereto.

In the display device according to an embodiment, at least a portion of the light emitting elements ED1, ED2 and ED3 may be configured to emit light in different wavelength regions. For example, the first light emitting element ED1 may be configured to emit blue light, the second light emitting element ED2 may be configured to emit green light, and the third light emitting element ED3 may be configured to emit red light. For example, the first light emitting element ED1 may be configured to emit blue light corresponding to light in a wavelength region of about 410 nm to about 480 nm. The second light emitting element ED2 may be configured to emit green light corresponding to light in a wavelength region of about 500 nm to about 570 nm, or may be configured to emit red light corresponding to light in a wavelength region of about 625 nm to about 675 nm. However, an embodiment of the present disclosure is not limited thereto. The light emitting elements ED1, ED2 and ED3 may be configured to emit light in substantially the same wavelength region.

In FIG. 4 to FIG. 8, the areas of the pixel areas PXA-1, PXA-2 and PXA-3 are all similar, but an embodiment of the present disclosure is not limited thereto. The areas of the pixel areas PXA-1, PXA-2 and PXA-3 may be different from each other according to the wavelength region of light emitted. In some embodiments, the areas of the pixel areas PXA-1, PXA-2 and PXA-3 may refer to areas seen on a plane defined by a first direction DR1 and a second direction DR2.

Each of the light emitting elements ED1, ED2 and ED3 may include a first electrode EL1, a first light emitting stack ST1 disposed on the first electrode EL1, a first charge generating layer CGL disposed on the first light emitting stack ST1, a second light emitting stack ST2 disposed on the first charge generating layer CGL, and a second electrode EL2 disposed on the second light emitting stack ST2. Each of the light emitting elements ED1, ED2 and ED3 may include a first electrode EL1, a second electrode EL2, and two light emitting stacks ST1 and ST2, and one charge generating layer CGL, disposed between the first electrode EL1 and the second electrode EL2.

Referring to FIG. 4, each of the light emitting elements ED1 and ED2 according to an embodiment may include a first electrode EL1, a first light emitting stack ST1, a first charge generating layer CGL, a second light emitting stack ST2, and a second electrode EL2, stacked in order (e.g., sequentially) along a third direction DR3.

The first electrode EL1 has conductivity (e.g., is a conductor). The first electrode EL1 may be formed utilizing a metal material, a metal alloy or a conductive compound. The first electrode EL1 may be an anode or a cathode. However, an embodiment of the present disclosure is not limited thereto. In some embodiments, the first electrode EL1 may be a pixel electrode. The first electrode EL1 may be a transmissive electrode, a transflective electrode, or a reflective electrode. The first electrode EL1 may include at least one selected from among Ag, Mg, Cu, Al, Pt, Pd, Au, Ni, Nd, Ir, Cr, Li, Ca, LiF, Mo, Ti, W, In, Sn, Zn, compounds of two or more selected therefrom, mixtures of two or more selected therefrom, and/or oxides thereof.

When the first electrode EL1 is the transmissive electrode, the first electrode EL1 may include a transparent metal oxide, for example, indium tin oxide (ITO), indium zinc oxide (IZO), zinc oxide (ZnO), and indium tin zinc oxide (ITZO). When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca (stacked structure of LiF and Ca), LiF/Al (stacked structure of LiF and Al), Mo, Ti, W, compounds thereof, or mixtures thereof (for example, a mixture of Ag and Mg). Also, the first electrode EL1 may have a structure including multiple layers including a reflective layer or a transflective layer formed utilizing the above materials, and a transmissive conductive layer formed utilizing ITO, IZO, ZnO, or ITZO. For example, the first electrode EL1 may include a three-layer structure of ITO/Ag/ITO. However, an embodiment of the present disclosure is not limited thereto. The first electrode EL1 may include the above-described metal materials, combinations of two or more metal materials selected from the above-described metal materials, or oxides of the above-described metal materials. The thickness of the first electrode EL1 may be from about 700 Å to about 10,000 Å. For example, the thickness of the first electrode EL1 may be from about 1,000 Å to about 3,000 Å.

In an embodiment, the first electrode EL1 may include multiple sub-electrodes. For example, the first electrode EL1 may include a first sub-electrode EL1-1 and a second sub-electrode EL1-2, separately disposed on a plane (e.g., in a plan view). The first sub-electrode EL1-1 may be disposed to overlap with the first pixel area PXA-1, and the second sub-electrode EL1-2 may be disposed to overlap with the second pixel area PXA-2.

The first light emitting stack ST1 may be disposed on the first electrode EL1. The first light emitting stack ST1 may include a first emission layer EML1. The first emission layer EML1 may include multiple emission layers. For example, the first emission layer EML1 may include a 1-$1^{st}$ emission layer EML1-1 overlapping with the first pixel area PXA-1 and a 1-$2^{nd}$ emission layer EML1-2 overlapping with the second pixel area PXA-2.

The first light emitting stack ST1 may include the 1-1$^{st}$ emission layer EML1-1 and the 1-2$^{nd}$ emission layer EML-2, separately disposed from each other. For example, the first light emitting stack ST1 may include the 1-1$^{st}$ emission layer EML1-1 correspondingly disposed on the first sub-electrode EL1-1 and the 1-2$^{nd}$ emission layer EML1-2 correspondingly disposed on the second sub-electrode EL1-2. On a plane, the 1-1$^{st}$ emission layer EML1-1 and the 1-2$^{nd}$ emission layer EML1-2 may be separately disposed from each other. The 1-1$^{st}$ emission layer EML1-1 may not overlap with the second sub-electrode EL1-2 on a plane, and the 1-2$^{nd}$ emission layer EML1-2 may not overlap with the first sub-electrode EL1-1 on a plane.

In an embodiment, the 1-1$^{st}$ emission layer EML1-1 and the 1-2$^{nd}$ emission layer EML1-2 may be configured to emit light in different wavelength regions. For example, the 1-1$^{st}$ emission layer EML1-1 may be configured to emit a first light. The 1-2$^{nd}$ emission layer EML1-2 may be configured to emit a second light. In an embodiment, the first light may be blue light, and the second light may be green light or red light.

The first light emitting stack ST1 may further include a first hole transport region HTR1 disposed on the first electrode EL1. The first hole transport region HTR1 may be disposed between the first electrode EL1 and the first emission layer EML1.

The first hole transport region HTR1 may be a common layer having the shape of one body on the first electrode EL1. The first hole transport region HTR1 may have the shape of one body, connected from each other on the first electrode EL1. For example, the first hole transport region HTR1 may be provided as a common layer wholly overlapped with the first pixel area PXA-1, the second pixel area PXA-2, and the non-pixel area NPXA disposed therebetween. However, an embodiment of the present disclosure is not limited thereto. The first hole transport region HTR1 may be patterned and provided in the first pixel area PXA-1 and the second pixel area PXA-2, and may not be overlapped with the non-pixel area NPXA.

The first hole transport region HTR1 may be formed utilizing one or more suitable methods such as a vacuum deposition method, a spin coating method, a cast method, a Langmuir-Blodgett (LB) method, an inkjet printing method, a laser printing method, and a laser induced thermal imaging (LITI) method.

The first light emitting stack ST1 may further include a first electron transport region ETR1 disposed on the first emission layer EML1. The first electron transport region ETR1 may be disposed between the first emission layer EML1 and the charge generating layer CGL.

The first electron transport region ETR1 may be a common layer having the shape of one body on the first emission layer EML1. The first electron transport region ETR1 may have the shape of one body, connected from each other on the first emission layer EML1. For example, the first electron transport region ETR1 may be provided as a common layer wholly overlapped with the first pixel area PXA-1, the second pixel area PXA-2, and the non-pixel area NPXA disposed therebetween. However, an embodiment of the present disclosure is not limited thereto. The first electron transport region ETR1 may be patterned and provided in the first pixel area PXA-1 and the second pixel area PXA-2, and may not be overlapped with the non-pixel area NPXA.

Each of the light emitting elements ED1 and ED2 according to an embodiment may include a charge generating layer CGL disposed between adjacent stacks ST1 and ST2. The charge generating layer CGL may be disposed between the first light emitting stack ST1 and the second light emitting stack ST2.

When a voltage is applied, the charge generating layer CGL may form a complex through oxidation-reduction reaction to produce charges (electrons and holes). The charge generating layer CGL may provide each of the adjacent stacks ST1 and ST2 with the produced charges. The charge generating layer CGL may increase the efficiency of current generated in the adjacent stacks ST1 and ST2 in twofold, and may play the role of controlling the balance of charges between the adjacent stacks ST1 and ST2.

The charge generating layer CGL may have a layer structure in which an n-type or kind charge generating layer n-CGL (e.g., an n-charge generating layer) and a p-type or kind charge generating layer (e.g., a p-charge generating layer) p-CGL are joined. In an embodiment, the n-type or kind charge generating layer n-CGL may be disposed adjacent to the first light emitting stack ST1, and the p-type or kind charge generating layer p-CGL may be disposed adjacent to the second light emitting stack ST2.

The n-type or kind charge generating layer n-CGL may be a charge generating layer providing the adjacent stacks with electrons. For example, the n-type or kind charge generating layer n-CGL may play the role of providing electrons to the first light emitting stack ST1. The n-type or kind charge generating layer n-CGL may be a layer of a base material doped with an n-dopant (e.g., n-charge dopant). The p-type or kind charge generating layer p-CGL may be a charge generating layer providing the adjacent stacks with holes (e.g., doped with a p-dopant, e.g., p-charge dopant). The p-type or kind charge generating layer p-CGL may play the role of providing holes to the second light emitting stack ST2. Though not shown, a buffer layer may be further disposed between the n-type or kind charge generating layer n-CGL and the p-type or kind charge generating layer p-CGL.

The charge generating layer CGL may include an n-type or kind aryl amine-based material or a p-type or kind metal oxide. For example, the charge generating layer CGL may include a charge generating compound including an aryl amine-based organic compound, a metal, a metal oxide, a carbide, a fluoride, or mixtures thereof.

For example, the aryl amine-based organic compound may be 2,2'-dimethyl-N,N'-di[(1-naphthyl)-N,N'-diphenyl]-1,1'-biphenyl-4,4'-diamine (α-NPD), 4,4',4"-tris[N(2-naphthyl)-N-phenylamino]-triphenylamine (2-TNATA), 4,4'4"-tris(N,N-diphenylamino)triphenylamine (TDATA), 4,4',4"-[tris(3-methylphenyl)phenylamino]triphenylamine (MTDATA), 2,2',7,7'-tetrakis(N,N-diphenylamino)-2,7-diamino-9,9-spirobifluorene (spiro-TAD), or N,N'-bis(naphthalen-1-yl)-N,N'-bis(phenyl)-2,7-diamino-9,9-spirobifluorene (spiro-NPB). For example, the metal may be cesium (Cs), molybdenum (Mo), vanadium (V), titanium (Ti), tungsten (W), barium (Ba), or lithium (Li). In some embodiments, for example, the metal oxide, the carbide and the fluoride may be $Re_2O_7$, $MoO_3$, $V_2O_5$, $WO_3$, $TiO_2$, $Cs_2CO_3$, BaF, LiF, or CsF.

The n-type or kind charge generating layer n-CGL may be disposed on the first emission layer EML1. The n-type or kind charge generating layer n-CGL may be disposed on the first electron transport region ETR1. The n-type or kind charge generating layer n-CGL may be overlapped with both (e.g., simultaneously) the 1-1$^{st}$ emission layer EML1-1 and the 1-2$^{nd}$ emission layer EML1-2 on a plane. The n-type or kind charge generating layer n-CGL may be a common layer having the shape of one body on the first electron transport region ETR1. The n-type or kind charge generating layer n-CGL may be provided as a common layer wholly overlapped with the first pixel area PXA-1, the second pixel area PXA-2, and the non-pixel area NPXA disposed therebetween. However, an embodiment of the present disclosure is not limited thereto. The n-type or kind charge generating layer n-CGL may be patterned and provided in the first pixel area PXA-1 and the second pixel area PXA-2 and may not be overlapped with the non-pixel area NPXA.

The p-type or kind charge generating layer p-CGL may be provided on the n-type or kind charge generating layer n-CGL. The p-type or kind charge generating layer p-CGL may include multiple p-type or kind charge generating layers p-CGL1 and p-CGL2, separately disposed from each other. For example, the p-type or kind charge generating layer p-CGL may include a first p-type or kind charge generating layer p-CGL1 overlapping with the first pixel area PXA-1, and a second p-type or kind charge generating layer p-CGL2 overlapping with the second pixel area PXA-2. The first p-type or kind charge generating layer p-CGL1 may be correspondingly disposed on the 1-1$^{st}$ emission layer EML1-1. The second p-type or kind charge generating layer p-CGL2 may be correspondingly disposed on the 1-2$^{nd}$ emission layer EML1-2. In an embodiment, the first p-type or kind charge generating layer p-CGL1 and the second p-type or kind charge generating layer p-CGL2 may be separately disposed from each other on a plane (e.g., in a plan view). The first p-type or kind charge generating layer p-CGL1 may be overlapped with the first pixel area PXA-1 and may not be overlapped with the non-pixel area NPXA. The second p-type or kind charge generating layer p-CGL2 may be overlapped with the second pixel area PXA-2 and may not be overlapped with the non-pixel area NPXA.

The second light emitting stack ST2 may be disposed on the charge generating layer CGL. The second light emitting stack ST2 may include a second hole transport region HTR2 disposed on the charge generating layer CGL, and a second emission layer EML2 disposed on the second hole transport region HTR2.

The second hole transport region HTR2 may be provided on the p-type or kind charge generating layer p-CGL. The second hole transport region HTR2 may include multiple hole transport regions HTR1-1 and HTR1-2, separately disposed from each other. For example, the second hole transport region HTR2 may include a 1-1$^{st}$ hole transport region HTR1-1 disposed on the first p-type or kind charge generating layer p-CGL1, and a 1-2$^{nd}$ hole transport region HTR1-2 disposed on the second p-type or kind charge generating layer p-CGL2. In an embodiment, the 1-1$^{st}$ hole transport region HTR1-1 and the 1-2$^{nd}$ hole transport region HTR1-2 may be separately disposed on a plane (e.g., in a plane view). The 1-1$^{st}$ hole transport region HTR1-1 may be overlapped with the first pixel area PXA-1 and may not be overlapped with the non-pixel area NPXA. In some embodiments, the 1-2$^{nd}$ hole transport region HTR1-2 may be overlapped with the second pixel area PXA-2 and may not be overlapped with the non-pixel area NPXA.

In an embodiment, the second hole transport region HTR2 may be formed by patterning through a fine metal mask (FMM). For example, each of the 1-1$^{st}$ hole transport region HTR1-1 and the 1-2$^{nd}$ hole transport region HTR1-2 may be disposed in an area corresponding to the pixel opening part OH (see FIG. 3B), respectively. For example, the second hole transport region HTR2 may be separately formed for individual pixels. Detailed description on the method of manufacturing the second hole transport region HTR2 will be given in more detail later.

The second emission layer EML2 may be disposed on the second hole transport region HTR2. The second light emitting stack ST2 may include multiple emission layers separately disposed from each other. For example, the second light emitting stack ST2 may include a 2-1$^{st}$ emission layer EML2-1 and a 2-2$^{nd}$ emission layer EML2-2, separately disposed from each other. The 2-1$^{st}$ emission layer EML2-1 may be disposed on the 1-1$^{st}$ hole transport region HTR1-1, and the 2-2$^{nd}$ emission layer EML2-2 may be disposed on the 1-2$^{nd}$ hole transport region HTR1-2. On a plane (in a plan view), the 2-1$^{st}$ emission layer EML2-1 and the 2-2$^{nd}$ emission layer EML2-2 may be separately disposed from each other. The 2-1$^{st}$ emission layer EML2-1 may be overlapped with the first pixel area PXA-1 and may not be overlapped with the non-pixel area NPXA. The 2-2$^{nd}$ emission layer EML2-2 may be overlapped with the second pixel area PXA-2 and may not be overlapped with the non-pixel area NPXA.

In an embodiment, the 2-1$^{st}$ emission layer EML2-1 and the 2-2$^{nd}$ emission layer EML2-2 may be configured to emit light in different wavelength regions. For example, the 2-1$^{st}$ emission layer EML2-1 may be configured to emit a first light. The 2-2$^{nd}$ emission layer EM12-2 may be configured to emit a second light. In an embodiment, the first light may be blue light, and the second light may be green light or red light.

The second light emitting stack ST2 may further include a second electron transport region ETR2 disposed on the second emission layer EML2. The second electron transport region ETR2 may be disposed between the second emission layer EML2 and the second electrode EL2.

The second electron transport region ETR2 may be a common layer having the shape of one body on the emission layer EML2. The second electron transport region ETR2 may have the shape of one body connected from each other on the emission layer EML2. For example, the second electron transport region ETR2 may be provided as a common layer wholly overlapped with the first pixel area PXA-1, the second pixel area PXA-2, and the non-pixel area NPXA disposed therebetween. However, an embodiment of the present disclosure is not limited thereto. The second electron transport region ETR2 may be patterned and provided in the first pixel area PXA-1 and the second pixel area PXA-2 and may not be overlapped with the non-pixel area NPXA.

In FIG. 4, each of the first and second hole transport regions HTR1 and HTR2 has a single layer structure, but an embodiment of the present disclosure is not limited thereto. For example, each of the first and second hole transport regions HTR1 and HTR2 may have a single layer structure of a hole injection layer or a hole transport layer, or a single layer structure composed of a hole injection material and a hole transport material. In some embodiments, each of the first and second hole transport regions HTR1 and HTR2 may have a single layer structure composed of multiple different materials, or a multilayer structure including at least two selected from among a hole injection layer, a hole transport layer, an electron blocking layer, and a buffer layer. For example, each of the first and second hole transport regions HTR1 and HTR2 may have a stacked structure in a thickness direction of hole injection layer/hole transport layer, hole injection layer/hole transport layer/buffer layer, hole injection layer/buffer layer, hole transport layer/buffer layer, or hole injection layer/hole transport layer/electron blocking layer, but an embodiment of the present disclosure is not limited thereto.

Each of the first and second hole transport regions HTR1 and HTR2 may employ a general configuration-suitable in this technical field, without limitation.

Each of the first and second hole transport regions HTR1 and HTR2 may each independently include a compound represented by Formula H-2.

Formula H-2

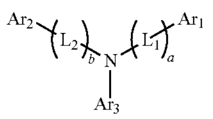

In Formula H-2 above, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms. In some embodiment, "a" and "b" may each independently be an integer of 0 to 10. In some embodiments, when "a" or "b" is an integer of 2 or more, multiple $L_1$ and $L_2$ may each independently be a substituted or unsubstituted arylene group of 6 to 30 ring-forming carbon atoms, or a substituted or unsubstituted heteroarylene group of 2 to 30 ring-forming carbon atoms.

In Formula H-2, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. In some embodiments, in Formula H-2, $Ar_3$ may be a substituted or unsubstituted aryl group of 6 to 30 ring-forming carbon atoms, or a substituted or unsubstituted heteroaryl group of 2 to 30 ring-forming carbon atoms.

The compound represented by Formula H-2 may be a monoamine compound. In some embodiments, the compound represented by Formula H-2 may be a diamine compound in which at least one among $Ar_1$ to $Ar_3$ includes an amine group as a substituent. In some embodiments, the compound represented by Formula H-2 may be a carbazole-based compound in which at least one among $Ar_1$ and $Ar_2$ includes a substituted or unsubstituted carbazole group, or a fluorene-based compound in which at least one among $Ar_1$ and $Ar_2$ includes a substituted or unsubstituted fluorene group.

The compound represented by Formula H-2 may be represented by any one selected from among the compounds in Compound Group H. However, the compounds shown in Compound Group H are only illustrations, and the compound represented by Formula H-2 is not limited to the compounds represented in Compound Group H.

Compound Group H

H-1-1

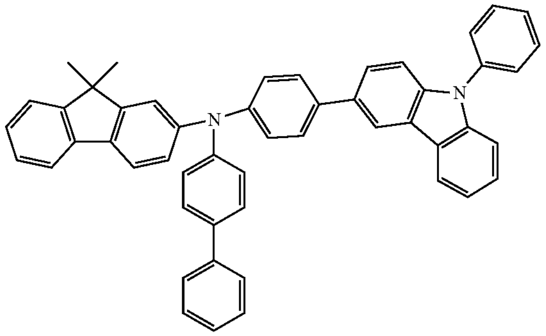

-continued

H-1-2

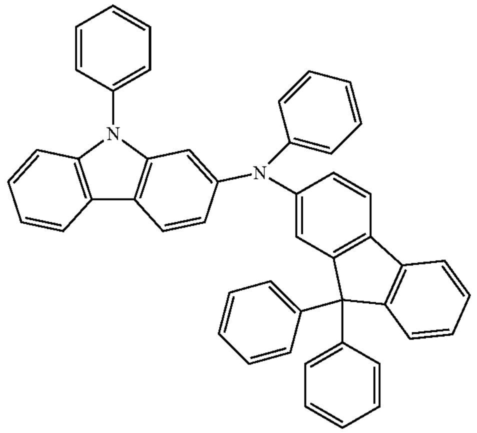

H-1-3

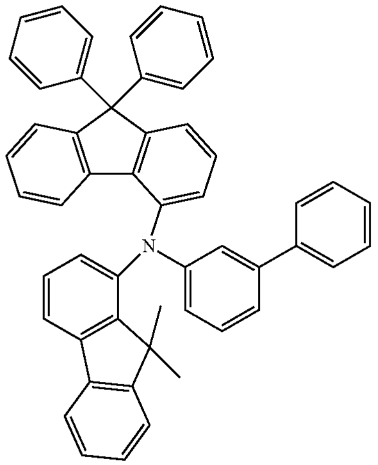

H-1-4

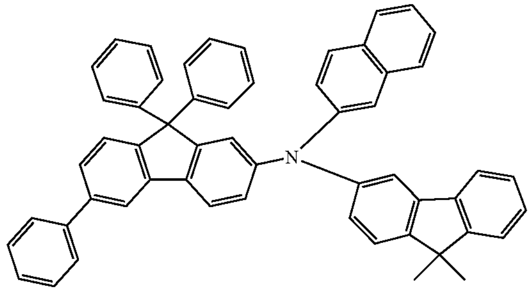

H-1-5

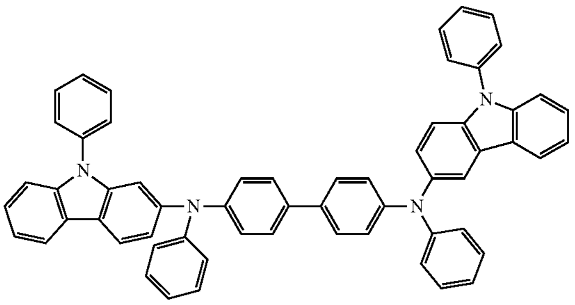

-continued
H-1-6
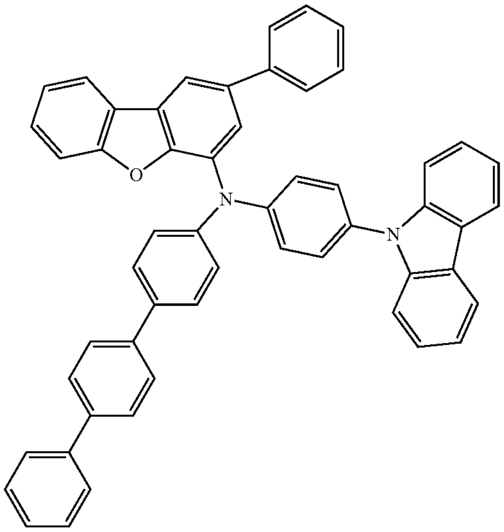
H-1-7
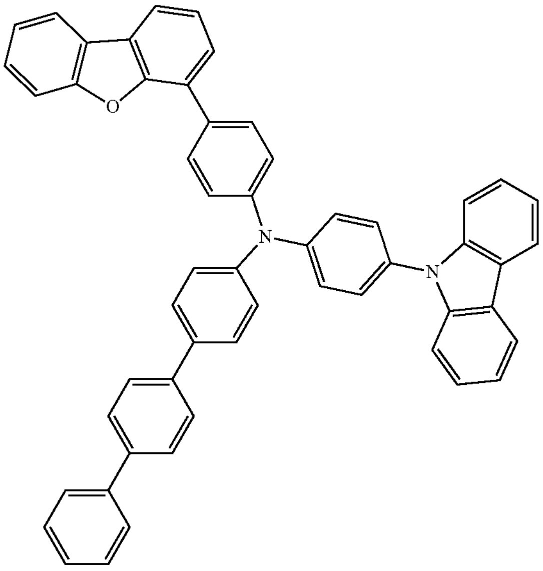
H-1-8
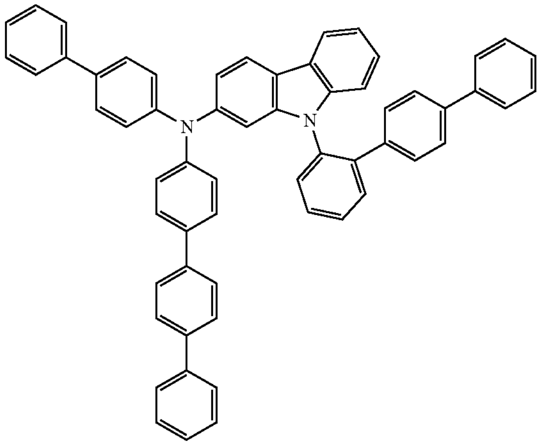
-continued
H-1-9
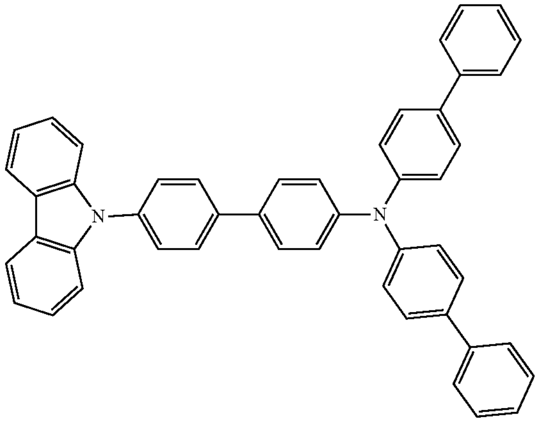
H-1-10
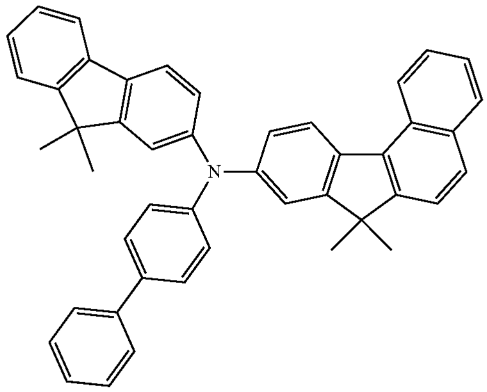
H-1-11
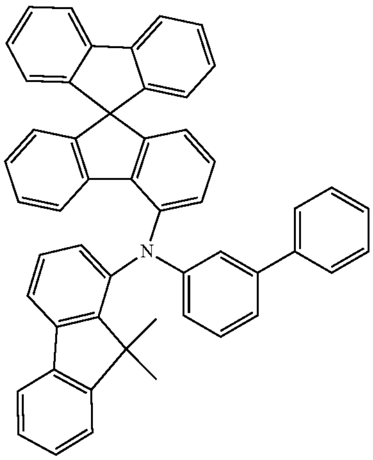

-continued
H-1-12
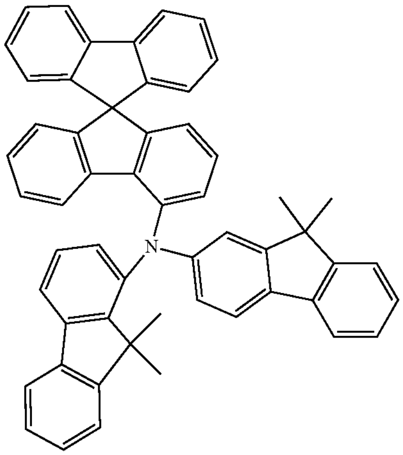
H-1-13
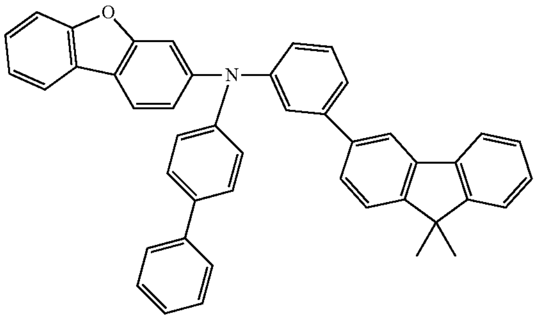
H-1-14
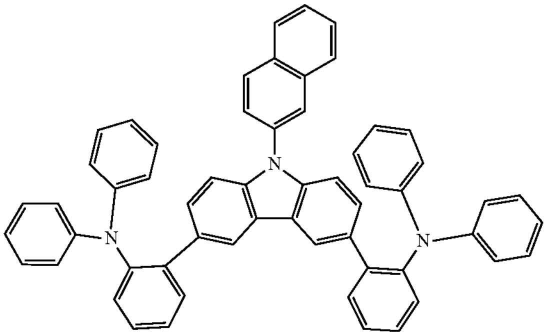
H-1-15
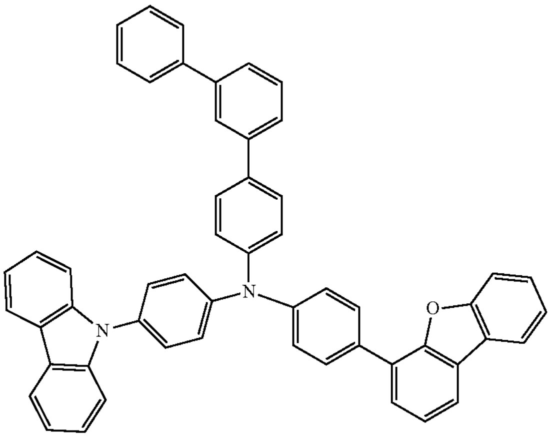
-continued
H-1-16
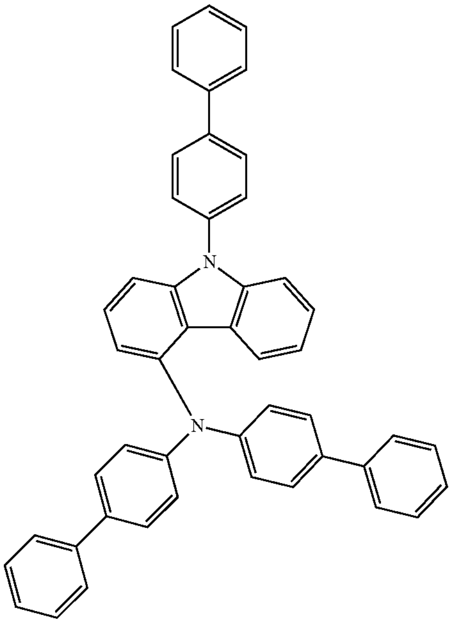
H-1-17
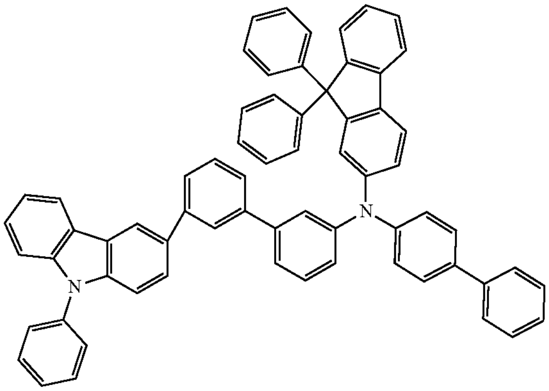
H-1-18
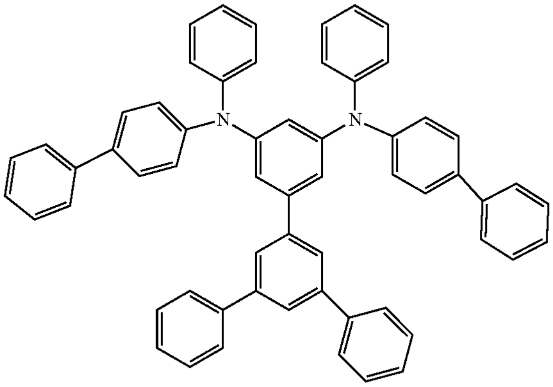

-continued

H-1-19

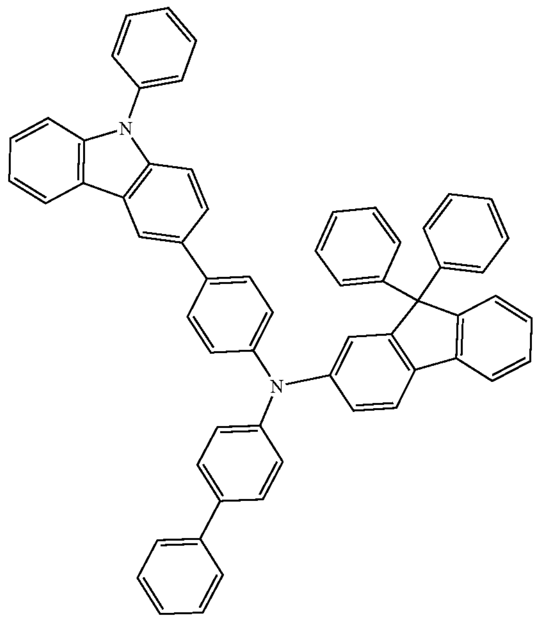

The first and second hole transport regions HTR1 and HTR2 may each independently include a phthalocyanine compound such as copper phthalocyanine, $N^1$,$N^{1'}$-([1,1'-biphenyl]-4,4'-diyl)bis($N^1$-phenyl-$N^4$,$N^4$-di-m-tolylbenzene-1,4-diamine) (DNTPD), 4,4',4"-[tris(3-methylphenyl)phenylamino] triphenylamine (m-MTDATA), 4,4',4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPA-PEK), 4-isopropyl-4'-methyldiphenyliodonium [tetrakis(pentafluorophenyl)borate], and/or dipyrazino[2,3-f:2',3'-h] quinoxaline-2,3,6,7,10,11-hexacarbonitrile (HAT-CN).

The first and second hole transport regions HTR1 and HTR2 may each independently include carbazole derivatives such as N-phenyl carbazole and polyvinyl carbazole, fluorene-based derivatives, N,N'-bis(3-methylphenyl)-N,N'-diphenyl-[1,1'-biphenyl]-4,4'-diamine (TPD), triphenylamine-based derivatives such as 4,4',4"-tris(N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl)benzeneamine] (TAPC), 4,4'-bis[N,N'-(3-tolyl)amino]-3,3'-dimethylbiphenyl (HMTPD), 1,3-bis(N-carbazolyl)benzene (mCP), etc.

In some embodiments, the first and second hole transport regions HTR1 and HTR2 may each independently include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

Each of the first and second hole transport regions HTR1 and HTR2 may include the compounds of the hole transport region in at least one selected from among a hole injection layer, a hole transport layer, and an electron blocking layer.

The first and second hole transport regions HTR1 and HTR2 may further include a charge generating material to increase conductivity in addition to the above-described materials. The charge generating material may be dispersed uniformly or non-uniformly in the first hole transport region HTR1. The charge generating material may be, for example, a p-dopant. The p-dopant may include at least one of metal halide compounds, quinone derivatives, metal oxides, and/or cyano group-containing compounds, without limitation. For example, the p-dopant may include one or more of metal halide compounds such as CuI and/or RbI, quinone derivatives such as tetracyanoquinodimethane (TCNQ) and/or 2,3,5,6-tetrafluoro-7,7',8,8-tetracyanoquinodimethane (F4-TCNQ), metal oxides such as tungsten oxide and molybdenum oxide, cyano group-containing compounds such as dipyrazino[2,3-f: 2',3'-h] quinoxaline-2,3,6,7,10,11-hexacarbonitrile (HATCN) and/or 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc., without limitation.

As described above, each of the first and second hole transport regions HTR1 and HTR2 may further include at least one selected from among a buffer layer and/or an electron blocking layer in addition to the hole injection layer and the hole transport layer. The buffer layer may compensate resonance distance according to the wavelength of light emitted from an emission layer and may increase emission efficiency. As materials included in the buffer layer, materials which may be included in the first and second hole transport regions HTR1 and HTR2 may be utilized. The electron blocking layer is a layer playing the role of blocking the injection of electrons from a first and second electron transport regions ETR1 and ETR2 to the first and second hole transport regions HTR1 and HTR2.

The thickness of each of the first and second hole transport regions HTR1 and HTR2 may be from about 100 Å to about 10,000 Å, for example, from about 100 Å to about 5,000 Å. When each of the first and second hole transport regions HTR1 and HTR2 includes a hole injection layer, the thickness of the hole injection region may be, for example, from about 30 Å to about 1,000 Å. When each of the first and second hole transport regions HTR1 and HTR2 includes a hole transport layer, the thickness of the hole transport layer may be from about 30 Å to about 1,000 Å. For example, when each of the first and second hole transport regions HTR1 and HTR2 includes an electron blocking layer, the thickness of the electron blocking layer may be from about 10 Å to about 1,000 Å. When the thicknesses of the first and second hole transport regions HTR1 and HTR2, the hole injection layer, the hole transport layer and the electron blocking layer satisfy the above-described ranges, satisfactory hole transport properties may be achieved without substantial increase of a driving voltage.

Each of the light emitting elements ED1 and ED2 of an embodiment may include multiple emission layers. For example, in each of the light emitting elements ED1 and ED2, a first light emitting stack ST1 may include a first emission layer EML1, and a second light emitting stack ST2 may include a second emission layer EML2. In an embodiment, the first light emitting stack ST1 may include a 1-1$^{st}$ emission layer EML1-1 overlapping with the first pixel area PXA-1 and a 1-2$^{nd}$ emission layer EML1-2 overlapping with the second pixel area PXA-2. The 1-1$^{st}$ emission layer EML1-1 and the 1-2$^{nd}$ emission layer EML1-2 may not be overlapped with the non-pixel area NPXA. The second light emitting stack ST2 may include a 2-1$^{st}$ emission layer EML2-1 overlapping with the first pixel area PXA-1 and a 2-2$^{nd}$ emission layer EML2-2 overlapping with the second pixel area PXA-2. In an embodiment, the 2-1$^{st}$ emission layer EML2-1 and the 2-2$^{nd}$ emission layer EML2-2 may not be overlapped with the non-pixel area NPXA.

The 1-1$^{st}$ emission layer EML1-1 and the 1-2$^{nd}$ emission layer EML1-2 may be layers emitting different colors. For example, any one among the 1-1$^{st}$ emission layer EML1-1 and the 1-2$^{nd}$ emission layer EML1-2 may be a layer emitting blue light, and the remainder may be a layer emitting light that is mixed with blue light to be white light. However, an embodiment of the present disclosure is not limited thereto. For example, the 1-1$^{st}$ emission layer EML1-1 may be a blue emission layer, and the 1-2$^{nd}$ emission layer EML1-2 may be a green or red emission layer.

The 2-1$^{st}$ emission layer EML2-1 and the 2-2$^{nd}$ emission layer EML2-2 may be layers emitting different colors. For example, any one selected from among the 2-1$^{st}$ emission layer EML2-1 and the 2-2$^{nd}$ emission layer EML2-2 may be a layer emitting blue light, and the remainder may be a layer emitting light that is mixed with blue light to be white light. However, an embodiment of the present disclosure is not limited thereto. For example, the 2-1$^{st}$ emission layer EML2-1 may be a blue emission layer, and the 2-2$^{nd}$ emission layer EML2-2 may be a green or red emission layer.

On a plane (e.g., in a plan view), the 1-1$^{st}$ emission layer EML1-1 and the 2-1$^{st}$ emission layer EML2-1 may be overlapped. In some embodiments, on a plane, the 1-2$^{nd}$ emission layer EML1-2 and the 2-2$^{nd}$ emission layer EML2-2 may be overlapped. In an embodiment, the 1-1$^{st}$ emission layer EML1-1 and the 2-1$^{st}$ emission layer EML2-1 may be layers emitting the same color, and the 1-2$^{nd}$ emission layer EML1-2 and the 2-2$^{nd}$ emission layer EML2-2 may be layers emitting the same color. For example, the 1-1$^{st}$ emission layer EML1-1 and the 2-1$^{st}$ emission layer EML2-1 may be configured to emit blue light, and the 1-2$^{nd}$ emission layer EML1-2 and the 2-2$^{nd}$ emission layer EML2-2 may be configured to emit green light and red light.

Each of the first and second emission layers EML1 and EML2 may have a thickness of about 100 Å to about 1000 Å, or about 100 Å to about 300 Å. Each of the first and second emission layers EML1 and EML2 may have a single layer formed utilizing a single material, a single layer formed utilizing multiple different materials, or a multilayer structure having multiple layers formed utilizing multiple different materials.

Each of the first and second emission layers EML1 and EML2 may include a suitable host and dopant. For example, each of the first and second emission layers EML1 and EML2 may include a compound represented by Formula E-1. The compound represented by Formula E-1 may be utilized as a fluorescence host material.

Formula E-1

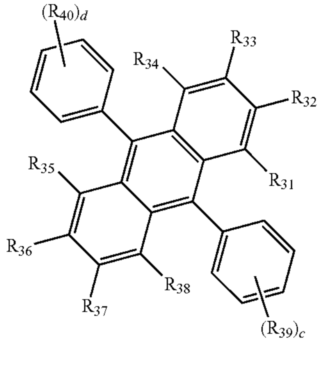

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group of 1 to 10 carbon atoms, a substituted or unsubstituted alkenyl group of 2 to 10 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring. In some embodiments, $R_{31}$ to $R_{40}$ may be combined with an adjacent group to form a saturated hydrocarbon ring, an unsaturated hydrocarbon ring, a saturated heterocycle, or an unsaturated heterocycle.

In Formula E-1, "c" and "d" may each independently be an integer of 0 to 5.

Formula E-1 may be represented by any one selected from Yoamong Compound E1 to Compound E19.

E1

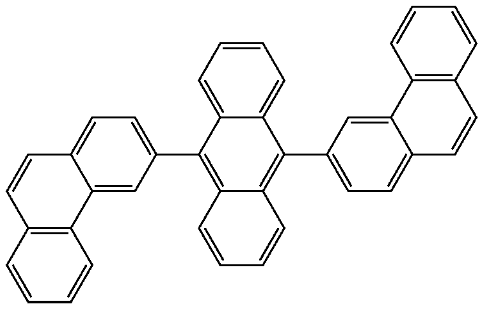

E2

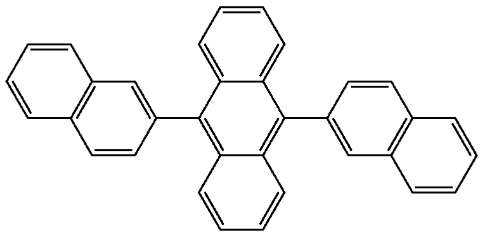

E3

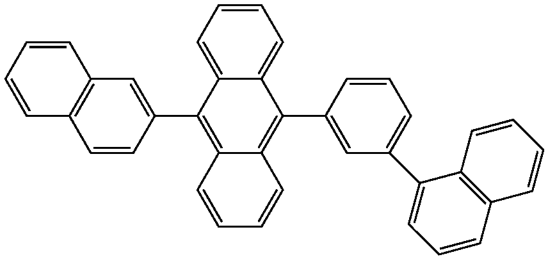

E4

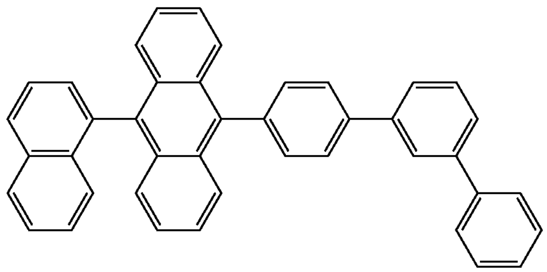

-continued
E5
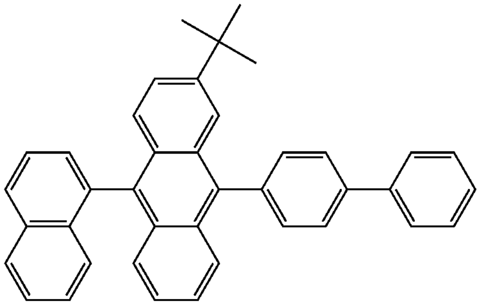
E6
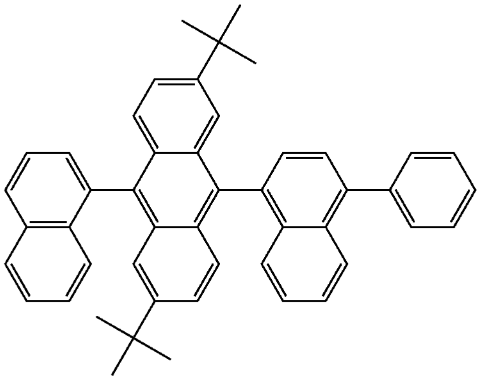
E7
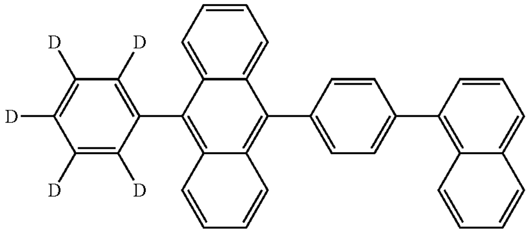
E8
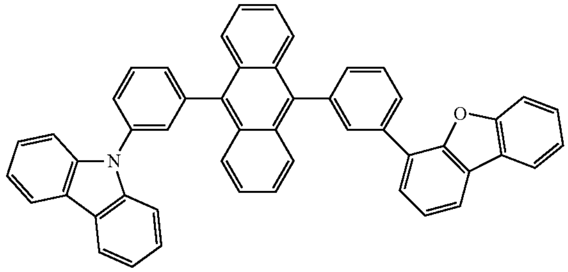
E9
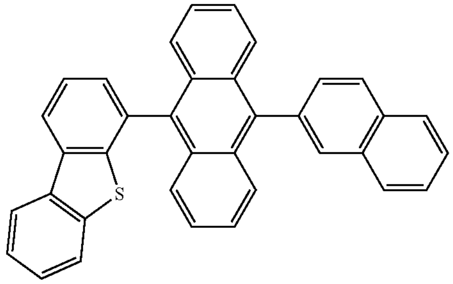
-continued
E10
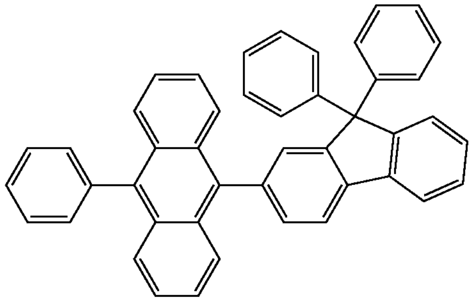
E11
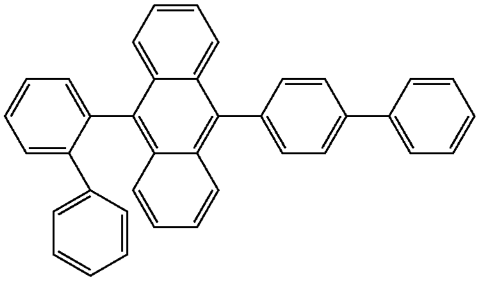
E12
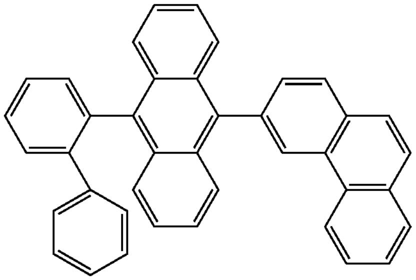
E13
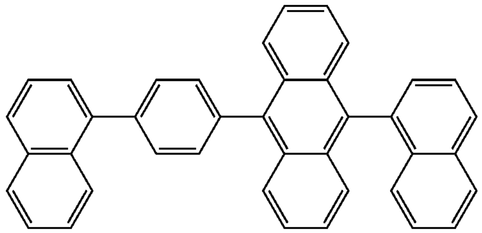
E14
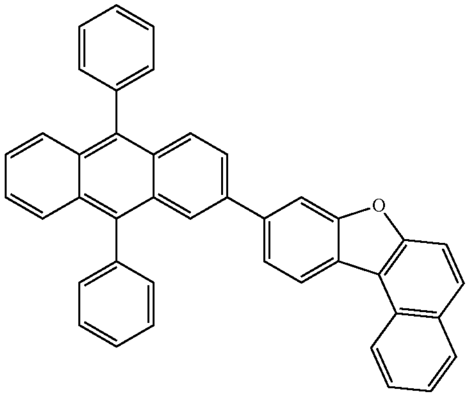

-continued

E15

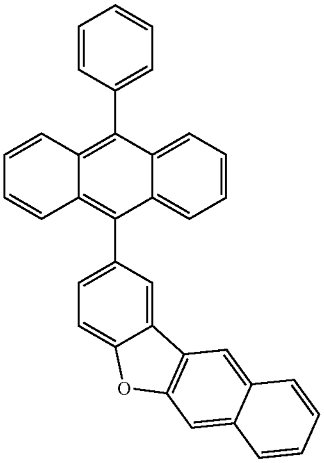

E16

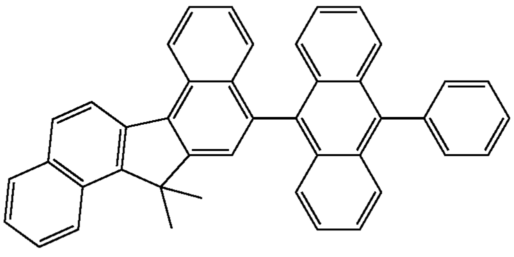

E17

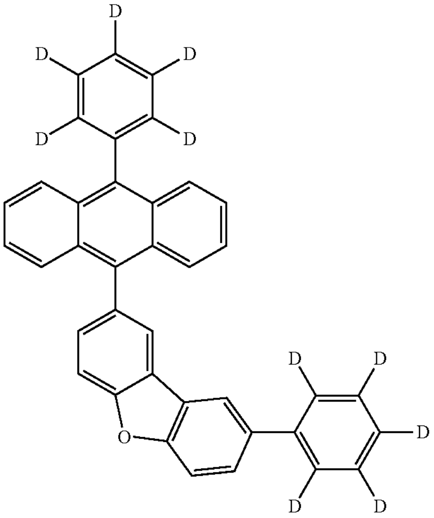

E18

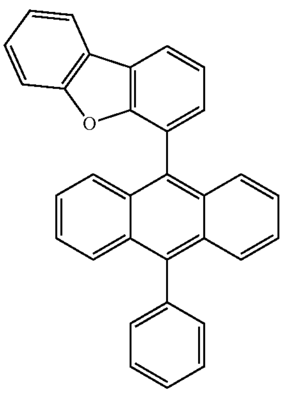

-continued

E19

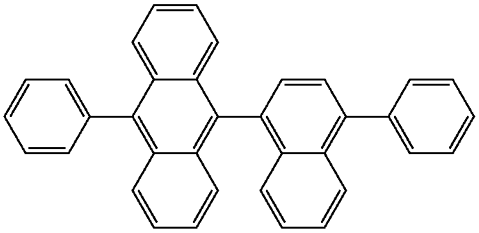

In an embodiment, the first and second emission layers EML1 and EML2 may each independently include a compound represented by Formula E-2a or Formula E-2b. The compound represented by Formula E-2a or Formula E-2b may be utilized as a phosphorescence host material.

Formula E-2a

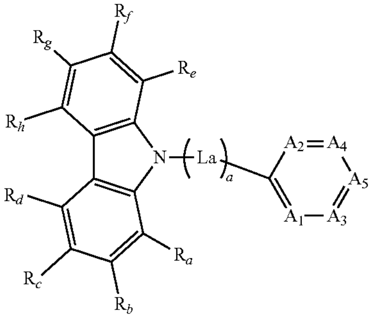

In Formula E-2a, “a” may be an integer of 0 to 10, La may be a direct linkage, a substituted or unsubstituted arylene group of 6 to 30 ring-forming carbon atoms, or a substituted or unsubstituted heteroarylene group of 2 to 30 ring-forming carbon atoms.

In some embodiments, when “a” is an integer of 2 or more, multiple La may each independently be a substituted or unsubstituted arylene group of 6 to 30 ring-forming carbon atoms, or a substituted or unsubstituted heteroarylene group of 2 to 30 ring-forming carbon atoms.

In some embodiments, in Formula E-2a, $A_1$ to $A_5$ may each independently be N or CRi. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. $R_a$ to $R_i$ may be combined with an adjacent group to form a hydrocarbon ring or a heterocycle including N, O, S, etc. as a ring-forming atom.

In some embodiments, in Formula E-2a, two or three selected from $A_1$ to $A_5$ may be N, and the remainder may be $CR_i$.

Formula E-2b $$(Cbz1)-(L_b)_b-(Cbz2)$$

In Formula E-2b, Cbz1 and Cbz2 may each independently be an unsubstituted carbazole group, or a carbazole group substituted with an aryl group of 6 to 30 ring-forming carbon atoms. $L_b$ may be a direct linkage, a substituted or unsubstituted arylene group of 6 to 30 ring-forming carbon atoms, or a substituted or unsubstituted heteroarylene group of 2 to 30 ring-forming carbon atoms. "b" is an integer of 0 to 10, and when "b" is an integer of 2 or more, multiple $L_b$ may each independently be a substituted or unsubstituted arylene group of 6 to 30 ring-forming carbon atoms, or a substituted or unsubstituted heteroarylene group of 2 to 30 ring-forming carbon atoms.

The compound represented by Formula E-2a or Formula E-2b may be represented by any one selected from among the compounds in Compound Group E-2. However, the compounds shown in Compound Group E-2 are only illustrations, and the compound represented by Formula E-2a or Formula E-2b is not limited to the compounds represented in Compound Group E-2.

Compound Group E-2

E-2-1

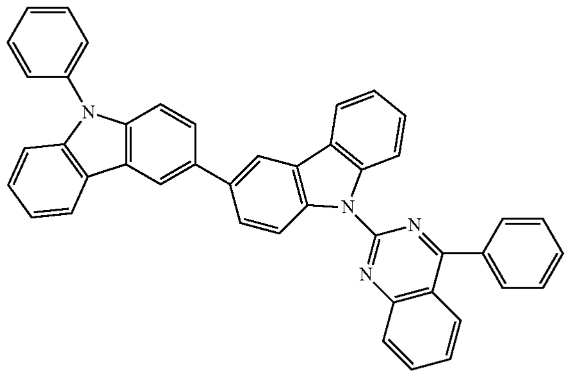

E-2-2

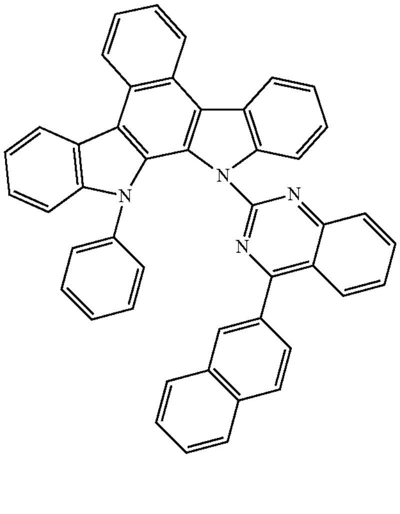

-continued

E-2-3

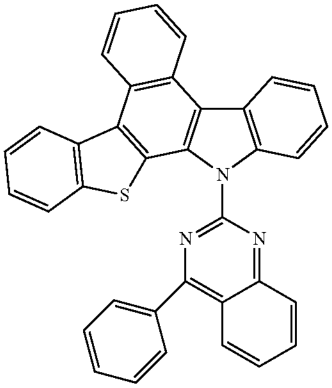

E-2-4

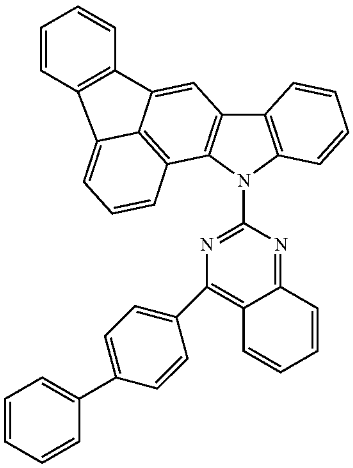

E-2-5

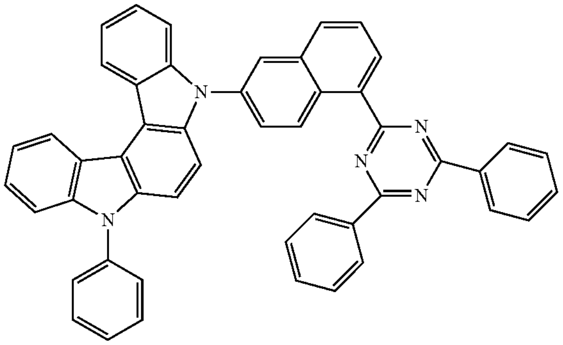

-continued
E-2-6
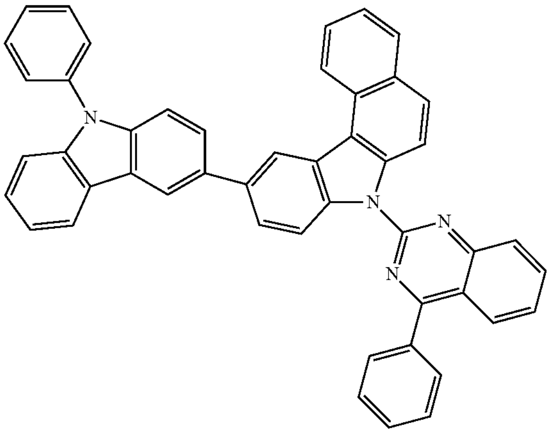
E-2-7
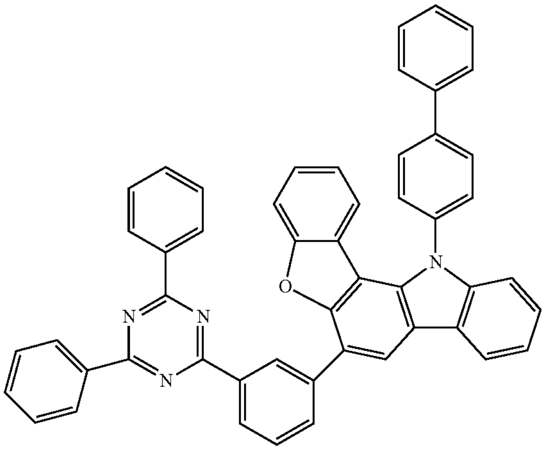
E-2-8
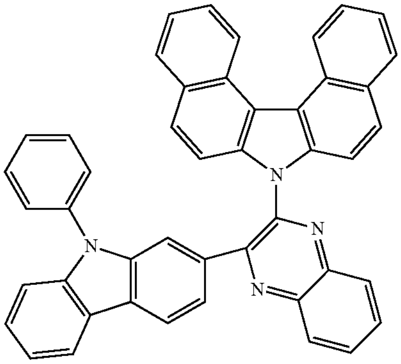
-continued
E-2-9
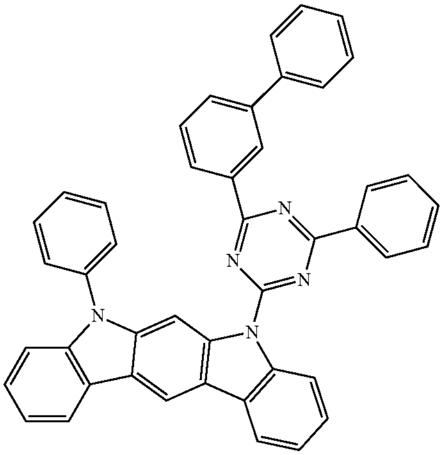
E-2-10
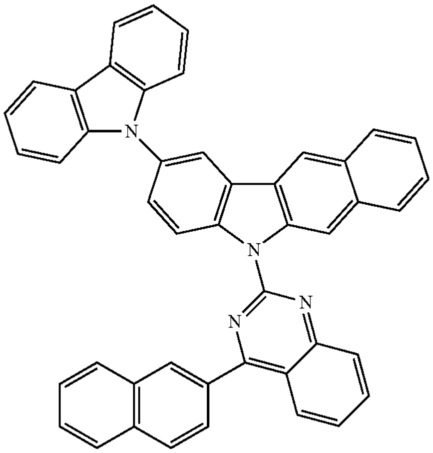
E-2-11
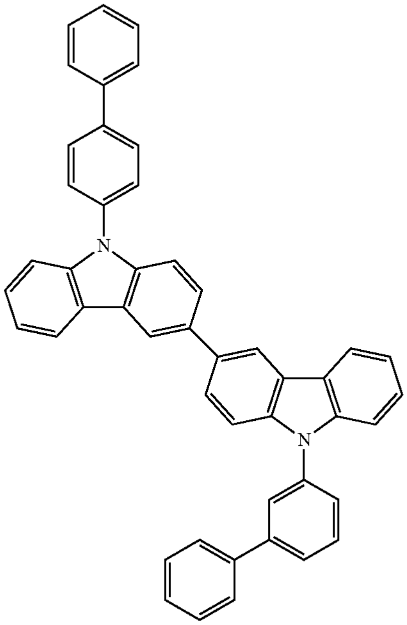

-continued
E-2-12
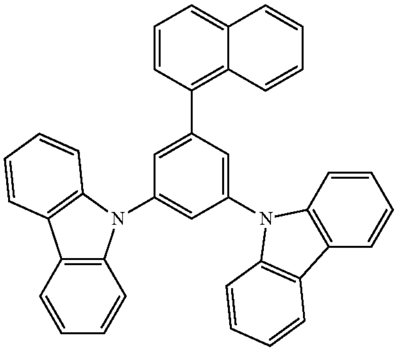
E-2-13
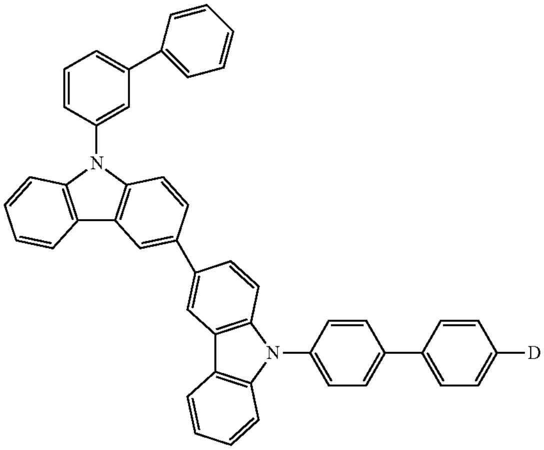
E-2-14
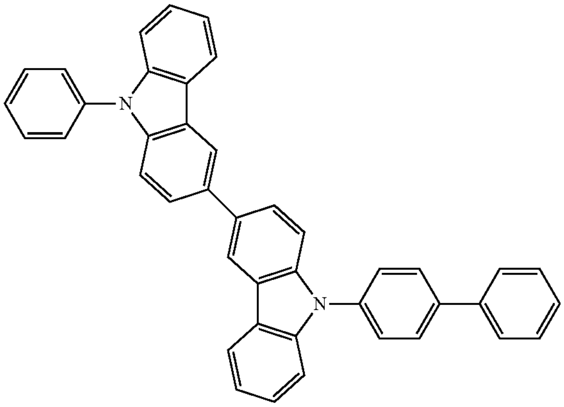
E-2-15
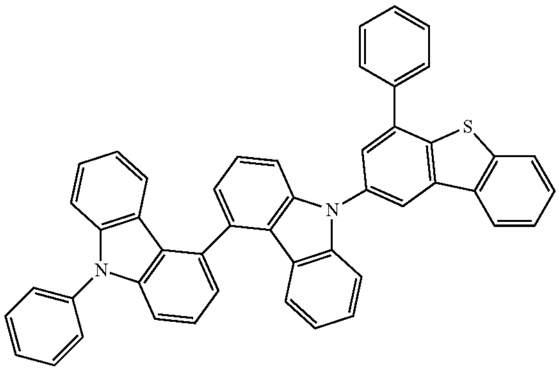
-continued
E-2-16
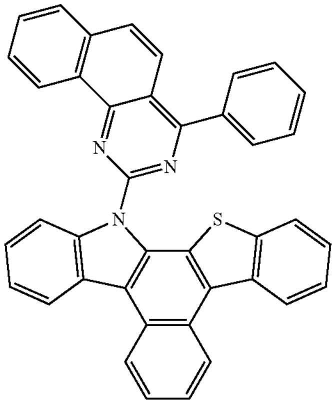
E-2-17
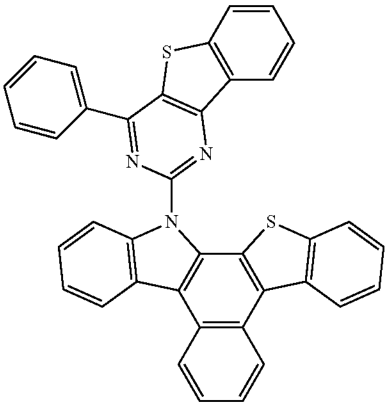
E-2-18
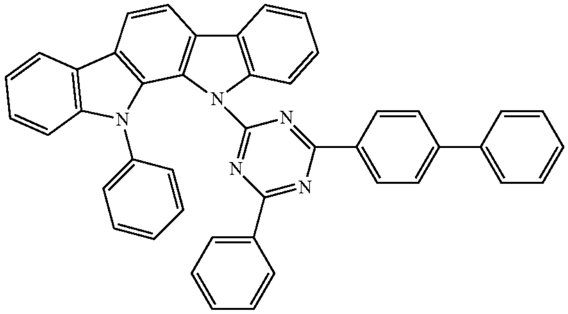
E-2-19
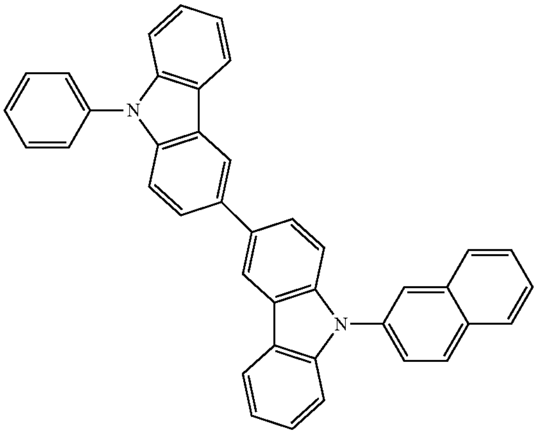

-continued

E-2-20

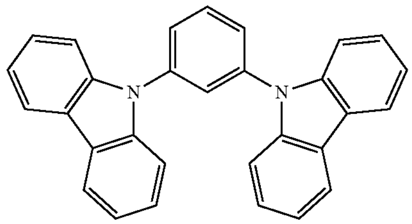

E-2-21

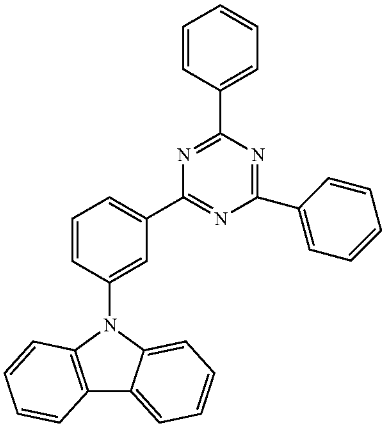

E-2-22

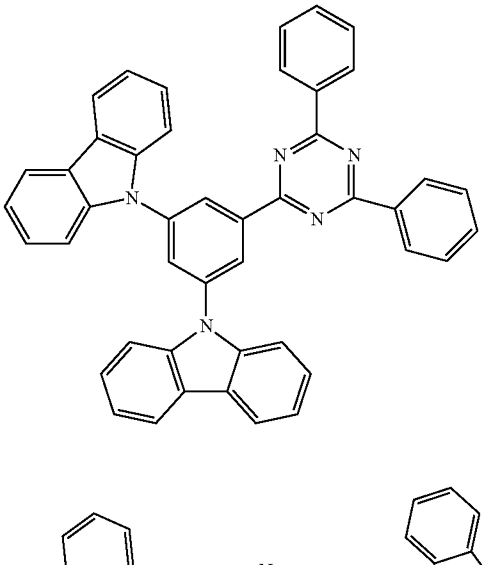

E-2-23

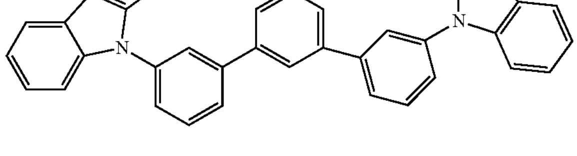

-continued

E-2-24

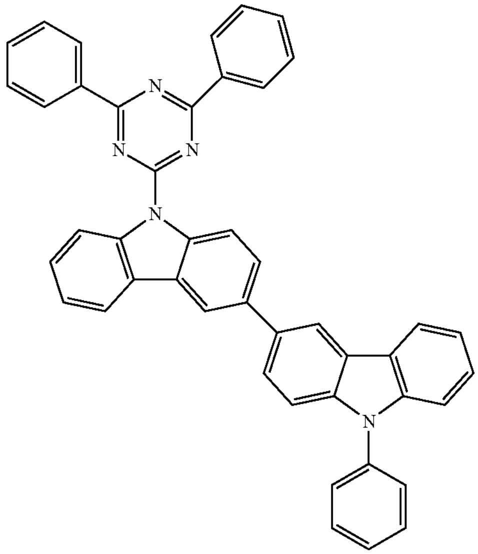

Each of the first and second emission layers EML1 and EML2 may further include a common material-suitable in the art as a host material. For example, the emission layer EML may include as a host material, at least one of bis (4-(9H-carbazol-9-yl) phenyl) diphenylsilane (BCPDS), (4-(1-(4-(diphenylamino) phenyl) cyclohexyl) phenyl) diphenyl-phosphine oxide (POPCPA), bis[2-(diphenylphosphino) phenyl] ether oxide (DPEPO), 4,4'-bis(N-carbazolyl)-1,1'-biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), or 1,3,5-tris(1-phenyl-1H-benzo[d]imidazole-2-yl)benzene (TPBi). However, an embodiment of the present disclosure is not limited thereto. For example, tris(8-hydroxyquinolino)aluminum ($Alq_3$), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane (DPSiO3), octaphenylcyclotetra siloxane (DPSiO4), etc. may be utilized as the host material.

Each of the first and second emission layers EML1 and EML2 may include a compound represented by Formula M-a. The compound represented by Formula M-a may be utilized as a phosphorescence dopant material.

Formula M-a

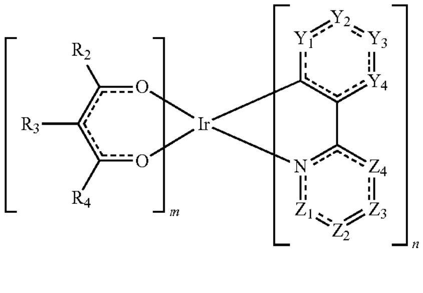

In Formula M-a, $Y_1$ to $Y_4$, and $Z_1$ to $Z_4$ may each independently be $CR_1$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula M-a, "m" is 0 or 1, and "n" is 2 or 3. In Formula M-a, when "m" is 0, "n" is 3, and when "m" is 1, "n" is 2.

The compound represented by Formula M-a may be utilized as a phosphorescence dopant.

The compound represented by Formula M-a may be represented by any one selected from among Compounds M-a1 to M-a25. However, Compounds M-a1 to M-a25 are illustrations, and the compound represented by Formula M-a is not limited to the compounds represented by Compounds M-a1 to M-a25.

M-a1

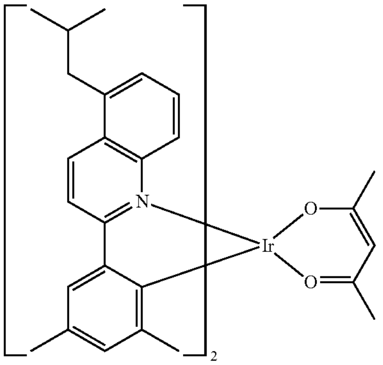

M-a2

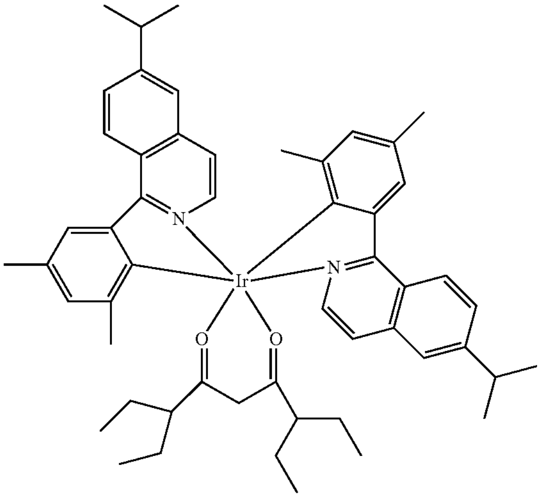

-continued

Ma-3

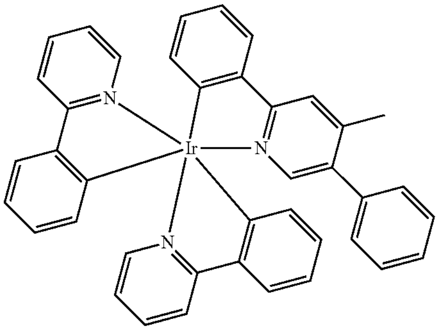

M-a4

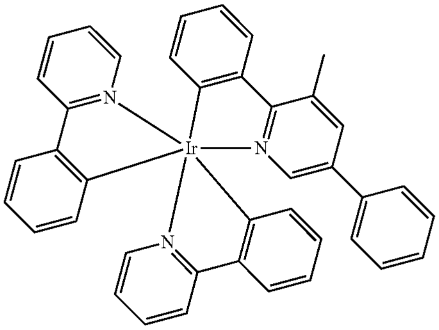

M-a5

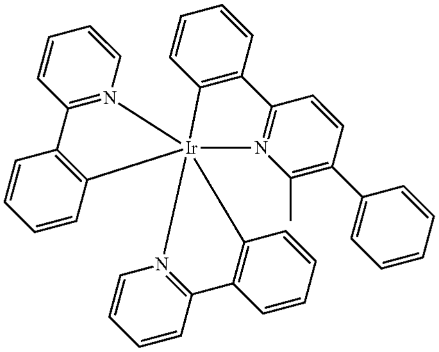

M-a6

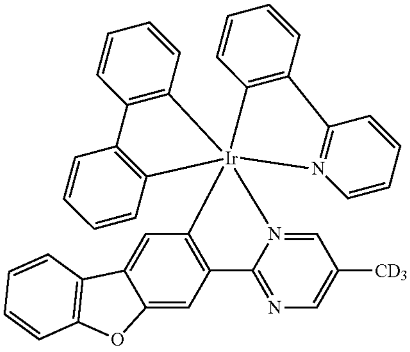

-continued
M-a7
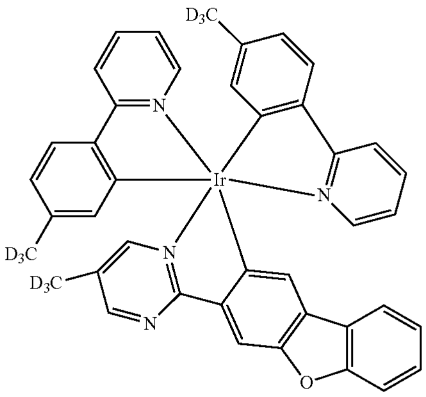
M-a8
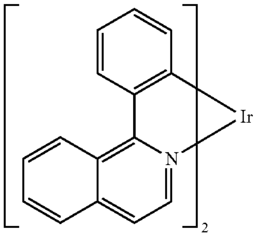
M-a9
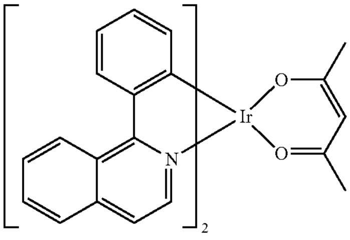
M-a10
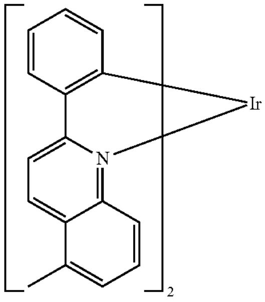
M-a11
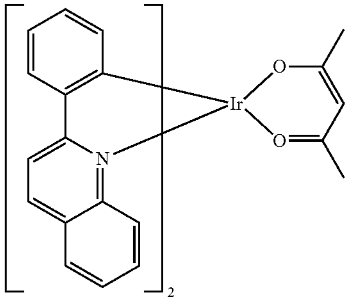
-continued
M-a12
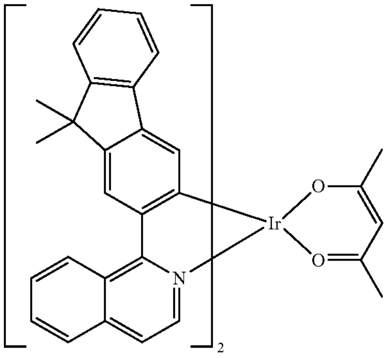
M-a13
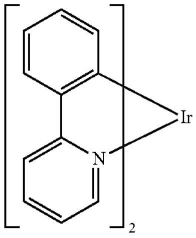
M-a14
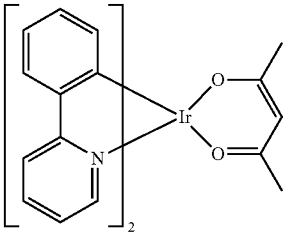
M-a15
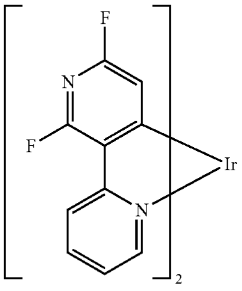
M-a16
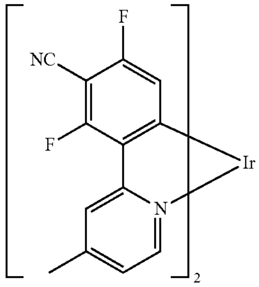

-continued
M-a17
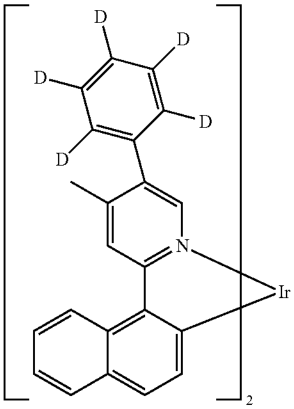
M-a18
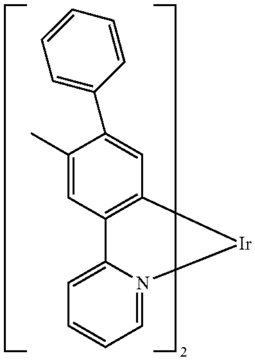
M-a19
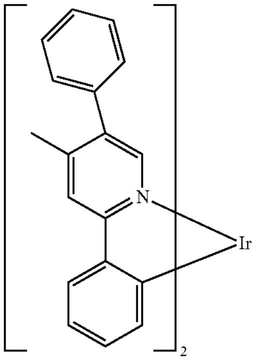
M-a20
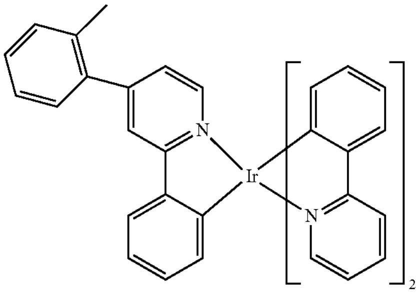
-continued
M-a21
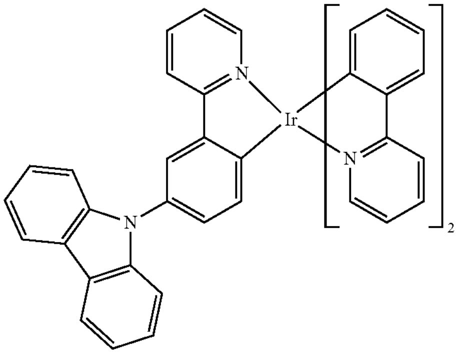
M-a22
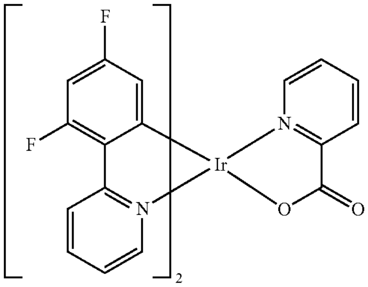
M-a23
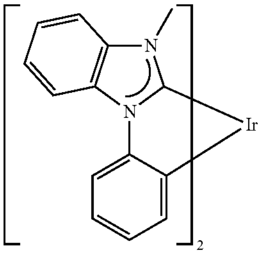
M-a24
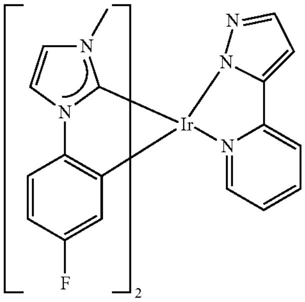
M-a25
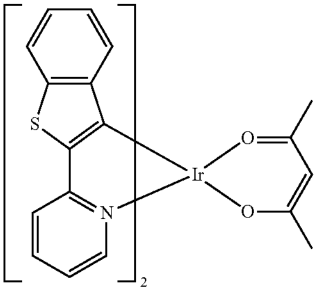
Each of the first and second emission layers EML1 and EML2 may further include any one among Formula F-a to Formula F-c. The compounds represented by Formula F-a to Formula F-c may be utilized as fluorescence dopant materials.

Formula F-a

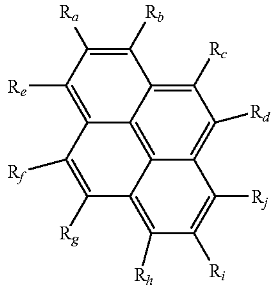

In Formula F-a, two selected from $R_a$ to $R_j$ may each independently be substituted with *—$NAr_1Ar_2$. The remainder not substituted with *—$NAr_1Ar_2$ among $R_a$ to $R_j$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In *—$NAr_1Ar_2$, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. For example, at least one selected from among $Ar_1$ and $Ar_2$ may be a heteroaryl group including O or S as a ring-forming atom.

Formula F-b

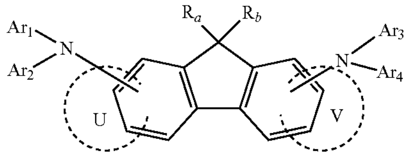

In Formula F-b, $R_a$ and $R_b$ may each independently be a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. $Ar_1$ to $Ar_4$ may each independently be a substituted or unsubstituted aryl group of 6 to 30 ring-forming carbon atoms, or a substituted or unsubstituted heteroaryl group of 2 to 30 ring-forming carbon atoms.

In Formula F-b, U and V may each independently be a substituted or unsubstituted hydrocarbon ring of 5 to 30 ring-forming carbon atoms, or a substituted or unsubstituted heterocycle of 2 to 30 ring-forming carbon atoms. At least one selected from among $Ar_1$ to $Ar_4$ may be a heteroaryl group including O or S as a ring-forming atom.

In Formula F-b, the number of rings represented by U and V may each independently be 0 or 1. For example, in Formula F-b, when the number of U or V is 1, one ring forms a fused ring at the designated part by U or V, and when the number of U or V is 0, a ring is not present at the designated part by U or V. For example, when the number of U is 0, and the number of V is 1, or when the number of U is 1, and the number of V is 0, a fused ring having the fluorene core of Formula F-b may be a ring compound with four rings. In some embodiments, when the number of both (e.g., simultaneously) U and V is 0, the fused ring of Formula F-b may be a ring compound with three rings. In some embodiments, when the number of both (e.g., simultaneously) U and V is 1, a fused ring having the fluorene core of Formula F-b may be a ring compound with five rings.

Formula F-c

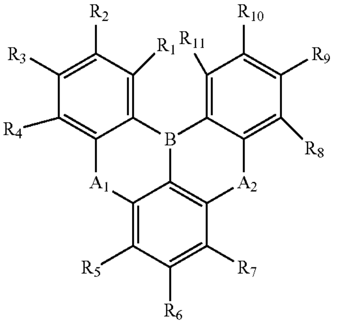

In Formula F-c, $A_1$ and $A_2$ may each independently be O, S, Se, or $NR_m$, and $R_m$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring.

In Formula F-c, $A_1$ and $A_2$ may each independently be combined with the substituents of an adjacent ring to form a fused ring. For example, when $A_1$ and $A_2$ may each independently be $NR_m$, $A_1$ may be combined with $R_4$ or $R_5$ to form a ring. In some embodiments, $A_2$ may be combined with $R_7$ or $R_8$ to form a ring.

In an embodiment, each of the first and second emission layers EML1 and EML2 may include as a suitable dopant material, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi), and 4,4'-bis[2-(4-(N,N-diphenylamino)phenyl)vinyl]biphenyl (DPAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, and 1,4-bis(N,N-diphenylamino)pyrene), etc.

The first and second emission layers EML1 and EML2 may further include a suitable phosphorescence dopant material. For example, the phosphorescence dopant may utilize a metal complex including iridium (Ir), platinum (Pt), osmium (Os), gold (Au), titanium (Ti), zirconium (Zr), hafnium (Hf), europium (Eu), terbium (Tb) or thulium (Tm). For example, iridium(III) bis(4,6-difluorophenylpyridinato- N,C2')picolinate (Flrpic), bis(2,4-difluorophenylpyridinato)-tetrakis(1-pyrazolyl)borate iridium(III) (Fir6), or platinum octaethyl porphyrin (PtOEP) may be utilized as the phosphorescence dopant. However, an embodiment of the present disclosure is not limited thereto.

Each of the first and second emission layers EML1 and EML2 may include a quantum dot.

In the description, the quantum dot refers to the crystal of a semiconductor compound. The quantum dot may be configured to emit light in one or more suitable emission wavelengths according to the size of the crystal. The quantum dot may be configured to emit light in one or more suitable emission wavelengths by controlling the element ratio in a quantum dot compound.

The diameter of the quantum dot(s) may be, for example, about 1 nm to about 10 nm. In the present disclosure, when particles of quantum dot (e.g., the quantum dots or in particle form) are spherical, "diameter" indicates a particle diameter or an average particle diameter, and when the particles are non-spherical, the "diameter" indicates a major axis length or an average major axis length. The diameter of the particles may be measured utilizing a scanning electron microscope or a particle size analyzer. As the particle size analyzer, for example, HORIBA, LA-950 laser particle size analyzer, may be utilized. When the size of the particles is measured utilizing a particle size analyzer, the average particle diameter is referred to as D50. D50 refers to the average diameter of particles whose cumulative volume corresponds to 50 vol % in the particle size distribution (e.g., cumulative distribution), and refers to the value of the particle size corresponding to 50% from the smallest particle when the total number of particles is 100% in the distribution curve accumulated in the order of the smallest particle size to the largest particle size.

The quantum dot may be synthesized by a chemical bath deposition, a metal organic chemical vapor deposition, a molecular beam epitaxy or a similar process therewith.

The chemical bath deposition is a method of growing quantum dot particle crystal after mixing an organic solvent and a precursor material. During the growth of the crystal, the organic solvent naturally plays the role of a dispersant coordinated at the surface of the quantum dot crystal and may control the growth of the crystal. Accordingly, the chemical bath deposition is more favorable than a vapor deposition method such as a metal organic chemical vapor deposition (MOCVD) and a molecular beam epitaxy (MBE), and may control the growth of the quantum dot particle through a low cost process.

Each of the first and second emission layers EML1 and EML2 of the present disclosure may include a quantum dot (e.g., quantum dot material or dots). The core of the quantum dot may be selected from a II-VI group compound, a III-V group compound, a III-VI group compound, a I-III-VI group compound, a IV-VI group compound, a IV group element, a IV group compound, and a combination thereof.

The II-VI group compound may be selected from the group consisting of: a binary compound selected from the group consisting of CdSe, CdTe, CdS, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof. In some embodiments, the II-VI group compound may further include a metal in group I and/or an element in group IV. A I-II-VI group compound may be selected from CuSnS or CuZnS, and a II-IV-VI group compound may select ZnSnS, etc. A I-II-IV-VI group compound may be selected from a quaternary compound selected from the group consisting of $Cu_2ZnSnS_2$, $Cu_2ZnSnS_4$, $Cu_2ZnSnSe_4$, $Ag_2ZnSnS_2$ and mixtures thereof.

The III-VI group compound may include a binary compound such as $In_2S_3$, and $In_2Se_3$, a ternary compound such as $InGaS_3$, and InGaSes, or a combination thereof.

The I-III-VI group compound may be selected from a ternary compound selected from the group consisting of AgInS, $AgInS_2$, CulnS, $CulnS_2$, $AgGaS_2$, $CuGaS_2$, $CuGaO_2$, $AgGaO_2$, $AgAlO_2$ and mixtures thereof, or a quaternary compound such as $AgInGaS_2$, and $CulnGaS_2$.

The III-V group compound may be selected from the group consisting of a binary compound selected from the group consisting of GaN, GaP, GaAs, GaSb, AlN, AlP, AlAs, AlSb, InN, InP, InAs, InSb, and mixtures thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof, and a quaternary compound selected from the group consisting of GaAlNP, GaAlNAs, GaAlNSb, GaAlPAs, GaAlPSb, GaInNP, GaInNAs, GalnNSb, GaInPAs, GalnPSb, InAlNP, InAlNAs, InAlNSb, InAlPAs, InAlPSb, and mixtures thereof. In some embodiments, the III-V group compound may further include a II group metal. For example, InZnP, etc. may be selected as a III-II-V group compound.

The IV-VI group compound may be selected from the group consisting of a binary compound selected from the group consisting of SnS, SnSe, SnTe, PbS, PbSe, PbTe, and mixtures thereof, a ternary compound selected from the group consisting of SnSeS, SnSeTe, SnSTe, PbSeS, PbSeTe, PbSTe, SnPbS, SnPbSe, SnPbTe, and mixtures thereof, and a quaternary compound selected from the group consisting of SnPbSSe, SnPbSeTe, SnPbSTe, and mixtures thereof.

The II-IV-V group compound may be selected from a ternary compound selected from the group consisting of ZnSnP, $ZnSnP_2$, $ZnSnAs_2$, $ZnGeP_2$, $ZnGeAs_2$, $CdSnP_2$, $CdGeP_2$ and mixtures thereof.

The IV group element may be selected from the group consisting of Si, Ge and mixtures thereof. The IV group compound may be a binary compound selected from the group consisting of SiC, SiGe and mixtures thereof.

Each element included in a polynary compound such as a binary compound, a ternary compound and a quaternary compound may be present at substantially uniform or substantially non-uniform concentrations in a particle. For example, the formulae refer to the types (kinds) of elements included in the compounds, and an element ratio in the compound may be different. For example, $AgInGaS_2$ may refer to $AgIn_xGa_{1-x}S_2$ (x is a real number between 0 and 1).

In this case, the binary compound, the ternary compound or the quaternary compound may be present at a substantially uniform concentration in a particle or may be present at a partially different concentration distribution state in substantially the same particle. In some embodiments, a core/shell structure in which one quantum dot wraps another quantum dot may be possible. In the core/shell structure, a concentration gradient in which the concentration of an element present in the shell is decreased toward the center, may be present.

In some embodiments, the quantum dot may have the above-described core-shell structure including a core including a nanocrystal and a shell wrapping the core. The shell of the quantum dot may play the role of a protection layer for preventing or reducing the chemical deformation of the core to maintain semiconductor properties and/or a charging layer for imparting the quantum dot with electrophoretic properties. The shell may have a single layer or a multilayer. Examples of the shell of the quantum dot may include a metal or non-metal oxide, a semiconductor compound, or a combination thereof.

For example, the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and/or NiO, or a ternary compound such as $MgAl_2O_4$, $CoFe_2O_4$, $NiFe_2O_4$ and/or $CoMn_2O_4$, but an embodiment of the present disclosure is not limited thereto.

Also, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but an embodiment of the present disclosure is not limited thereto.

The quantum dot may have a full width of half maximum (FWHM) of emission wavelength spectrum of about 45 nm or less, about 40 nm or less, or about 30 nm or less. Within this range, color purity or color reproducibility may be improved. In some embodiments, light emitted via such quantum dot is emitted in all directions, and light view angle properties may be improved.

In some embodiments, the shape of the quantum dot may be the shapes generally utilized in the art, without specific limitation. More particularly, the shape of spherical, pyramidal, multi-arm, or cubic nanoparticle, nanotube, nanowire, nanofiber, nanoplate particle, etc. may be utilized.

By controlling the size of the quantum dot or by controlling the element ratio in the compound constituting the quantum dot, energy band gap may be controlled or selected, and one or more suitable wavelength bands of light may be obtained from a quantum dot emission layer. Accordingly, by utilizing such a quantum dot (utilizing quantum dots having different sizes or controlling an element ratio in a quantum dot compound differently), a light emitting element emitting one or more suitable wavelengths of light may be accomplished. For example, the size of the quantum dot or the element ratio in the quantum dot compound may be controlled or selected to emit red, green and/or blue light. In some embodiments, the quantum dots may be provided to combine one or more suitable emission colors to emit white light.

Each of the first and second electron transport regions ETR1 and ETR2 may have a single layer formed utilizing a single material, a single layer formed utilizing multiple different materials, or a multilayer structure having multiple layers formed utilizing multiple different materials.

For example, each of the first and second electron transport regions ETR1 and ETR2 may have a single layer structure of an electron injection layer or an electron transport layer, or a single layer structure formed utilizing an electron injection material and an electron transport material. In some embodiments, each of the first and second electron transport regions ETR1 and ETR2 may have a single layer structure formed utilizing multiple different materials, or a structure stacked in a thickness direction of electron transport layer/electron injection layer, or hole blocking layer/electron transport layer/electron injection layer, without limitation. The thickness of each of the first and second electron transport regions ETR1 and ETR2 may be, for example, from about 1,000 Å to about 1,500 Å.

The first and second electron transport regions ETR1 and ETR2 may be formed utilizing one or more suitable methods such as a vacuum deposition method, a spin coating method, a cast method, a Langmuir-Blodgett (LB) method, an inkjet printing method, a laser printing method, and/or a laser induced thermal imaging (LITI) method.

The first and second electron transport regions ETR1 and ETR2 may employ a general configuration-suitable in this technical field, without limitation.

Each of the first and second electron transport regions ETR1 and ETR2 may include a compound represented by Formula ET-2.

Formula ET-2

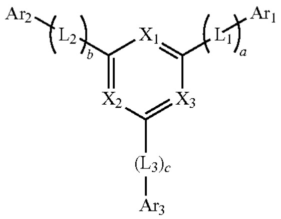

In Formula ET-2, at least one among $X_1$ to $X_3$ is N, and the remainder are $CR_a$. $R_a$ may be a hydrogen atom, a deuterium atom, a substituted or unsubstituted alkyl of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $Ar_1$ to $Ar_3$ may each independently be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-2, "a" to "c" may each independently be an integer of 0 to 10. In Formula ET-2, $L_1$ to $L_3$ may each independently be a direct linkage, a substituted or unsubstituted arylene group of 6 to 30 ring-forming carbon atoms, or a substituted or unsubstituted heteroarylene group of 2 to 30 ring-forming carbon atoms. In some embodiments, when "a" to "c" are integers of 2 or more, $L_1$ to $L_3$ may each independently be a substituted or unsubstituted arylene group of 6 to 30 ring-forming carbon atoms, or a substituted or unsubstituted heteroarylene group of 2 to 30 ring-forming carbon atoms.

Each of the first and second electron transport regions ETR1 and ETR2 may include an anthracene-based compound. However, an embodiment of the present disclosure is not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate ($Bebq_2$), 9,10-di(naphthalene-2-yl)anthracene (ADN), 1,3-bis[3,5-di(pyridin-3-yl)phenyl]benzene (BmPyPhB), and mixtures thereof, without limitation.
Each of the first and second electron transport regions ETR1 and ETR2 may include at least one among Compounds ET1 to ET36.
ET1
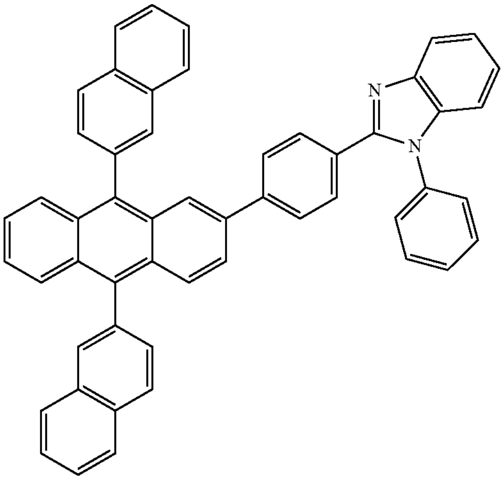
ET2
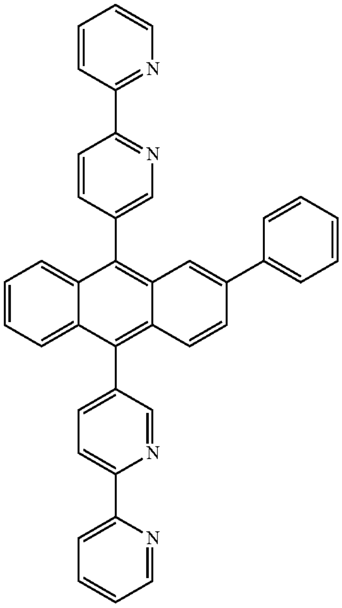
-continued
ET3
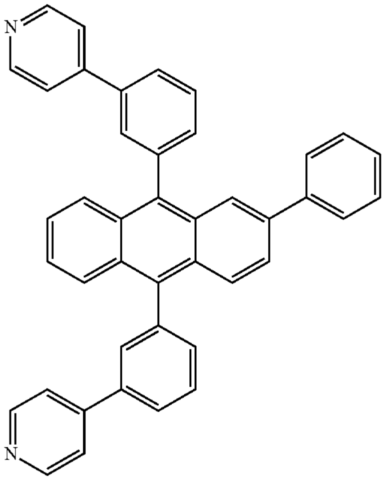
ET4
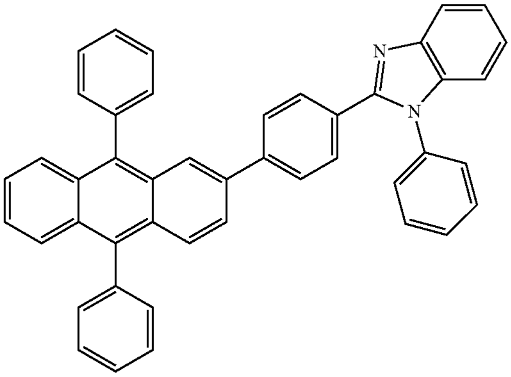
ET5
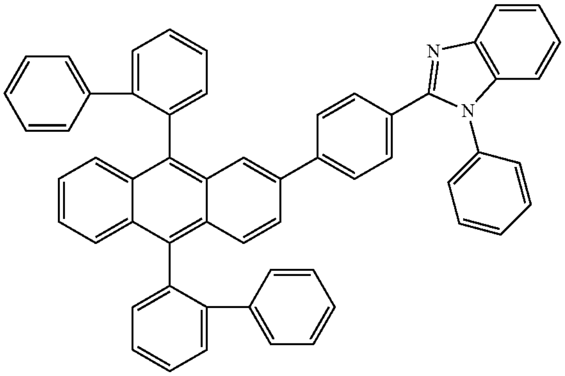

-continued
ET6
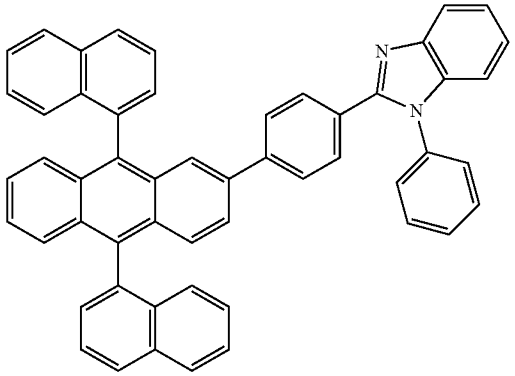
ET7
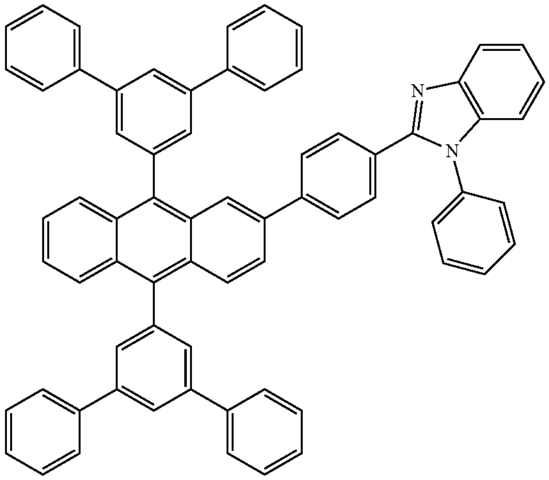
ET8
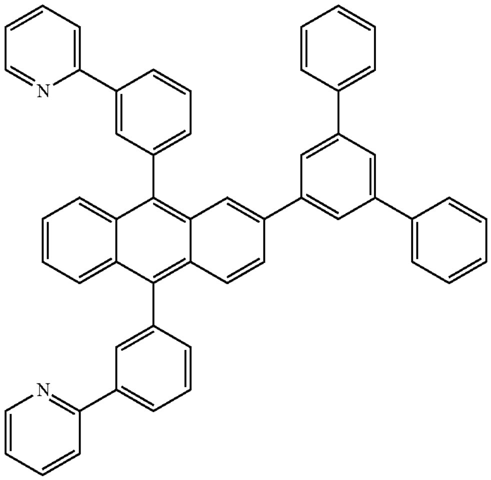
-continued
ET9
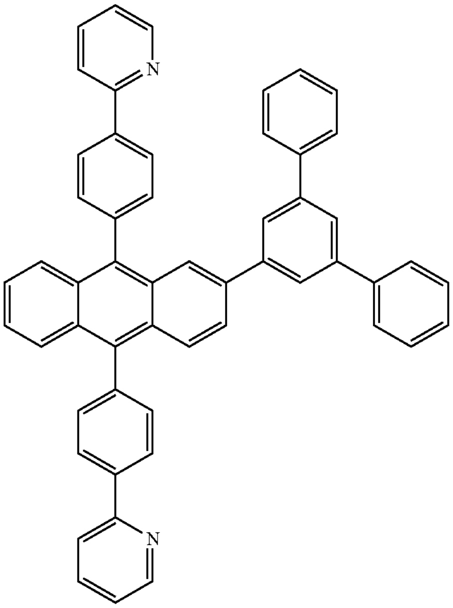
ET10
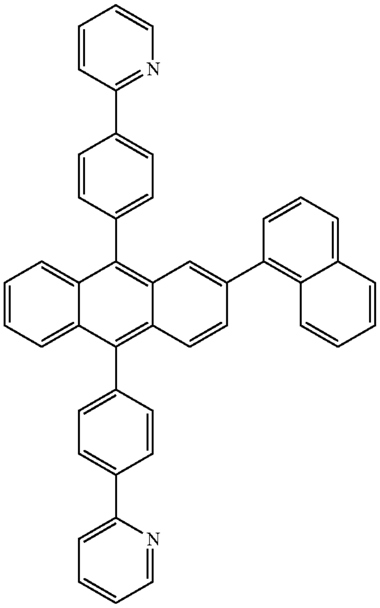

-continued
ET11
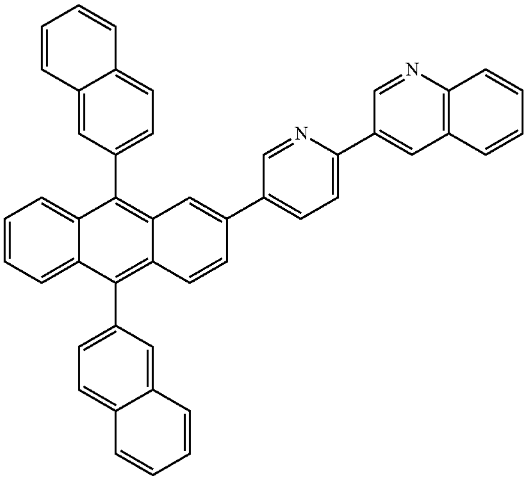
ET12
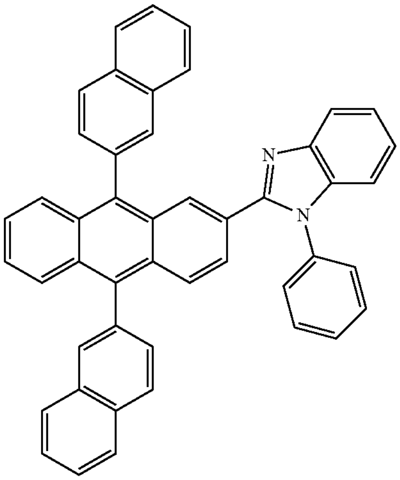
ET13
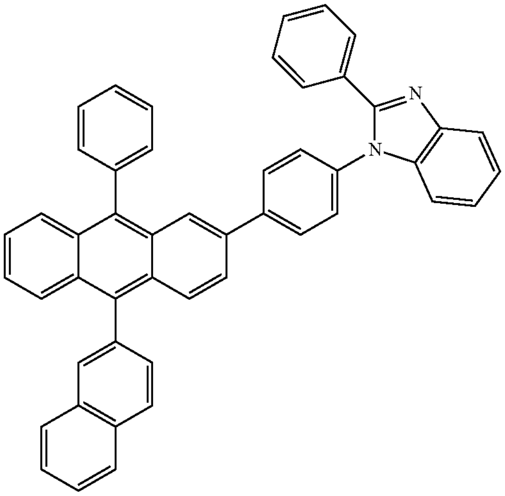
-continued
ET4
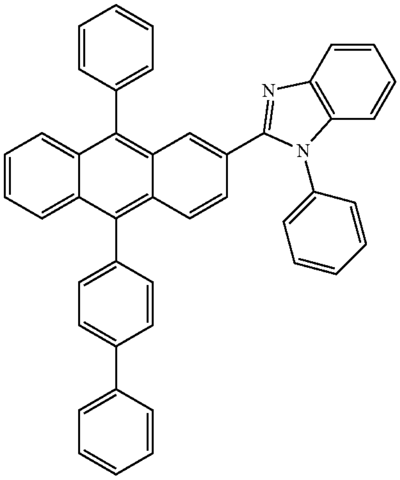
ET15
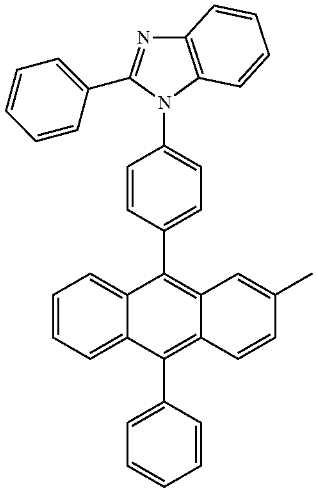
ET16
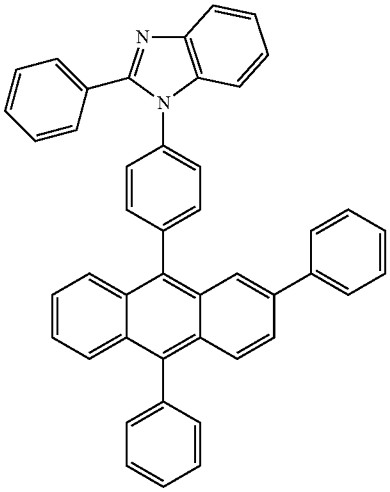

ET17
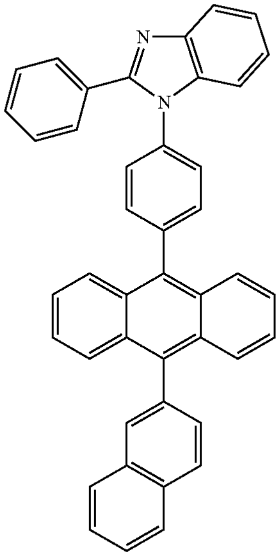
ET18
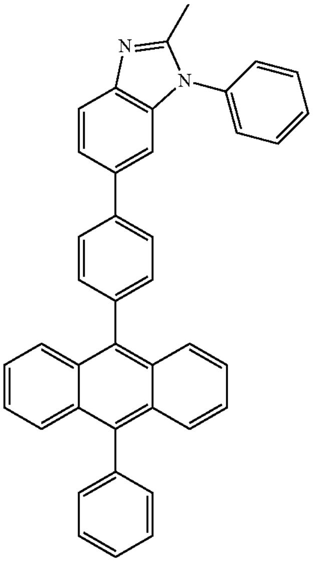
ET19
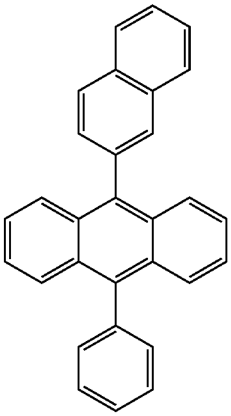
ET20
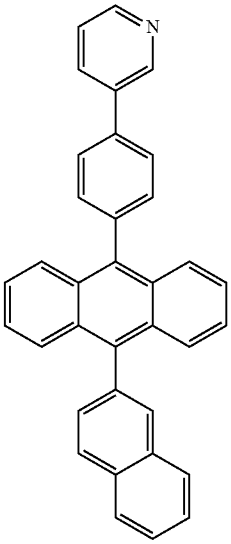
ET21
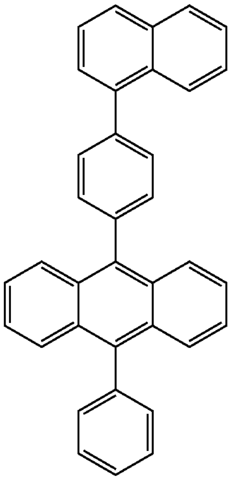
ET22
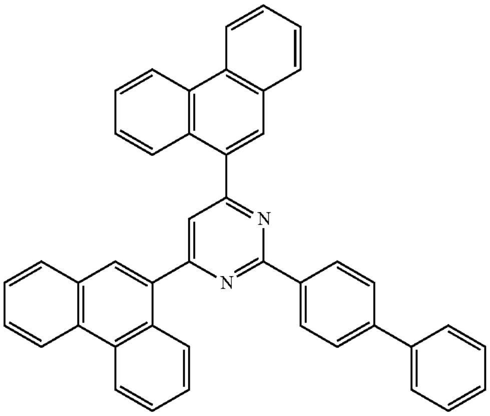

-continued
ET23
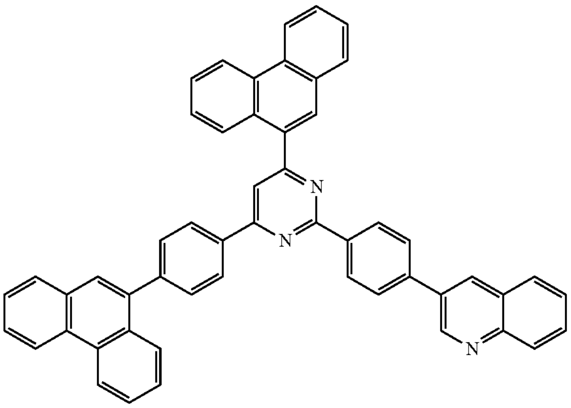
ET24
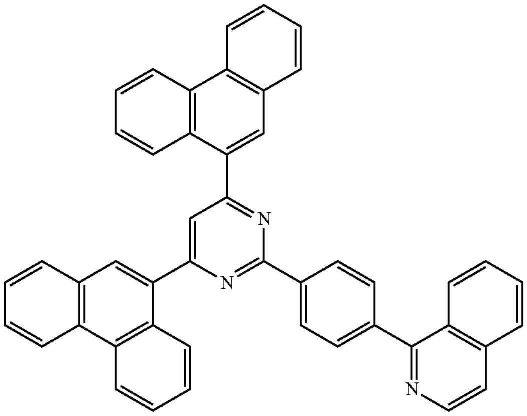
ET25
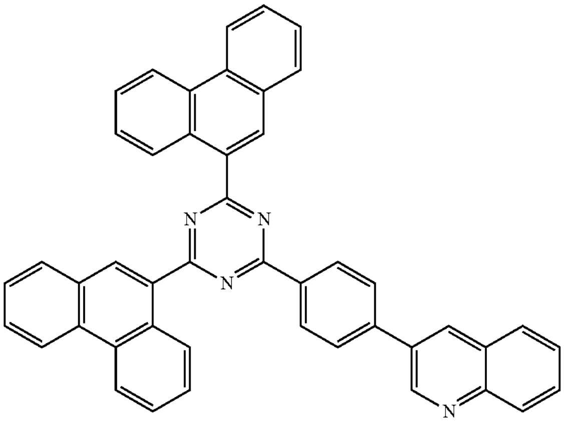
-continued
ET26
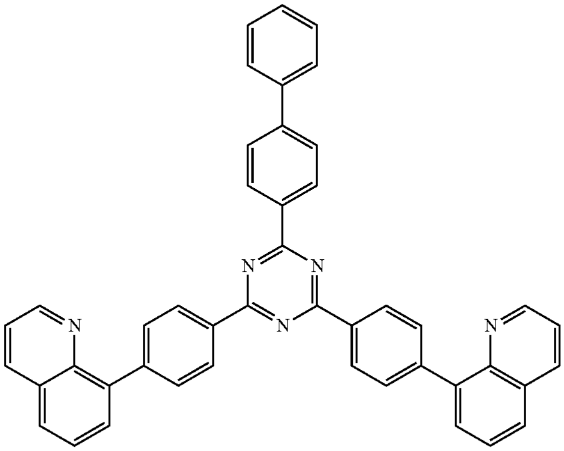
ET27
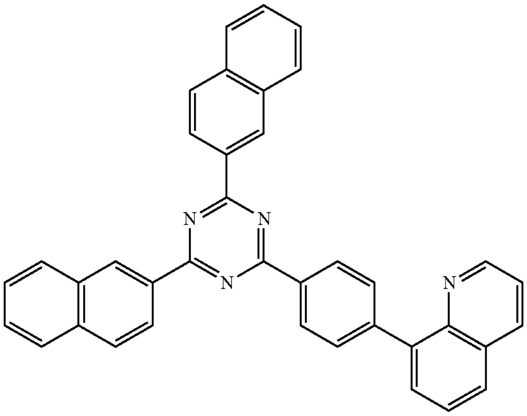
ET28
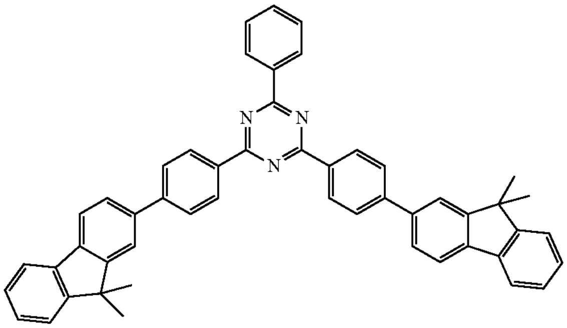

-continued
ET29
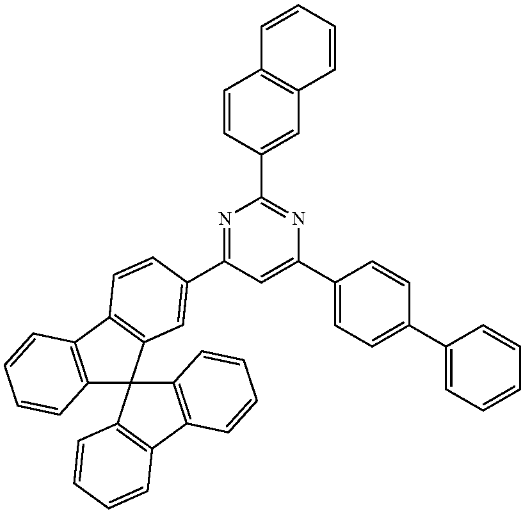
ET30
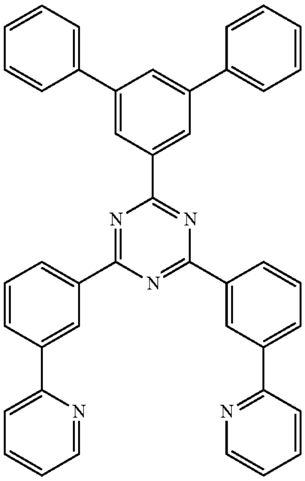
ET31
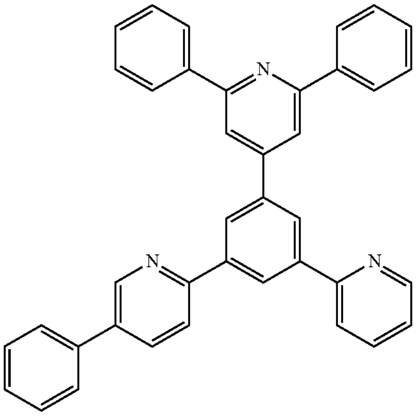
-continued
ET32
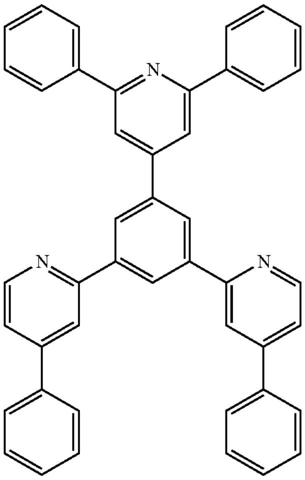
ET33
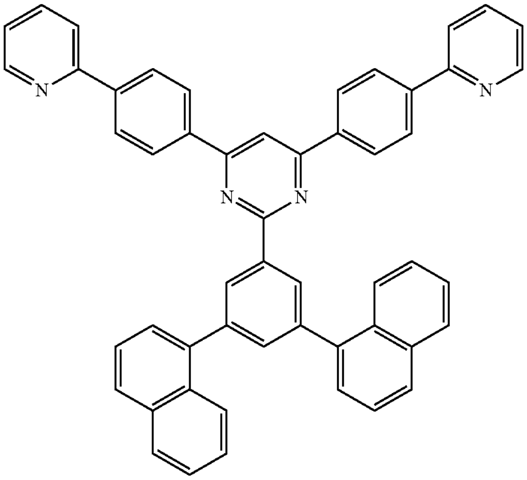
ET34
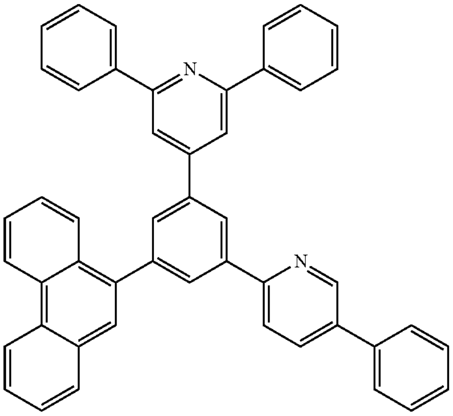

-continued

ET35

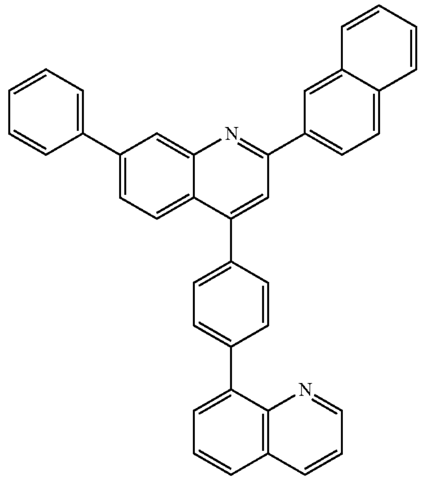

ET36

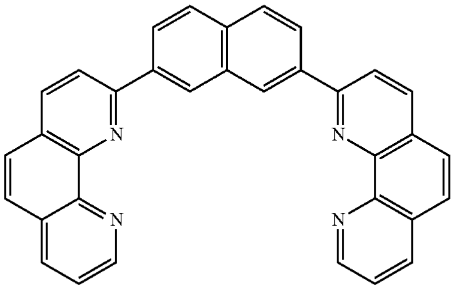

In some embodiments, each of the first and second electron transport regions ETR1 and ETR2 may include a metal halide such as LiF, NaCl, CsF, RbCl, RbI, CuI and/or KI, a lanthanide metal such as Yb, or a co-depositing material of the metal halide and the lanthanide metal. For example, each of the first and second electron transport regions ETR1 and ETR2 may include KI:Yb, RbI:Yb, LiF:Yb, etc., as the co-depositing material. In some embodiments, each of the first and second electron transport regions ETR1 and ETR2 may utilize a metal oxide such as $Li_2O$ and BaO, or 8-hydroxy-lithium quinolate (Liq). However, an embodiment of the present disclosure is not limited thereto. Each of the first and second electron transport regions ETR1 and ETR2 also may be formed utilizing a mixture material of an electron transport material and an insulating organo metal salt. The organo metal salt may be a material having an energy band gap of about 4 eV or more. For example, the organo metal salt may include, for example, metal acetates, metal benzoates, metal acetoacetates, metal acetylacetonates, or metal stearates.

Each of the first and second electron transport regions ETR1 and ETR2 may include at least one of 2,9-dimethyl-4,7-diphenyl-1,10-phenanthroline (BCP), diphenyl(4-(triphenylsilyl)phenyl)phosphine oxide (TSPO1) or 4,7-diphenyl-1,10-phenanthroline (Bphen) in addition to the aforementioned materials. However, an embodiment of the present disclosure is not limited thereto.

Each of the first and second electron transport regions ETR1 and ETR2 may include the compounds of the electron transport region in at least one selected from among an electron injection layer, an electron transport layer, and a hole blocking layer.

When each of the first and second electron transport regions ETR1 and ETR2 includes an electron transport layer, the thickness of the electron transport layer may be from about 100 Å to about 1,000 Å, for example, from about 150 Å to about 500 Å. When the thickness of the electron transport layer satisfies the above-described range, satisfactory electron transport properties may be obtained without a substantial increase of a driving voltage. When each of the first and second electron transport regions ETR1 and ETR2 includes the electron injection layer, the thickness of the electron injection layer may be from about 1 Å to about 100 Å, and from about 3 Å to about 90 Å. When the thickness of the electron injection layer satisfies the above described range, satisfactory electron injection properties may be obtained without inducing substantial increase of a driving voltage.

In the display device according to an embodiment, in order to prevent or reduce the production of lateral leakage current between adjacent pixels, a p-type or kind charge generating layer p-CGL and a second hole transport region HTR2 are patterned with respect to individual pixels and formed. In some embodiments, in the description, the "lateral leakage current" refers to current flowing in a direction different from a direction crossing a third direction DR3, other than current flowing in the third direction DR3 that is the stacking direction of a light emitting element, i.e., a direction displaying an image. The lateral leakage current may refer to current flowing in a direction parallel to a plane, on a plane defined by a first direction DR1 and a second direction DR2. In the display device according to an embodiment, the p-type or kind charge generating layer p-CGL, and the second hole transport region HTR2 disposed on the p-type or kind charge generating layer p-CGL may be patterned and formed with respect to individual pixels to prevent or reduce the production of the lateral leakage current, prevent or reduce the color mixing between adjacent pixel areas, and prevent or reduce the deterioration of luminance.

In the display device of an embodiment, the p-type or kind charge generating layer p-CGL may be formed utilizing a material having a relatively high charge mobility or formed to have a high doping concentration. Accordingly, when the p-type or kind charge generating layer p-CGL is formed as a common layer, it may act as a moving passage of charges, and as a result, the lateral leakage current may occur, by which charges flow during driving from any one pixel to another pixel through the p-type or kind charge generating layer p-CGL. According to the present disclosure, the p-type or kind charge generating layer p-CGL, and the second hole transport region HTR2 disposed on the p-type or kind charge generating layer p-CGL are not formed as common layers but are patterned and formed with respect to individual pixels to prevent or reduce the production of the lateral leakage current.

Referring to FIG. 5, the charge generating layer CGL may further include a buffer layer BF between an n-type or kind charge generating layer n-CGL and a p-type or kind charge generating layer p-CGL. The buffer layer BF may be overlapped with a first pixel area PXA-1 and a second pixel area PXA-2 on a plane. The buffer layer BF may be overlapped with a first sub-electrode EL1-1 and the second sub-electrode EL1-2 on a plane. The buffer layer BF may be an insulating layer. The buffer layer BF may be a layer preventing or reducing the passing of a portion of the material of the p-type or kind charge generating layer p-CGL to the n-type or kind charge generating layer n-CGL. However, an embodiment of the present disclosure is not limited thereto, and the n-type or kind charge generating layer n-CGL and the p-type or kind charge generating layer p-CGL may contact with each other.

The buffer layer BF may include an organic material and/or inorganic material. The buffer layer BF may include $C_{60}$, Copper(II) phthalocyanine (CuPc), tris(8-hydroxyquinolino)aluminum ($Alq_3$), 4,7-diphenyl-1,10-phenanthroline (Bphen), N,N'-di(1-naphthalene-1-yl)-N,N'-diphenyl-benzidine (NPB), etc., without limitation.

Referring to FIG. 6, multiple pixel areas PXA-1, PXA-2 and PXA-3 may further include a third pixel area PXA-3 which is adjacent to a second pixel area PXA-2.

A first electrode EL1 may further include a third sub-electrode EL1-3 corresponding to the third pixel area PXA-3. The third sub-electrode EL1-3 may be separately disposed from the first sub-electrode EL1-1 and the second sub-electrode EL1-2.

A first emission layer EML1 may further include a 1-$3^{rd}$ emission layer EML1-3 overlapping with the third pixel area PXA-3. The 1-$3^{rd}$ emission layer EML1-3 may be correspondingly disposed on the third sub-electrode EL1-3. The 1-$3^{rd}$ emission layer EML1-3 may be separately disposed from the 1-$1^{st}$ emission layer EML1-1 and the 1-$2^{nd}$ emission layer EML1-2.

A p-type or kind charge generating layer p-CGL may further include a third p-type or kind charge generating layer p-CGL3 overlapping with the third pixel area PXA-3. The third p-type or kind charge generating layer p-CGL3 may be separately disposed from a first p-type or kind charge generating layer p-CGL1 and a second charge generating layer p-CGL2.

The first to third p-type or kind charge generating layers p-CGL1, p-CGL2 and p-CGL3 included in the p-type or kind charge generating layer p-CGL may be separately disposed from each other on a plane. For example, the first p-type or kind charge generating layer p-CGL1 may be overlapped with the first pixel area PXA-1 and may not be overlapped with the non-pixel area NPXA. The second p-type or kind charge generating layer p-CGL2 may be overlapped with the second pixel area PXA-2 and may not be overlapped with the non-pixel area NPXA. The third p-type or kind charge generating layer p-CGL3 may be overlapped with the third pixel area PXA-3, and may not be overlapped with the non-pixel area NPXA.

A second hole transport region HTR2 may further include a 1-$3^{rd}$ hole transport region HTR1-3 overlapping with the third pixel area PXA-3. The 1-$3^{rd}$ hole transport region HTR1-3 may be disposed on the third p-type or kind charge generating layer p-CGL3. The 1-$3^{rd}$ hole transport region HTR1-3 may be separately disposed from a 1-$1^{st}$ hole transport region HTR1-1 and a 1-$2^{nd}$ hole transport region HTR1-2. The 1-$3^{rd}$ hole transport region HTR1-3 may be separated from the 1-$1^{st}$ hole transport region HTR1-1 and the 1-$2^{nd}$ hole transport region HTR1-2 on a plane. The 1-$3^{rd}$ hole transport region HTR1-3 may be overlapped with the third pixel area PXA-3 and may not be overlapped with the non-pixel area NPXA.

A second emission layer EML2 may further include a 2-$3^{rd}$ emission layer EML2-3 overlapping with the third pixel area PXA-3. The 2-$3^{rd}$ emission layer EML2-3 may be disposed on the 1-$3^{rd}$ hole transport region HTR1-3. The 2-$3^{rd}$ emission layer EML2-3 may be separately disposed from a 2-$1^{st}$ emission layer EML2-1 and a 2-$2^{nd}$ emission layer EML2-2. The 2-$3^{rd}$ emission layer EML2-3 may be overlapped with the third pixel area PXA-3 and may not be overlapped with the non-pixel area NPXA.

A 1-$3^{rd}$ emission layer EML1-3 may be a layer emitting the same color as the 2-$3^{rd}$ emission layer EML2-3. The 1-$3^{rd}$ emission layer EML1-3 may be a layer emitting color different from each of a 1-$1^{st}$ emission layer EML1-1 and a 1-$2^{nd}$ emission layer EML1-2. The 2-$3^{rd}$ emission layer EML2-3 may be a layer emitting color different from each of the 2-$1^{st}$ emission layer EML2-1 and the 2-$2^{nd}$ emission layer EML2-2. For example, the 1-$1^{st}$ emission layer EML1-1 and the 2-$1^{st}$ emission layer EML2-1 may be blue emission layers, the 1-$2^{nd}$ emission layer EML1-2 and the 2-$2^{nd}$ emission layer EML2-2 may be green emission layers, and the 1-$3^{rd}$ emission layer EML1-3 and the 2-$3^{rd}$ emission layer EML2-3 may be red emission layers.

Referring to FIG. 7, the light emitting element ED of an embodiment may further include multiple emission auxiliary layers SR1 and SR2.

A first light emitting stack ST1 may further include a first emission auxiliary layer SR1 disposed between a first hole transport region HTR1 and a first emission layer EML1. The first emission auxiliary layer SR1 may further include a 1-$1^{st}$ emission auxiliary layer SR1-1, a 1-$2^{nd}$ emission auxiliary layer SR1-2, and a 1-$3^{rd}$ emission auxiliary layer SR1-3, separately disposed from each other on the first hole transport region HTR1. The 1-$1^{st}$ emission auxiliary layer SR1-1 may be disposed between the first hole transport region HTR1 and a 1-$1^{st}$ emission layer EML1-1. The 1-$2^{nd}$ emission auxiliary layer SR1-2 may be disposed between the first hole transport region HTR1 and a 1-$2^{nd}$ emission layer EML1-2. The 1-$3^{rd}$ emission auxiliary layer SR1-3 may be disposed between the first hole transport region HTR1 and a 1-$3^{rd}$ emission layer EML1-3.

A second light emitting stack ST2 may further include a second emission auxiliary layer SR2 disposed between a second hole transport region HTR2 and a second emission layer EML2. The second emission auxiliary layer SR2 may further include a 2-$1^{st}$ emission auxiliary layer SR2-1, a 2-$2^{nd}$ emission auxiliary layer SR2-2, and a 2-$3^{rd}$ emission auxiliary layer SR2-3, separately disposed from each other on the second hole transport region HTR2. The 2-$1^{st}$ emission auxiliary layer SR2-1 may be disposed between a 1-$1^{st}$ hole transport region HTR1-1 and a 2-$1^{st}$ emission layer EML2-1. The 2-$2^{nd}$ emission auxiliary layer SR2-2 may be disposed between a 1-$2^{nd}$ hole transport region HTR1-2 and a 2-$2^{nd}$ emission layer EML2-2. The 2-$3^{rd}$ emission auxiliary layer SR2-3 may be disposed between a 1-$3^{rd}$ hole transport region HTR1-3 and a 2-$3^{rd}$ emission layer EML2-3.

In FIG. 7, the emission auxiliary layers SR1-1, SR1-2, SR1-3, SR2-1, SR2-2 and SR2-3 are shown to have the same thickness, but an embodiment of the present disclosure is not limited thereto. The emission auxiliary layers SR1-1, SR1-2, SR1-3, SR2-1, SR2-2 and SR2-3 may have different thicknesses.

Referring to FIG. 8, the thicknesses of multiple emission layers EML1-1, EML1-2 and EML1-3, included in a first light emitting stack ST1 may be different. For example, the thickness D2 of a 1-$2^{nd}$ emission layer EML1-2 may be greater than the thickness D1 of a 1-$1^{st}$ emission layer EML1-1, and the thickness D3 of a 1-$3^{rd}$ emission layer EML1-3 may be greater than the thickness D2 of the 1-$2^{nd}$ emission layer EML1-2. In an embodiment, the 1-$1^{st}$ emission layer EML1-1 may be a blue emission layer, the 1-$2^{nd}$ emission layer EML1-2 may be a green emission layer, and the 1-$3^{rd}$ emission layer EML1-3 may be a red emission layer.

Because the 1-$1^{st}$ emission layer EML1-1, the 1-$2^{nd}$ emission layer EML1-2, and the 1-$3^{rd}$ emission layer EML1-3 have different thicknesses, a charge generating layer CGL, a second light emitting stack ST2 and a second electrode EL2, disposed above may have steps. An n-type or kind charge generating layer n-CGL may be disposed on a first electron transport region ETR1, while having a step.

The thicknesses of the multiple emission layers EML2-1, EML2-2 and EML2-3, included in a second light emitting stack ST2 may be different from each other. For example, the thickness D5 of a 2-2$^{nd}$ emission layer EML2-2 may be greater than the thickness D4 of a 2-1$^{st}$ emission layer EML2-1, and the thickness D6 of a 2-3$^{rd}$ emission layer EML2-3 may be greater than the thickness D5 of the 2-2$^{nd}$ emission layer EML2-2. In an embodiment, the 2-1$^{st}$ emission layer EML2-1 may be a blue emission layer, the 2-2$^{nd}$ emission layer EML2-2 may be a green emission layer, and the 2-3$^{rd}$ emission layer EML2-3 may be a red emission layer.

The thickness D1 of the 1-1$^{st}$ emission layer EML1-1 and the thickness D4 of the 2-1$^{st}$ emission layer EML2-1 may be about 20 Å to about 280 Å. The thickness D2 of the 1-2$^{nd}$ emission layer EML1-2 and the thickness D5 of the 2-2$^{nd}$ emission layer EML2-2 may be about 20 Å to about 300 Å. The thickness D3 of the 1-3$^{rd}$ emission layer EML1-3 and the thickness D6 of the 2-3$^{rd}$ emission layer EML2-3 may be about 20 Å to about 550 Å.

The n-type or kind charge generating layer n-CGL may be disposed in first to third pixel areas PXA-1, PXA-2 and PXA-3, with a certain thickness. The n-type or kind charge generating layer n-CGL may be disposed on a first emission layer EML1 with a certain step. The n-type or kind charge generating layer n-CGL may have a first step corresponding to a height difference between the top surface of the n-type or kind charge generating layer n-CGL corresponding to the second pixel area PXA-2 and the top surface of the n-type or kind charge generating layer n-CGL corresponding to the first pixel area PXA-1. In some embodiments, the n-type or kind charge generating layer n-CGL may have a second step corresponding to a height difference between the top surface of the n-type or kind charge generating layer n-CGL corresponding to the third pixel area PXA-3 and the top surface of the n-type or kind charge generating layer n-CGL corresponding to the second pixel area PXA-2.

In an embodiment, at least two among a first p-type or kind charge generating layer p-CGL1, a second p-type or kind charge generating layer p-CGL2 and a third p-type or kind charge generating layer p-CGL3 may be overlapped from each other on a plane (e.g., in a plan view) defined by a first direction DR1 and a second direction DR2. For example, the first p-type or kind charge generating layer p-CGL1 may be overlapped with at least one among adjacent second p-type or kind charge generating layer p-CGL2 and third p-type or kind charge generating layer p-CGL3 on a plane. The second p-type or kind charge generating layer p-CGL2 may be overlapped with at least one among adjacent first p-type or kind charge generating layer p-CGL1 and third p-type or kind charge generating layer p-CGL3 on a plane. The third p-type or kind charge generating layer p-CGL3 may be overlapped with at least one among adjacent first p-type or kind charge generating layer p-CGL1 and second p-type or kind charge generating layer p-CGL2 on a plane.

The second p-type or kind charge generating layer p-CGL2 may be overlapped with at least a portion of the first p-type or kind charge generating layer p-CGL1 on a plane. For example, in the non-pixel area NPXA between the first pixel area PXA-1 and the second pixel area PXA-2, a portion of the first p-type or kind charge generating layer p-CGL1 and a portion of the second p-type or kind charge generating layer p-CGl2 may be overlapped on a plane.

The third p-type or kind charge generating layer p-CGL3 may be overlapped with at least a portion of the second p-type or kind charge generating layer p-CGL2 on a plane. For example, in the non-pixel area NPXA between the second pixel area PXA-2 and the third pixel area PXA-3, a portion of the second p-type or kind charge generating layer p-CGL2 and a portion of the third p-type or kind charge generating layer p-CGL3 may be overlapped on a plane.

In some embodiments, though not shown, the third p-type or kind charge generating layer p-CGL3 may be overlapped with at least a portion of the first p-type or kind charge generating layer p-CGL1 on a plane. For example, in the non-pixel area NPXA between the first pixel area PXA-1 and the third pixel area PXA-3, a portion of the first p-type or kind charge generating layer p-CGL1 and a portion of the third p-type or kind charge generating layer p-CGL3 may be overlapped on a plane.

A portion overlapping with the first p-type or kind charge generating layer p-CGL1 on a plane among the second p-type or kind charge generating layer p-CGL2, may be separately disposed from the first p-type or kind charge generating layer p-CGL1 on a cross-section that is parallel to a third direction DR3. On a plane corresponding to the non-pixel area NPXA between the first pixel area PXA-1 and the second pixel area PXA-2, a portion overlapping with the first p-type or kind charge generating layer p-CGL1 among the second p-type or kind charge generating layer p-CGL2, may be defined as a first portion. In an embodiment, the first portion of the second p-type or kind charge generating layer p-CGL2 may be separately disposed from the first p-type or kind charge generating layer p-CGL1 on a cross-section.

A portion overlapping with the second p-type or kind charge generating layer p-CGL2 on a plane among the third p-type or kind charge generating layer p-CGL3, may be separately disposed from the second p-type or kind charge generating layer p-CGL2 on a cross-section that is parallel to the third direction DR3. On a plane corresponding to the non-pixel area NPXA between the second pixel area PXA-2 and the third pixel area PXA-3, a portion overlapping with the second p-type or kind charge generating layer p-CGL2 among the third p-type or kind charge generating layer p-CGL3 may be defined as a second portion. In an embodiment, the second portion of the third p-type or kind charge generating layer p-CGL3 may be separately disposed from the second p-type or kind charge generating layer p-CGL2 on a cross-section.

Though not shown, a portion of the third p-type or kind charge generating layer p-CGL3 may be overlapped with an adjacent first p-type or kind charge generating layer p-CGL1 on a plane, and a portion overlapping with the first p-type or kind charge generating layer p-CGL1 on a plane among the third p-type or kind charge generating layer p-CGL3 may be separately disposed from the first p-type or kind charge generating layer p-CGL1 on a cross-section that is parallel to the third direction. On a plane corresponding to the non-pixel area NPXA between the first pixel area PXA-1 and the third pixel area PXA-3, a portion overlapping with the first p-type or kind charge generating layer p-CGL1 among the third p-type or kind charge generating layer p-CGL3 may be defined as a third portion. In an embodiment, the third portion of the third p-type or kind charge generating layer p-CGL3 may be separately disposed from the first p-type or kind charge generating layer p-CGL1 on a cross-section.

On a cross-section, the second p-type or kind charge generating layer p-CGL2 may be separately disposed from the first p-type or kind charge generating layer p-CGL1 with at least one among a 1-1$^{st}$ hole transport region HTR1-1 and a 1-2$^{nd}$ hole transport region HTR1-2 therebetween. For example, as shown in FIG. 8, a portion overlapping with the first p-type or kind charge generating layer p-CGL1 on a plane among the second p-type or kind charge generating layer p-CGL2 may be separately disposed from the first p-type or kind charge generating layer p-CGL1 with the 1-1$^{st}$ hole transport region HTR1-1 therebetween on a cross-section. However, an embodiment of the present disclosure is not limited thereto. According to the deposition order, a portion overlapping with the first p-type or kind charge generating layer p-CGL1 on a plane among the second p-type or kind charge generating layer p-CGL2 may be separately disposed from the first p-type or kind charge generating layer p-CGL1 with the 1-2$^{nd}$ hole transport region HTR1-2 therebetween on a cross-section.

On a cross-section, the third p-type or kind charge generating layer p-CGL3 may be separately disposed from the second p-type or kind charge generating layer p-CGL2 with at least one among the 1-2$^{nd}$ hole transport region HTR1-2 and the 1-3$^{rd}$ hole transport region HTR1-3 therebetween. For example, as shown in FIG. 8, a portion overlapping with the second p-type or kind charge generating layer p-CGL2 on a plane among the third p-type or kind charge generating layer p-CGL3 may be separately disposed from the second p-type or kind charge generating layer p-CGL2 with the 1-2$^{nd}$ hole transport region HTR1-2 therebetween on a cross-section. However, an embodiment of the present disclosure is not limited thereto. According to the deposition order, a portion overlapping with the second p-type or kind charge generating layer p-CGL2 on a plane among the third p-type or kind charge generating layer p-CGL3 may be separately disposed from the second p-type or kind charge generating layer p-CGL2 with the 1-3$^{rd}$ hole transport region HTR1-3 therebetween on a cross-section.

In some embodiments, on a cross-section, the third p-type or kind charge generating layer p-CGL3 may be separately disposed from the first p-type or kind charge generating layer p-CGL1 with at least one among the 1-1$^{st}$ hole transport region HTR1-1 and the 1-3$^{rd}$ hole transport region HTR1-3 therebetween. For example, a portion overlapping with an adjacent first p-type or kind charge generating layer p-CGL1 on a plane among the third p-type or kind charge generating layer p-CGL3 may be separately disposed from the first p-type or kind charge generating layer p-CGL1 with the 1-1$^{st}$ hole transport region HTR1-1 on a cross-section.

In order to prevent or reduce the production of the lateral leakage current between adjacent pixels due to a p-type or kind charge generating layer, a method of patterning and forming the p-type or kind charge generating layer for individual pixels utilizing a fine metal mask (FMM) may be utilized. However, when a p-type or kind charge generating layer is formed utilizing a FMM, a shadow distance where adjacent thin film patterns are deposited in overlap due to one or more suitable factors such as a deposition angle from a deposition source to the mask and the thickness of the mask, may be generated. When such a shadow distance is formed during the formation of the p-type or kind charge generating layer, overlapping portions of the p-type or kind charge generating layers may be produced, and the overlapping portion may act as a charge moving passage to generate the lateral leakage current between adjacent pixels.

In the present disclosure, as well as the p-type or kind charge generating layer, the second hole transport region disposed on the p-type or kind charge generating layer may be patterned and formed with respect to individual pixels, and though the shadow is produced due to the mask, the p-type or kind charge generating layer disposed in each pixel may be separated up and down by the patterned second hole transport region, and the generation of the lateral leakage current by the p-type or kind charge generating layer may be prevented or reduced. For example, though an overlapping portion may be formed on a plane, the first to third charge generating layers p-CGL1, p-CGL2 and p-CGL3 may be separately disposed on a cross-section, and the lateral leakage current due to the p-type or kind charge generating layer may not be produced.

Figure 9A:
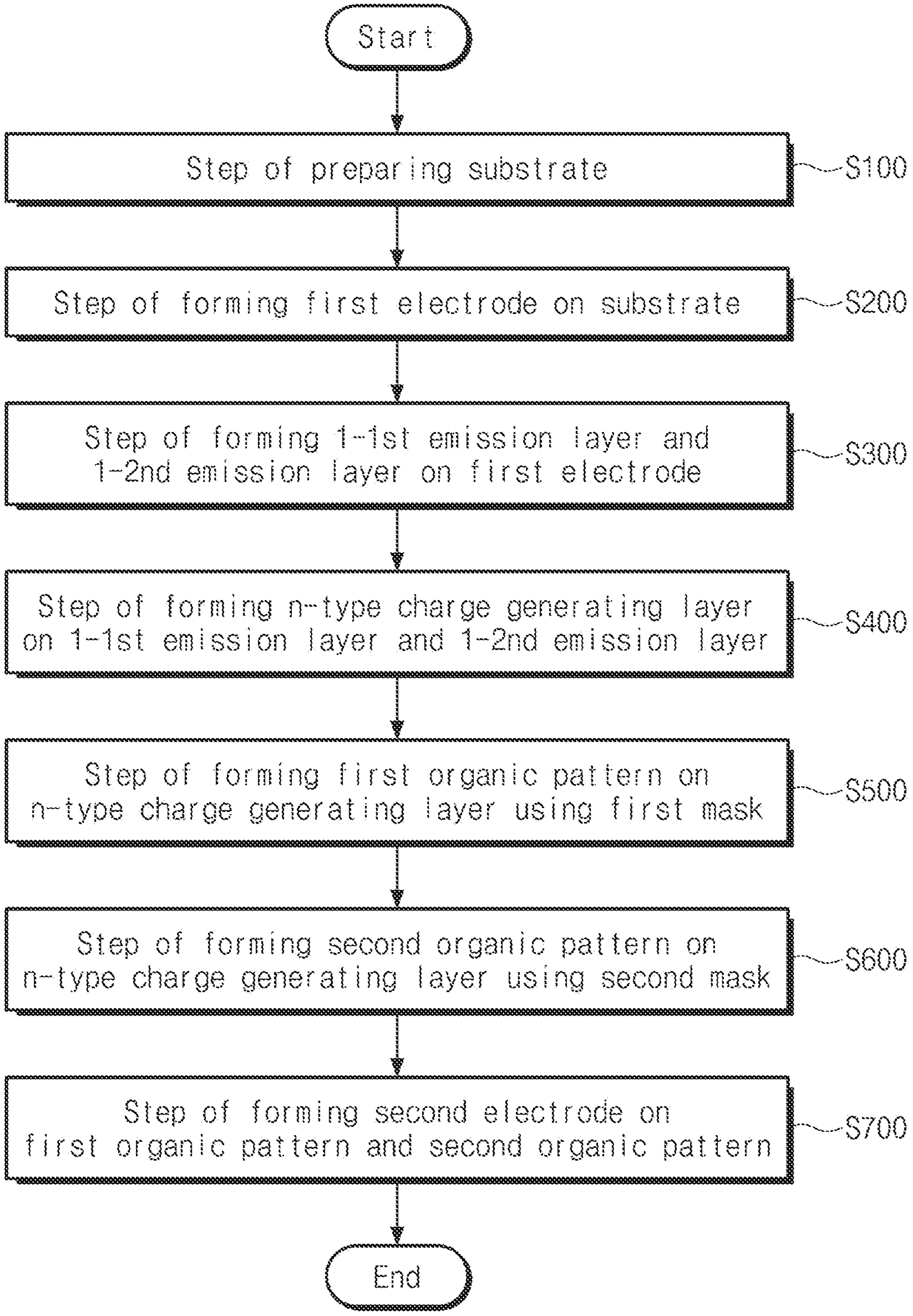
FIG. 9A is a flowchart showing a method of manufacturing a display device according to an embodiment of the present disclosure.
Figure 9B:
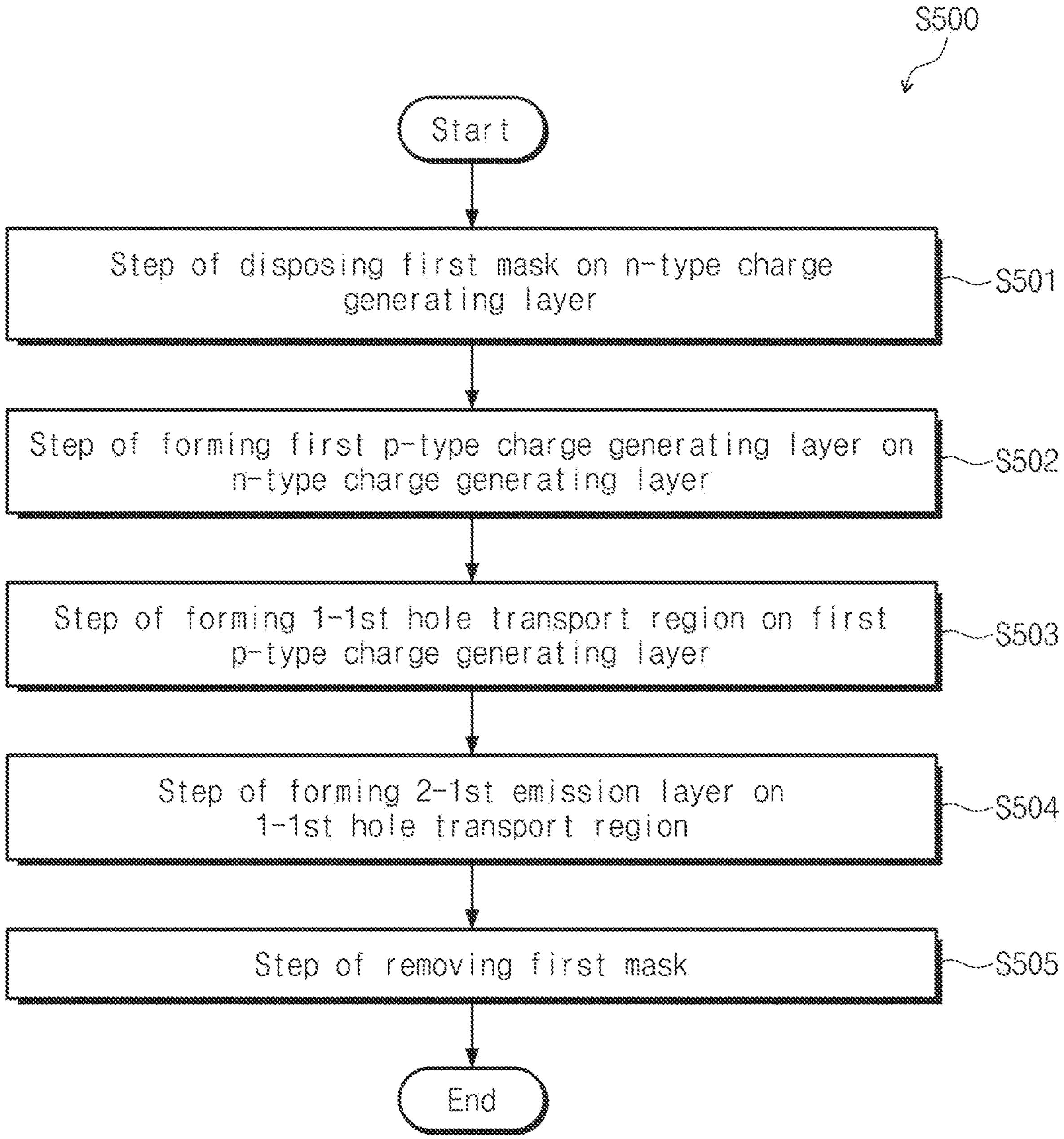
FIG. 9B is a subdivided flowchart of the step of forming a first organic pattern according to an embodiment.
Figure 9C:
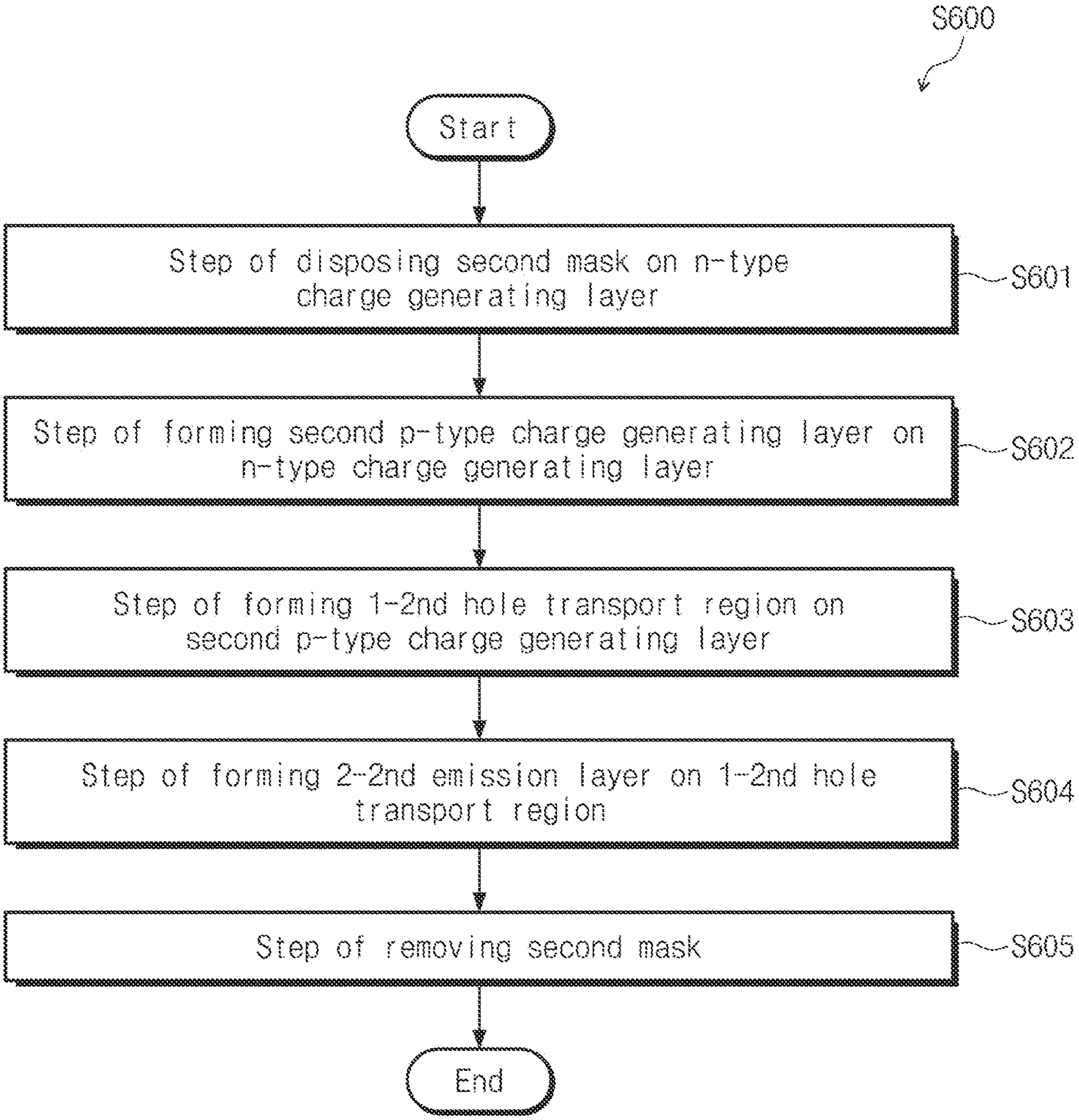
FIG. 9C is a subdivided flowchart of the step of forming a second organic pattern according to an embodiment.
Figure 10A:
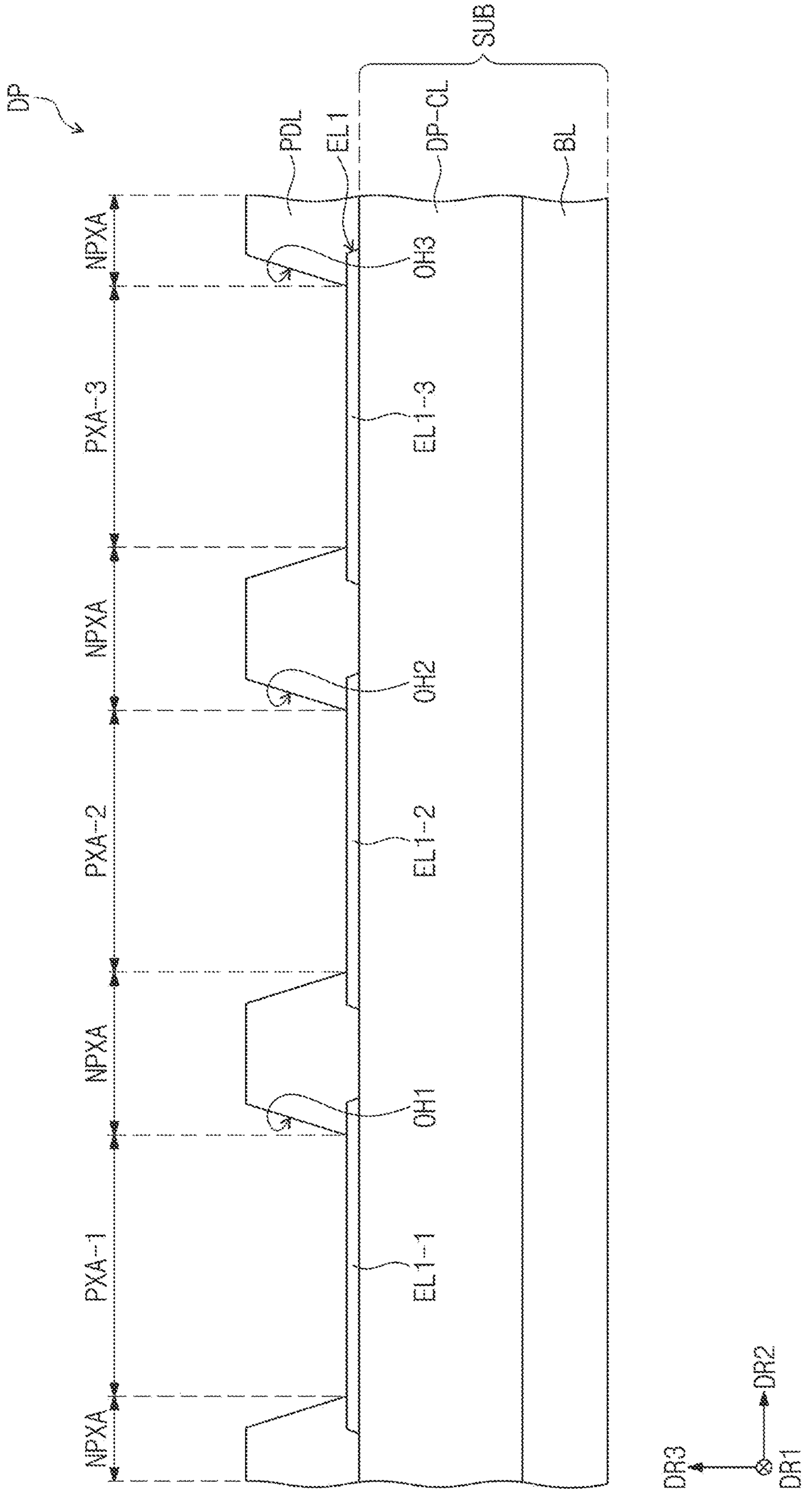
FIG. 10A-FIG. 10S are cross-sectional views illustrating some steps (e.g., tasks or acts) among a method of manufacturing a display device according to an embodiment of the present disclosure.
Figure 10B:
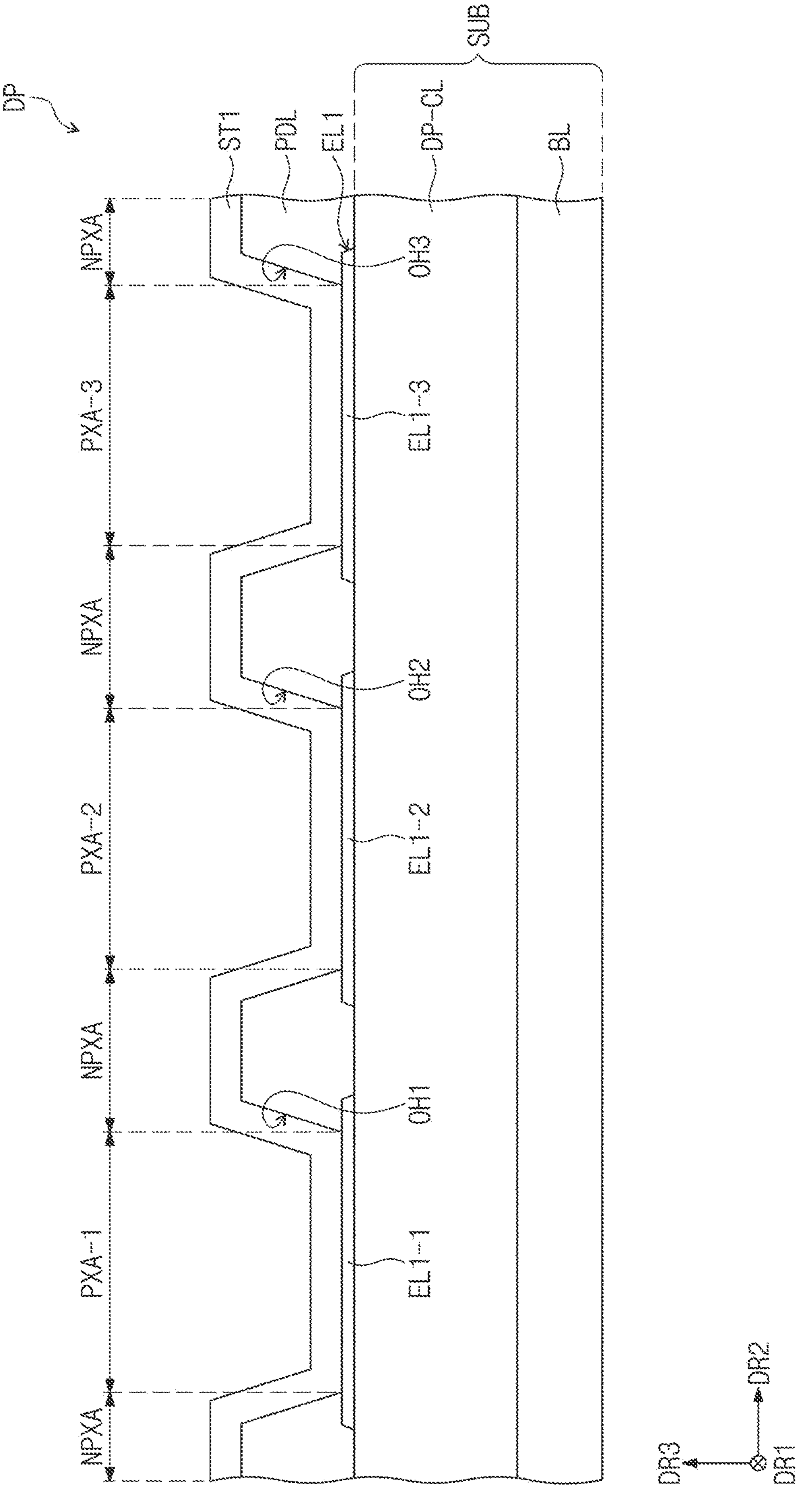

FIG. 9A is a flowchart showing a method of manufacturing a display device according to an embodiment. FIG. 9B is a subdivided flowchart of the step of forming a first organic pattern according to an embodiment. FIG. 9C is a subdivided flowchart of the step of forming a second organic pattern according to an embodiment. FIG. 10A to FIG. 10S are cross-sectional views illustrating some steps in a method of manufacturing a display device according to an embodiment of the present disclosure. Hereinafter, in the explanation on the method of manufacturing a display device according to an embodiment, referring to FIG. 9A to FIG. 9C, and FIG. 10A to FIG. 10S, the same reference symbols will be provided for the same elements as those described above, and detailed explanation thereon will not be provided.

Referring to FIG. 9A, a method of manufacturing a display device of an embodiment may include a step of preparing a substrate (S100), a step of forming a first electrode on the substrate (S200), a step of forming a 1-1$^{st}$ emission layer and a 1-2$^{nd}$ emission layer on the first electrode (S300), a step of forming an n-type or kind charge generating layer on the 1-1$^{st}$ emission layer and the 1-2$^{nd}$ emission layer (S400), a step of forming a first organic pattern on the n-type or kind charge generating layer utilizing a first mask (S500), a step of forming a second organic pattern on the n-type or kind charge generating layer utilizing a second mask (S600), and a step of forming a second electrode on the first organic pattern and the second organic pattern (S700).

Referring to FIG. 9B, the step of forming the first organic pattern of an embodiment (S500) may include a step of disposing a first mask on an n-type or kind charge generating layer (S501), a step of forming a first p-type or kind charge generating layer on the n-type or kind charge generating layer (S502), a step of forming a 1-1$^{st}$ hole transport region on the first p-type or kind charge generating layer (S503), a step of forming a 2-1$^{st}$ emission layer on the 1-1$^{st}$ hole transport region (S504), and a step of removing the first mask (8505).

Referring to FIG. 9C, the step of forming the second organic pattern of an embodiment (S600) may include a step of disposing a second mask on an n-type or kind charge generating layer (S601), a step of forming a second p-type or kind charge generating layer on the n-type or kind charge generating layer (S602), a step of forming a 1-2$^{nd}$ hole transport region on the second p-type or kind charge generating layer (S603), a step of forming a 2-2$^{nd}$ emission layer on the 1-2$^{nd}$ hole transport region, and a step of removing the second mask (S605).

Referring to FIG. 10A, the method of manufacturing the display device of an embodiment may include a step (e.g., a task or act) of preparing a substrate (S100). A substrate SUB may provide a base surface on which multiple light emitting elements are formed. In an embodiment, the substrate SUB may be a display panel substrate during a manufacturing process. For example, the substrate SUB may be an incomplete display panel substrate, and may be a display panel substrate of an intermediate step, on which a circuit layer DP-CL is formed on a base layer BL.

Referring to FIG. 10A, on the substrate SUB, multiple pixel areas PXA-1, PXA-2 and PXA-3, and a non-pixel area NPXA around (e.g., surrounding) the multiple pixel areas may be defined. On the substrate SUB, separately defined first pixel area PXA-1, second pixel area PXA-2, and third pixel area PXA-3, and a non-pixel area NPXA around (e.g., surrounding) them, may be defined.

The pixel areas PXA-1, PXA-2 and PXA-3 may be areas emitting light produced from the light emitting elements ED1, ED2 and ED3, respectively (FIG. 4 to FIG. 8). The first pixel area PXA-1 may be an area emitting light produced in the first light emitting element ED1 (FIG. 4 to FIG. 8). The second pixel area PXA-2 may be an area emitting light produced in the second light emitting element ED2 (FIG. 4 to FIG. 8). The third pixel area PXA-3 may be an area emitting light produced in the third light emitting element ED3 (FIG. 6 to FIG. 8).

On the substrate SUB, a first electrode EL1 may be formed. In the step of forming the first electrode EL1 on the substrate SUB, sub-electrodes EL1-1, EL1-2 and EL1-3 overlapping with the pixel areas PXA-1, PXA-2, and PXA-3, respectively, may be formed. For example, in the step of forming the first electrode EL1, a first sub-electrode EL1-1 overlapping with the first pixel area PXA-1 may be formed, a second sub-electrode EL1-2 overlapping with the second pixel area PXA-2 may be formed, and a third sub-electrode EL1-3 overlapping with the third pixel area PXA-3 may be formed.

On a portion of the sub-electrodes EL1-1, EL1-2, and EL1-3, and the substrate SUB, a pixel definition layer PDL may be formed. In the pixel definition layer PDL, pixel opening parts OH1, OH2 and OH3 corresponding to the light emitting elements PXA-1, PXA-2, and PXA-3, respectively, may be defined. The pixel definition layer PDL may be correspondingly disposed to the non-pixel area NPXA. The first pixel opening part OH1 may be formed to overlap with the first pixel area PXA-1, and in the first pixel opening part OH1, the first light emitting element ED1 may be disposed. The second pixel opening part OH2 may be formed to overlap with the second pixel area PXA-2, and in the second pixel opening part OH2, the second light emitting element ED2 may be disposed. The third pixel opening part OH3 may be formed to overlap with the third pixel area PXA-3, and in the third pixel opening part OH3, the third light emitting element ED3 may be disposed.

The pixel definition layer PDL may be formed utilizing a polymer resin. For example, the pixel definition layer PDL may be formed by including a polyacrylate-based resin or a polyimide-based resin. In some embodiments, the pixel definition layer PDL may be formed by further including an inorganic material in addition to the polymer resin. In some embodiments, the pixel definition layer PDL may be formed by including a light-absorbing material, or may be formed by including a black pigment or a black dye. The pixel definition layer PDL formed by including a black pigment or a black dye may accomplish a black pixel definition layer. As the black pigment or black dye during forming the pixel definition layer PDL may utilize carbon black, but an embodiment of the present disclosure is not limited thereto.

In some embodiments, the pixel definition layer PDL may be formed utilizing an inorganic material. For example, the pixel definition layer PDL may be formed by including silicon nitride ($SiN_x$), silicon oxide ($SiO_x$), silicon oxynitride ($SiO_xN_y$), etc.

Referring to FIG. 4 to FIG. 8, and FIG. 10B, a first light emitting stack ST1 may be formed on the first electrode EL1. A first hole transport region HTR1, a first emission layer EML1, and a first electron transport region ETR1, included in the first light emitting stack ST1 may be formed in common in multiple pixels utilizing an open mask. However, an embodiment of the present disclosure is not limited thereto. At least one among the first hole transport region HTR1, the first emission layer EML1, and the first electron transport region ETR1 may be patterned and formed through a mask. For example, the first emission layer EML may be disposed in an area corresponding to the pixel opening parts OH1, OH2 and OH3. For example, the first emission layer EML1 may be separately formed for individual pixels. For example, on the first hole transport region HTR1, a 1-1$^{st}$ emission layer EML1-1 may be formed in the first pixel opening part OH1, a 1-2$^{nd}$ emission layer EML1-2 may be formed in the second pixel opening part PH2, and a 1-3$^{rd}$ emission layer EML1-3 may be formed in the third pixel opening part OH3.

Figure 10C:
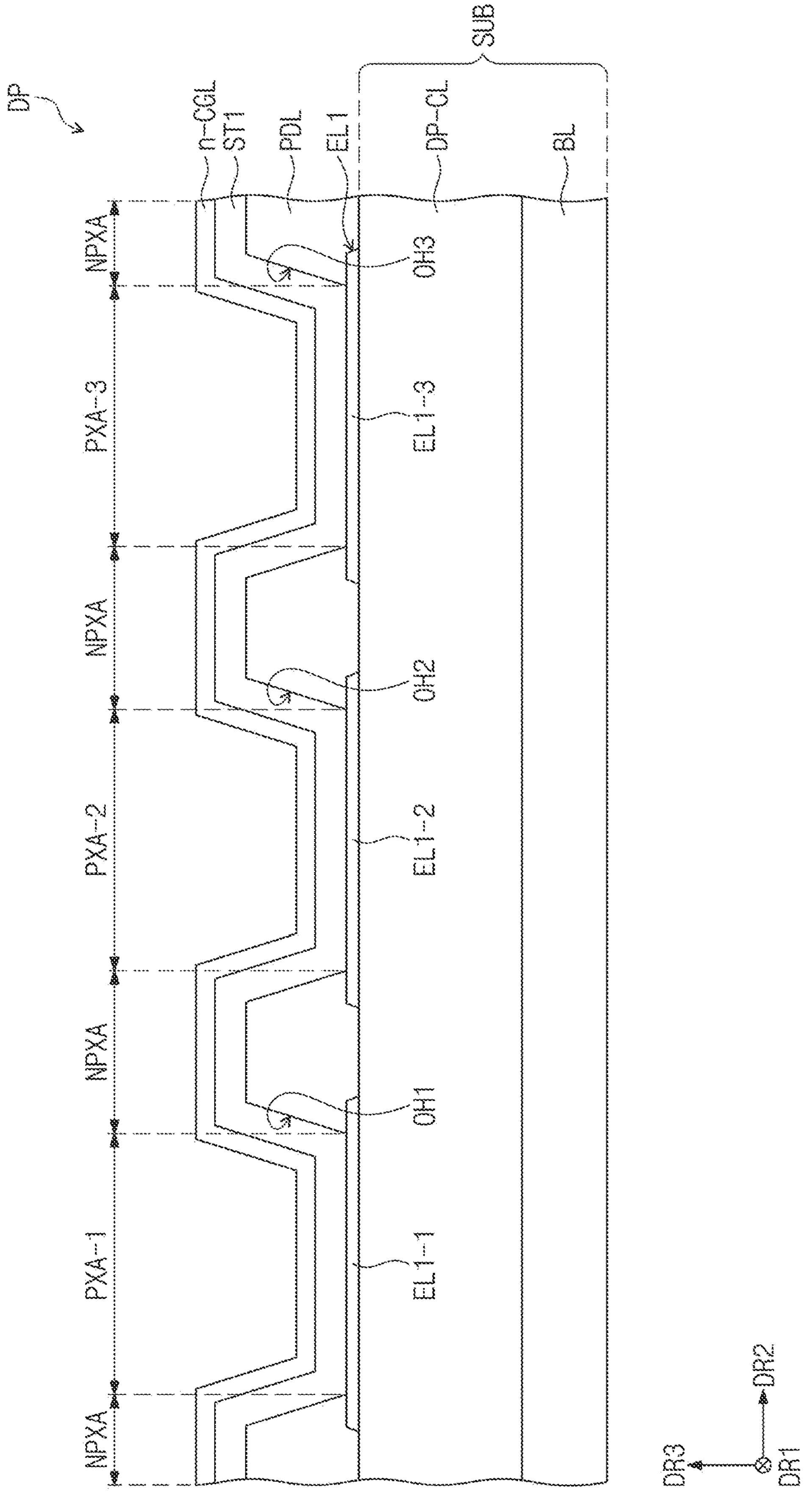

Referring to FIG. 10C, on the first light emitting stack ST1, an n-type or kind charge generating layer n-CGL may be formed. The n-type or kind charge generating layer n-CGL may be formed in common in multiple pixels utilizing an open mask. For example, the n-type or kind charge generating layer n-CGL may be formed as a common layer utilizing an open mask in which opening parts overlapping with the pixel areas PXA-1, PXA-2 and PXA-3 are defined. The n-type or kind charge generating layer n-CGL may be disposed in common in the pixel areas PXA-1, PXA-2 and PXA-3, and the non-pixel area NPXA. A portion of the n-type or kind charge generating layer n-CGL may be disposed on the pixel definition layer PDL.

In the method of manufacturing the display device according to an embodiment, a step of forming a first organic pattern and a second organic pattern may be performed after the step of forming the n-type or kind charge generating layer n-CGL. In an embodiment, the step of forming the first organic pattern (S500) and the step of forming the second organic pattern (S600) may be performed in order (e.g., sequentially).

Hereinafter, referring to FIG. 10D to FIG. 10N, the step of forming the first organic pattern and the step of forming the second organic pattern according to an embodiment will be explained.

Figure 10D:
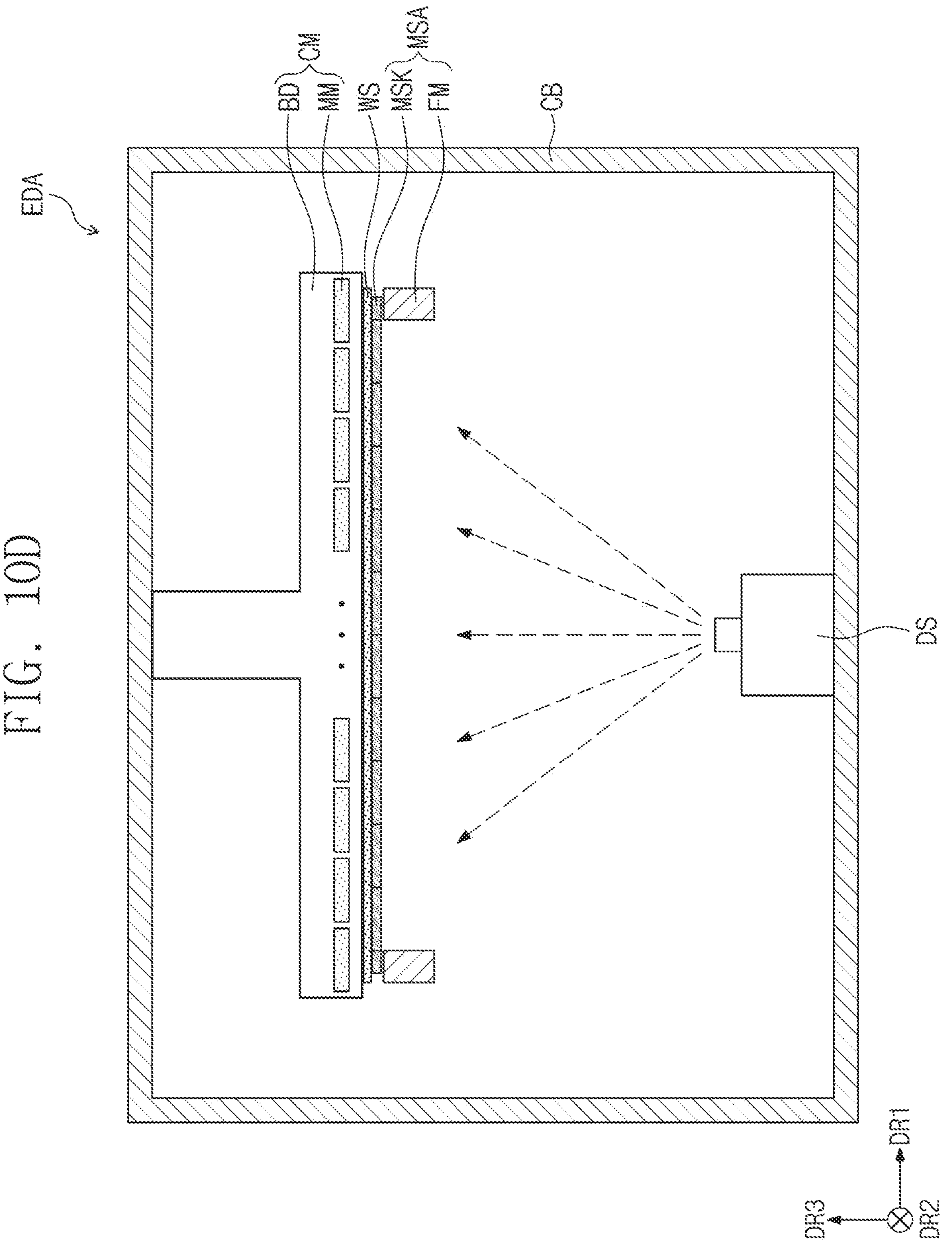
Figure 10E:
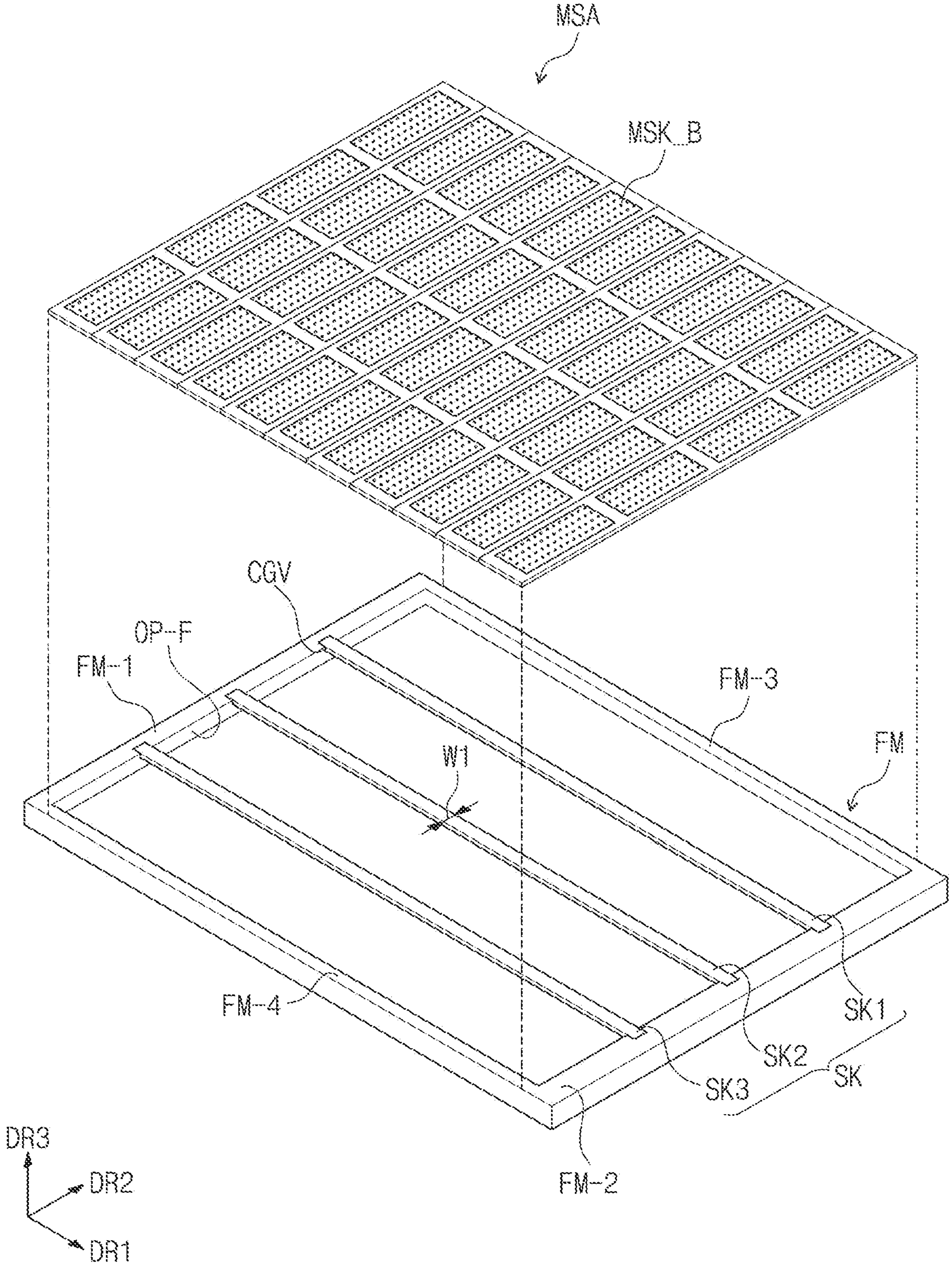
Figure 10F:
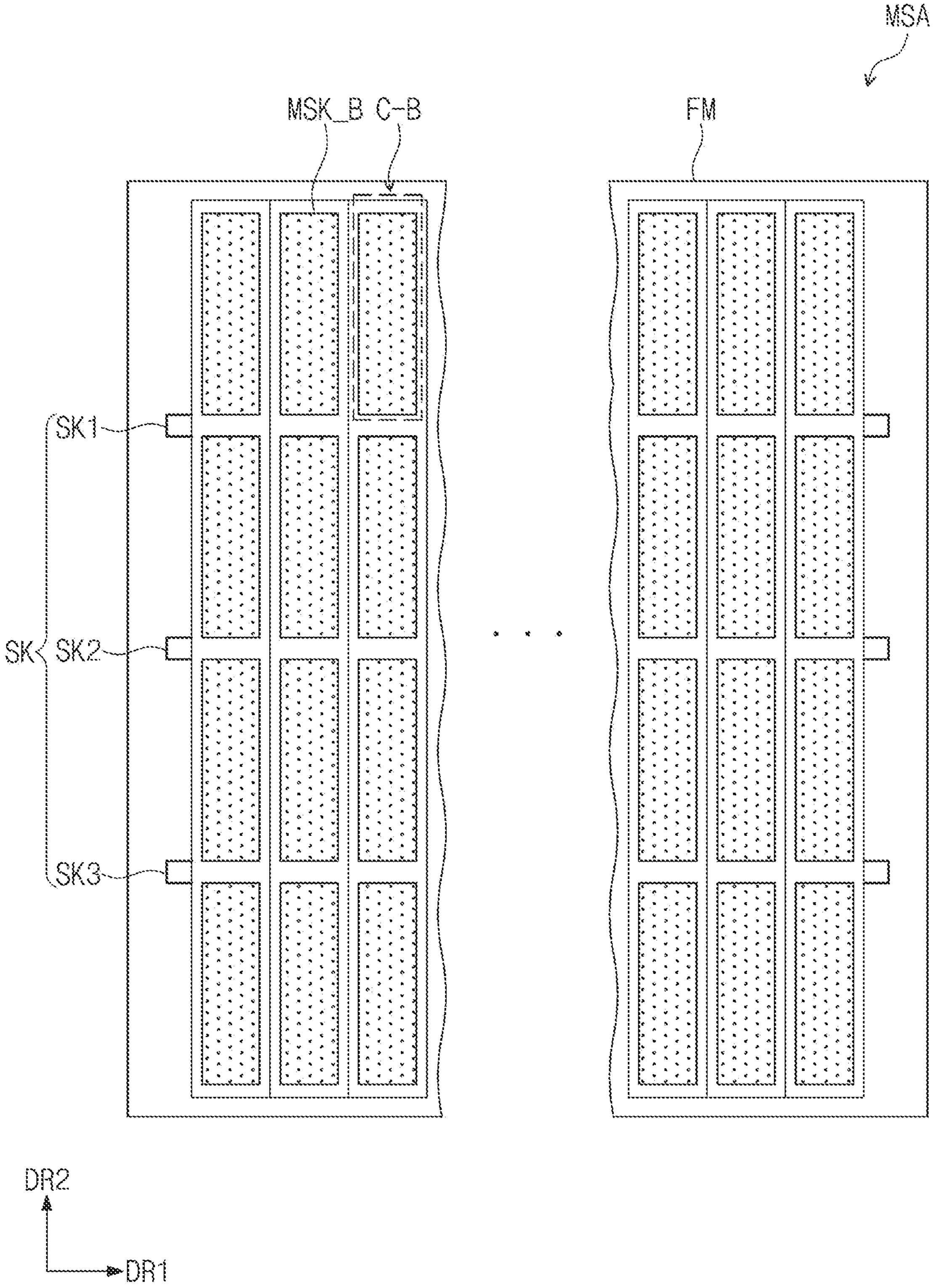
Figure 10G:
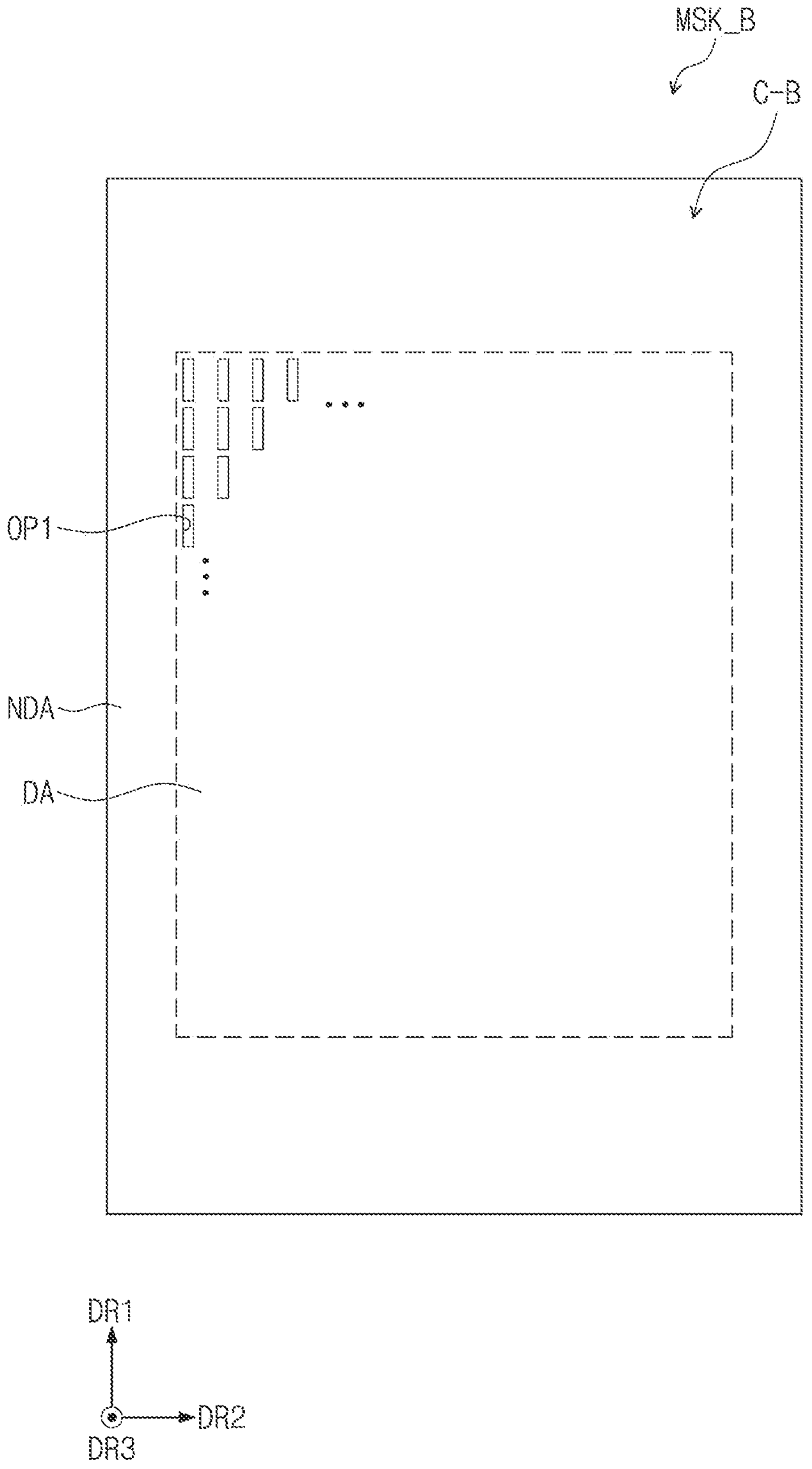
Figure 10H:
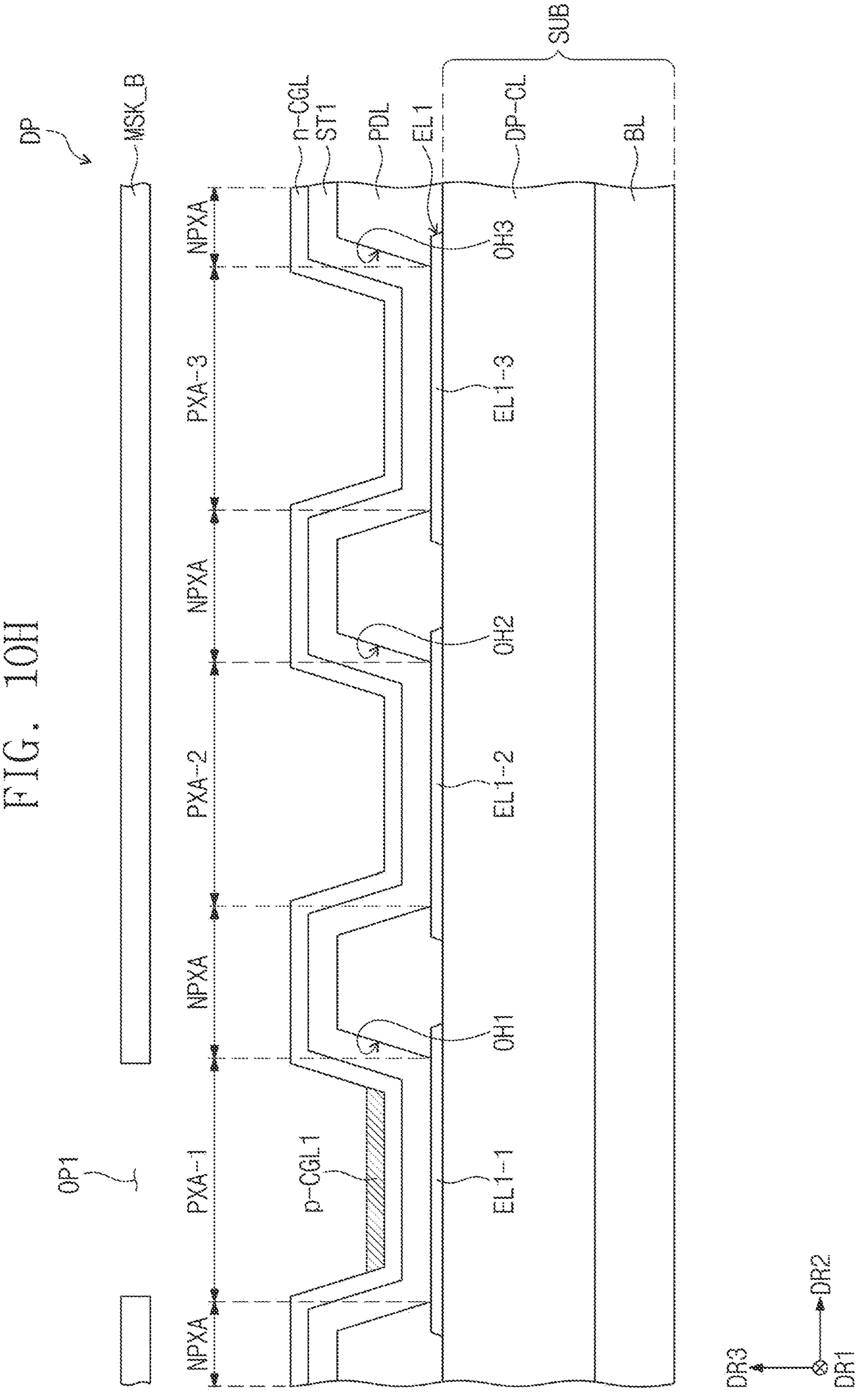
Figure 10I:
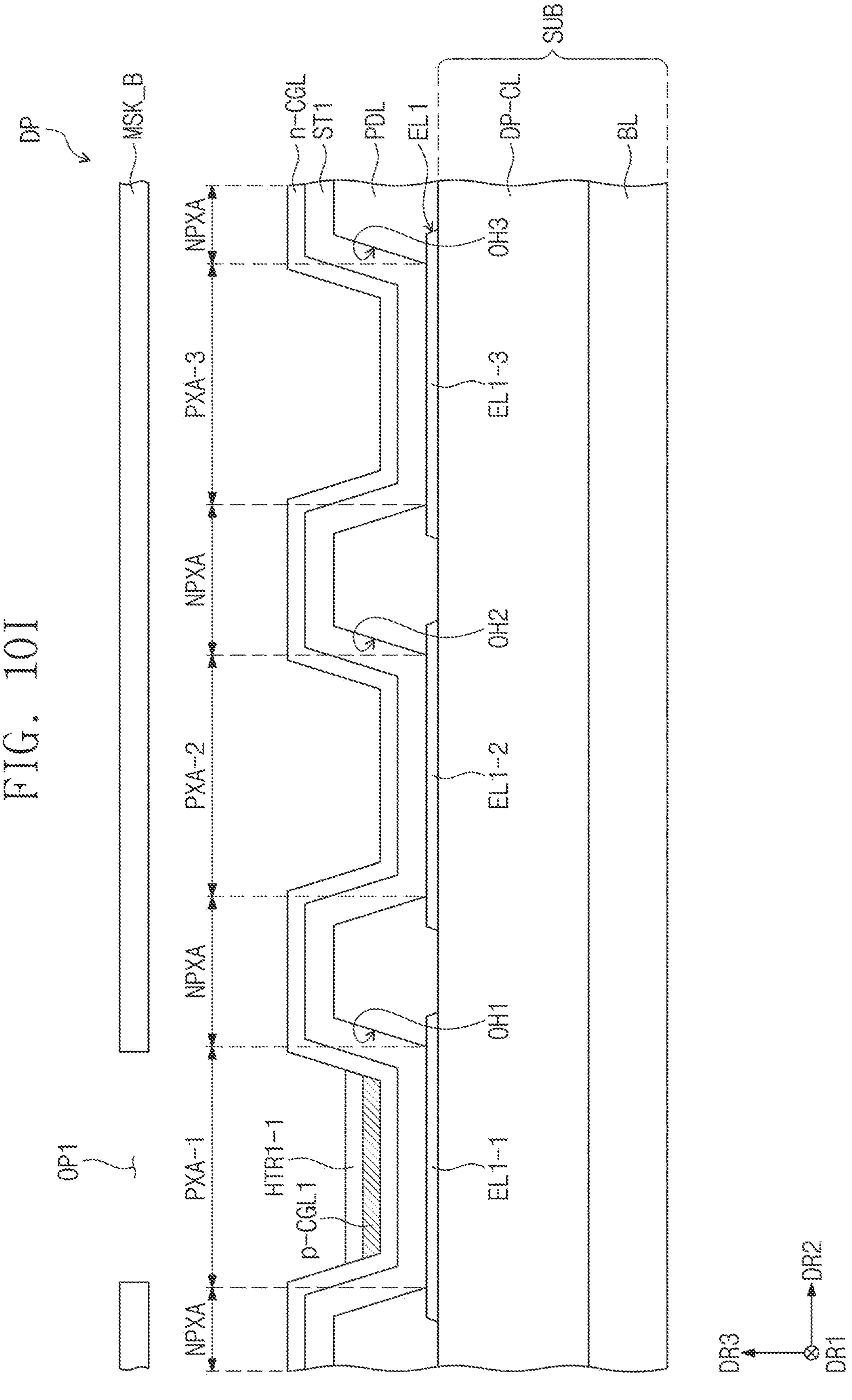
Figure 10J:
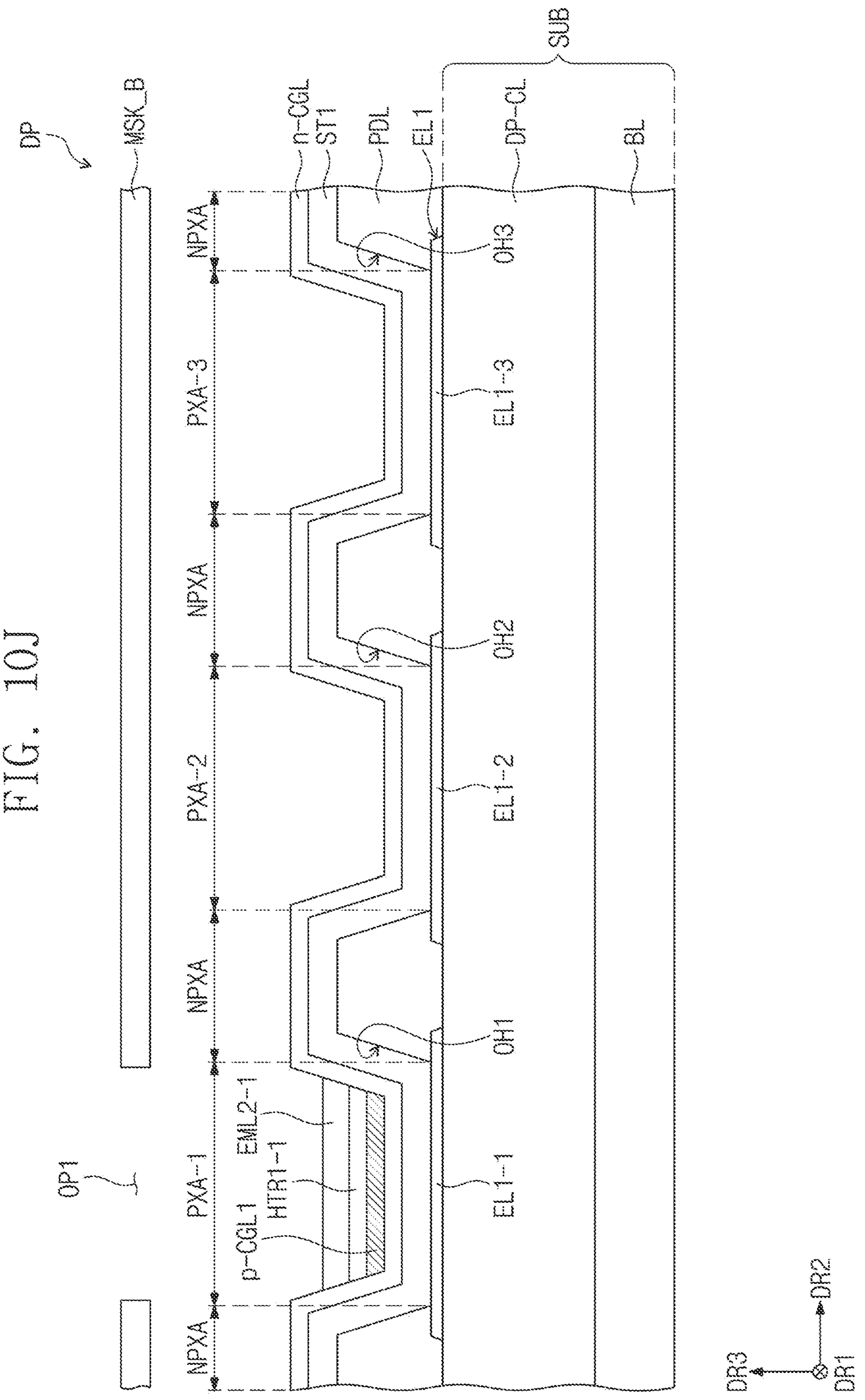

FIG. 10D is a cross-sectional view of a deposition apparatus EDA according to an embodiment of the present disclosure. FIG. 10E is an exploded perspective view of a mask assembly MSA of FIG. 10D. FIG. 10F is a plan view of the mask assembly MSA of FIG. 10D. In FIG. 10E and FIG. 1 OF, the first mask utilized for forming the first organic pattern of the first light emitting element (FIG. 4 to FIG. 8) is shown as an illustration. FIG. 10G is an enlarged plan view of a cell area C-B of the first mask MSK_B according to an embodiment of the present disclosure. FIG. 10H is a diagram showing a step of forming a first p-type or kind charge generating layer p-CGL1 on the n-type or kind charge generating layer n-CGL, FIG. 10I is a diagram showing a step of forming a 1-1$^{st}$ hole transport region HTR1-1 on the first p-type or kind charge generating layer p-CGL1, and FIG. 10J is a diagram showing a step of forming a 2-1$^{st}$ emission layer EML2-1 on the 1-1$^{st}$ hole transport region HTR1-1.

Referring to FIG. 10D, the deposition apparatus EDA according to an embodiment includes a deposition chamber CB, a fixing member CM, a deposition source DS in the deposition chamber CB, and a mask assembly MSA disposed in the deposition chamber CB. In some embodiments, the deposition apparatus EDA may further include an additional mechanical equipment for accomplishing an in-line system.

The deposition chamber CB may set the deposition conditions to vacuum. The deposition chamber CB may include a floor surface, a ceiling surface and side walls. The floor surface of the deposition chamber CB is parallel to a surface defined by the first direction DR1 and the second direction DR2. The normal direction of the floor surface of the deposition chamber CB is indicated by the third direction DR3.

The fixing member CM is disposed in the deposition chamber CB, is disposed on the deposition source DS, and fixes the mask assembly MSA. The fixing member CM may be installed on the ceiling surface of the deposition chamber CB. The fixing member CM may include a zig or a robot arm, holding the mask assembly MSA.

The fixing member CM includes a body part BD and magnetic materials MM combined with the body part BD. The body part BD is a basic structure for fixing the mask assembly MSA and may include a plate, without limitation. The magnetic materials MM may be disposed inside or outside of the body part BD. The magnetic materials MM may fix the mask assembly MSA by magnetic force.

The deposition source DS may evaporate a deposition material, for example, a light emitting material as a deposition vapor to spout as a deposition vapor. The corresponding deposition vapor may pass through the mask assembly MSA to be deposited on a working substrate WS as a certain pattern. The working substrate WS is defined as a substrate of an intermediate step for manufacturing a display panel DP.

The mask assembly MSA may be disposed in the deposition chamber CB, be disposed on the deposition source DS and support the working substrate WS. The working substrate WS may include a glass substrate or a plastic substrate. The working substrate WS may include a polymer layer disposed on the base substrate.

The mask assembly MSA may include a frame FM, multiple sticks SK and multiple masks MSK. In this embodiment, a mask assembly MSA including one type or kind of sticks SK extended in substantially the same direction is shown, but in an embodiment of the present disclosure, the mask assembly MSA may further include other types (kinds) of sticks extended in another direction.

Referring to FIG. 10E, in the frame FM, a mask opening part OP-F is defined. The frame FM may have a rectangular shape on a plane. The frame FM may have a first length in the first direction DR1 and a second length in the second direction DR2, which is different from the first length. In this embodiment, the first length is greater than the second length.

Referring to FIG. 10E and FIG. 10F, the frame FM may be composed of a metal material as a raw material. For example, the frame FM may include an invar having a relatively small coefficient of thermal expansion. The frame FM may include, for example, nickel (Ni), a nickel-cobalt alloy, a nickel-iron alloy, etc. The frame FM may include four parts. The frame FM may include a first extended part FM-1 and a second extended part FM-2 opposing thereto in the first direction DR1. The frame FM may include a third extended part FM-3 and a fourth extended part FM-4, opposing in the second direction DR2 and connecting the first extended part FM-1 and the second extended part FM-2. The first extended part FM-1 to the fourth extended part FM-4 may be combined by welding, etc., or may have the shape of one body.

In the frame FM, multiple combination grooves may be defined. For example, in each of the first extended part FM-1 and the second extended part FM-2, combination grooves CGV with which the sticks SK are combined, may be defined. The sticks SK may be combined with the frame FM to overlap with the mask opening part OP-F. Both side parts of the sticks SK are combined with the combination grooves CGV.

The mask MSK may be disposed on the frame FM, and a first mask MSK_B may be utilized as the mask MSK. The first mask MSK_B may be disposed on the frame FM and the sticks SK, extended in the second direction DR2 and arranged in the first direction DR1. The first mask MSK_B may include an invar having a small coefficient of thermal expansion as a raw material. The first mask MSK_B may include, for example, nickel (Ni), a nickel-cobalt alloy, a nickel-iron alloy, etc. Each of the first masks MSK_B may include multiple unit cells C-B extended in the second direction.

The first mask MSK_B may be combined with the frame FM by welding. During manufacturing the mask assembly MSA, the first mask MSK_B is welded on the frame FM in an extended state of the first mask MSK_B in the second direction DR2.

The sticks SK may be extended in the first direction DR1 and may be arranged in the second direction DR2. The sticks SK have weak bonding force with respect to the magnetic materials MM in contrast to the frame FM and/or the first mask MSK_B. The sticks SK may include a material not reacting to a magnetic force, for example, stainless steel.

In FIG. 10E, three sticks SK1, SK2 and SK3 are shown as an illustration. The shape of the sticks SK may be linear to reduce the thermal deformation of the mask assembly MSA. The width W1 of the second direction DR2 of an area of the sticks SK overlapping with the mask opening part OP-F may have a constant value. Such shape may minimize or reduce the thermal deformation of the sticks SK and control the deformation of the sticks SK to generate substantially uniform deformation irrespective of areas. As a result, the deformation of the sticks SK may be suppressed or reduced, and the deformation of the frame FM may also be suppressed or reduced.

The mask assembly MSA according to this embodiment may be utilized in the deposition process of a working substrate WS.

The mask assembly MSA explained in FIG. 10E and FIG. 10F has been explained to include the first mask MSK_B of FIG. 10G. A mask assembly MSA in which the first mask MSK_B shown in FIG. 10G is changed into the second and third masks MSK_G and MSK_R of FIG. 10K or FIG. 10O, may be utilized for the manufacture of the second and third light emitting elements ED2 and ED3 (FIG. 4 to FIG. 8). For example, the mask assembly MSA including the second mask MSK_G shown in FIG. 10K may be utilized for the formation of the second organic pattern of the second light emitting element ED2 (FIG. 4 to FIG. 8). The mask assembly MSA including the third mask MSK_R shown in FIG. 10O may be utilized for the formation of the third organic pattern of the third light emitting element ED3 (FIG. 6 to FIG. 8).

Referring to FIG. 10G to FIG. 10S, the first to third masks MSK_B, MSK_G and MSK_R may be utilized for forming the first to third organic patterns, respectively. For example, the first mask MSK_B may be utilized for forming the first organic pattern, the second mask MSK_G may be utilized for forming the second organic pattern, and the third mask MSK_R may be utilized for forming the third organic pattern. In some embodiments, in the description, the first organic pattern may refer to the first p-type or kind charge generating layer p-CGL1, the 1-1$^{st}$ hole transport region HTR1-1, and the 2-1$^{st}$ emission layer EML2-1, correspondingly disposed to the first pixel area PXA-1. In some embodiments, the second organic pattern may refer to the second p-type or kind charge generating layer p-CGL2, the 1-2$^{nd}$ hole transport region HTR1-2, and the 2-2$^{nd}$ emission layer EML2-2, correspondingly disposed to the second pixel area PXA-2. In some embodiments, the third organic pattern may refer to the third p-type or kind charge generating layer p-CGL3, the 1-3$^{rd}$ hole transport region HTR1-3, and the 2-3$^{rd}$ emission layer EML2-3, correspondingly disposed to the third pixel area PXA-3.

Each of the first to third masks MSK_B, MSK_G and MSK_R may include multiple opening parts OP1, OP2 and OP3, corresponding to multiple pixel areas PXA-1, PXA-2 and PXA-3. For example, the first mask MSK_B may include the first opening parts OP1 corresponding to the first pixel area PXA-1, the second mask MSK_G may include the second opening parts OP2 corresponding to second first pixel area PXA-2, and the third mask MSK_R may include the third opening parts OP3 corresponding to the third pixel area PXA-3.

Referring to FIG. 10G to FIG. 10J, the step of forming the first organic pattern on the n-type or kind charge generating layer n-CGL may be performed. The first organic pattern may be formed utilizing the first mask MSK_B. The first opening parts OP1 may be defined in the first unit cell C-B of the first mask MSK_B.

The first mask MSK_B may be utilized for depositing the first p-type or kind charge generating layer p-CGL1, the 1-1$^{st}$ hole transport region HTR1-1, and the 2-1$^{st}$ t emission layer EML2-1, constituting the first light emitting element ED1 of FIG. 4 to FIG. 8 on the working substrate WS of FIG. 10D. The first unit cell C-B of the first mask MSK_B may include a display area DA and a non-display area NDA adjacent to the display area DA. The display area DA of the first unit cell C-B may be an area corresponding to the display area DP-DA of the display module DM shown in FIG. 2. The non-display area NDA of the first unit cell C-B may be an area corresponding to the non-display area DP-NDA of the display module DM shown in FIG. 2. In the display area DA of the first unit cell C-B, multiple first opening parts OP1 may be defined. The first opening parts OP1 may be separately disposed from each other in the display area DA of the first unit cell C-B.

In some embodiments, the display area DA and the non-display area NDA of the first unit cell C-B shown in FIG. 10G are defined only for comparing the area where the first opening parts OP1 are formed with the area of the display area DP-DA of FIG. 2, and the display area DA and the non-display are NDA of the first unit cell C-B in the first mask MSK_B are not distinguished in appearance or structure.

In some embodiments, in FIG. 10G, the first opening parts OP1 have a thin rectangular hole shape and separately arranged with the same gap on a plane, but an embodiment of the present disclosure is not limited thereto. The gap arranged and shape of the first openings OP1 may be changed according to the pixel and image quality required for the desired or suitable display panel DP.

Referring to FIG. 10H to FIG. 10J, the first p-type or kind charge generating layer p-CGL1, the 1-1$^{st}$ hole transport region HTR1-1, and the 2-1$^{st}$ emission layer EML2-1 may be formed on the n-type or kind charge generating layer n-CGL in order (e.g., sequentially). All the first p-type or kind charge generating layer p-CGL1, the 1-1$^{st}$ hole transport region HTR1-1, and the 2-1$^{st}$ emission layer EML2-1 may be formed utilizing the first mask MSK_B.

Referring to FIG. 10H, on the substrate SUB on which the n-type or kind charge generating layer n-CGL is formed, the first mask MSK_B may be disposed. By utilizing the first mask MSK_B, the first p-type or kind charge generating layer p-CGL1 may be formed on the n-type or kind charge generating layer n-CGL. In the first mask MSK_B, the first opening parts OP1 corresponding to the first pixel area PXA-1 may be defined, and the first p-type or kind charge generating layer p-CGL1 may be patterned and formed only in an area corresponding to the first pixel opening part OH1.

Referring to FIG. 10I, the step of forming the 1-1$^{st}$ hole transport region HTR1-1 on the first p-type or kind charge generating layer p-CGL1 may be performed. By utilizing the first mask MSK_B, the 1-1$^{st}$ hole transport region HTR1-1 may be formed on the first p-type or kind charge generating layer p-CGL1. The mask utilized for forming the 1-1$^{st}$ hole transport region HTR1-1 may be the same as the first mask MSK_B shown in FIG. 10H. Accordingly, the 1-1$^{st}$ hole transport region HTR1-1 may be patterned and formed only in an area corresponding to the first pixel opening part OH1.

Referring to FIG. 10J, the step of forming the 2-1$^{st}$ emission layer EML2-1 on the 1-1$^{st}$ hole transport region HTR1-1 may be performed. By utilizing the first mask MSK_B, the 2-1$^{st}$ emission layer EML2-1 may be formed on the 1-1$^{st}$ hole transport region HTR1-1. The mask utilized for forming the 2-1$^{st}$ emission layer EML2-1 may be the same as the mask utilized for forming the first p-type or kind charge generating layer p-CGL1 and the 1-1$^{st}$ hole transport region HTR1-1. Accordingly, the 2-1$^{st}$ emission layer EML2-1 may be patterned and formed only in an area corresponding to the first pixel opening part OH1.

The first mask MSK_B may be utilized for forming the first p-type or kind charge generating layer p-CGL, the 1-1$^{st}$ hole transport region HTR1-1 and the 2-1$^{st}$ t emission layer EML2-1. After disposing the first mask MSK_B on the n-type or kind charge generating layer n-CGL, a first material for forming the first p-type or kind charge generating layer p-CGL1, a second material for forming the 1-1$^{st}$ hole transport region HTR1-1, and a third material for forming the 2-1$^{st}$ emission layer EML2-1 may be deposited in order (e.g., sequentially). Each of the first material, second material and third material passed through the first opening parts OP1 of the first mask MSK_B may constitute the first p-type or kind charge generating layer p-CGL1, the 1-1$^{st}$ hole transport region HTR1-1, and the 2-1$^{st}$ emission layer EML2-1 of the first light emitting element ED1 (FIG. 4 to FIG. 8).

In some embodiments, after the step of forming the 2-1$^{st}$ emission layer EML2-1, a step of removing the first mask MSK_B may be performed, and a second mask MSK_G (FIG. 10K to FIG. 10N) for forming the second organic pattern may be disposed on the substrate SUB.

Referring to FIG. 10K to FIG. 10N, a step of forming the second organic pattern on the n-type or kind charge generating layer n-CGL may be performed after the step of forming the first organic pattern on the n-type or kind charge generating layer n-CGL. The second organic pattern may be formed utilizing the second mask MSK_G. In the second unit cell C-G of the second mask MSK_G, second opening parts OP2 may be defined.

Figure 10K:
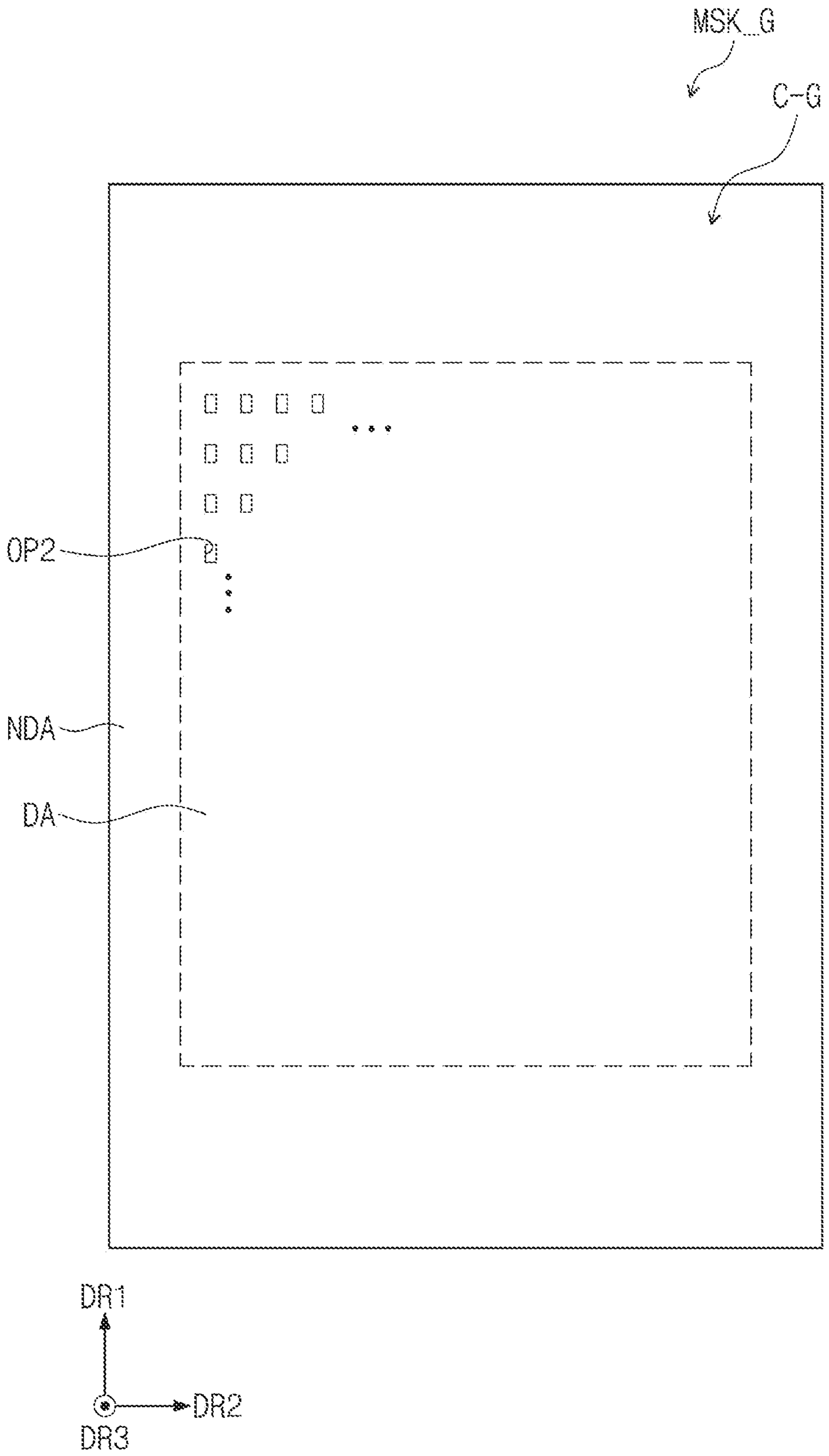
Figure 10L:
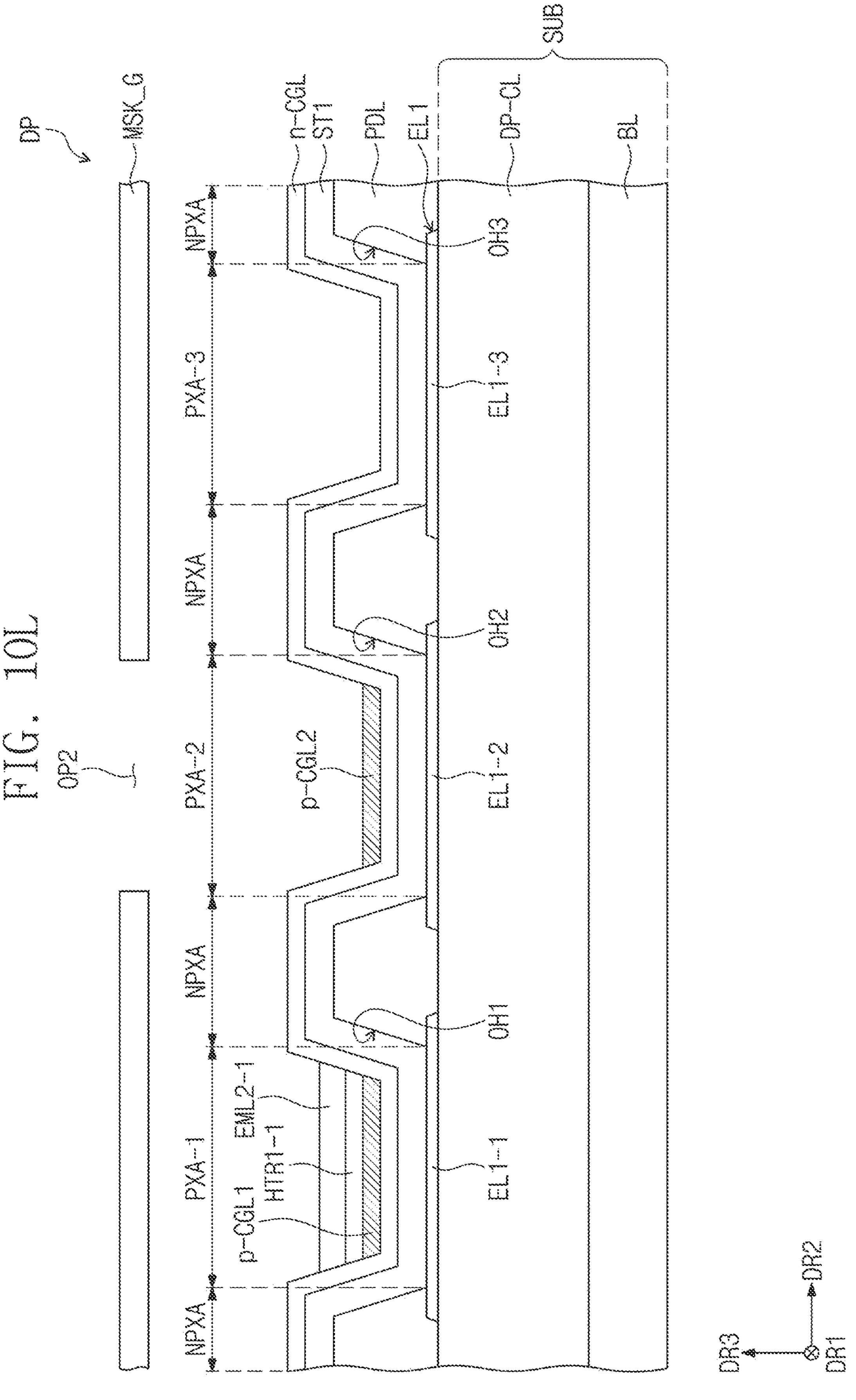

The second mask MSK_G shown in FIG. 10K may be utilized for depositing the second p-type or kind charge generating layer p-CGL2, the 1-2$^{nd}$ hole transport region HTR1-2, and the 2-2$^{nd}$ emission layer EML2-2, constituting the second light emitting element ED2 of FIG. 4 to FIG. 8, on the working substrate WS of FIG. 10D. In the second unit cell C-G of the second mask MSK_G, multiple second opening parts OP2 may be defined. The second opening parts OP may be defined in the display area DA of the second unit cell C-G.

Referring to FIG. 10I to FIG. 10N, the second p-type or kind charge generating layer p-CGL2, the 1-2$^{nd}$ hole transport region HTR1-2, and the 2-2$^{nd}$ emission layer EML2-2 may be formed on the n-type or kind charge generating layer n-CGL in order (e.g., sequentially). All the second p-type or kind charge generating layer p-CGL2, the 1-2$^{nd}$ hole transport region HTR1-2, and the 2-2$^{nd}$ emission layer EML2-2 may be formed utilizing the second mask MSK_G.

Referring to FIG. 10I, on the substrate SUB on which the first organic pattern is formed, the second mask MSK_G may be disposed. By utilizing the second mask MSK_G, the second p-type or kind charge generating layer p-CGL2 may be formed on the n-type or kind charge generating layer n-CGL. In the second mask MSK_G, second opening parts OP2 corresponding to the second pixel area PXA-2 may be defined, and the second p-type or kind charge generating layer p-CGL2 may be patterned and formed only in an area corresponding to the second pixel opening part OH2.

Figure 10M:
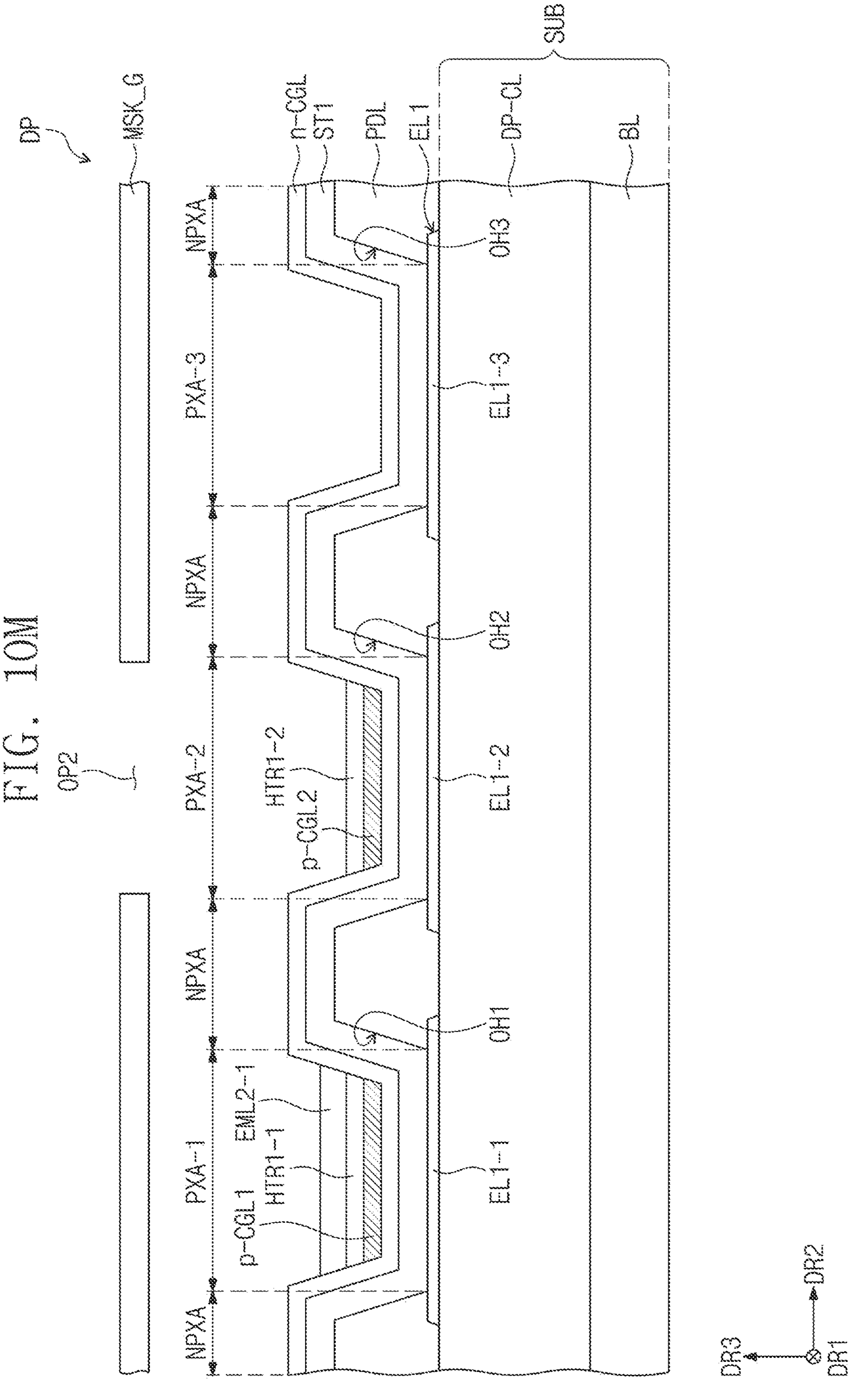

Referring to FIG. 10M, a step of forming the 1-2$^{nd}$ hole transport region HTR1-2 on the second p-type or kind charge generating layer p-CGL2 may be performed. By utilizing the second mask MSK_G, the 1-2$^{nd}$ hole transport region HTR1-2 may be formed on the second p-type or kind charge generating layer p-CGL2. The mask utilized for forming the 1-2$^{nd}$ hole transport region HTR1-2 may be the same as the second mask MSK_G utilized for forming the second p-type or kind charge generating layer p-CGL2. Accordingly, the 1-2$^{nd}$ hole transport region HTR1-2 may be patterned and formed only in an area corresponding to the second pixel opening part OH2.

Figure 10N:
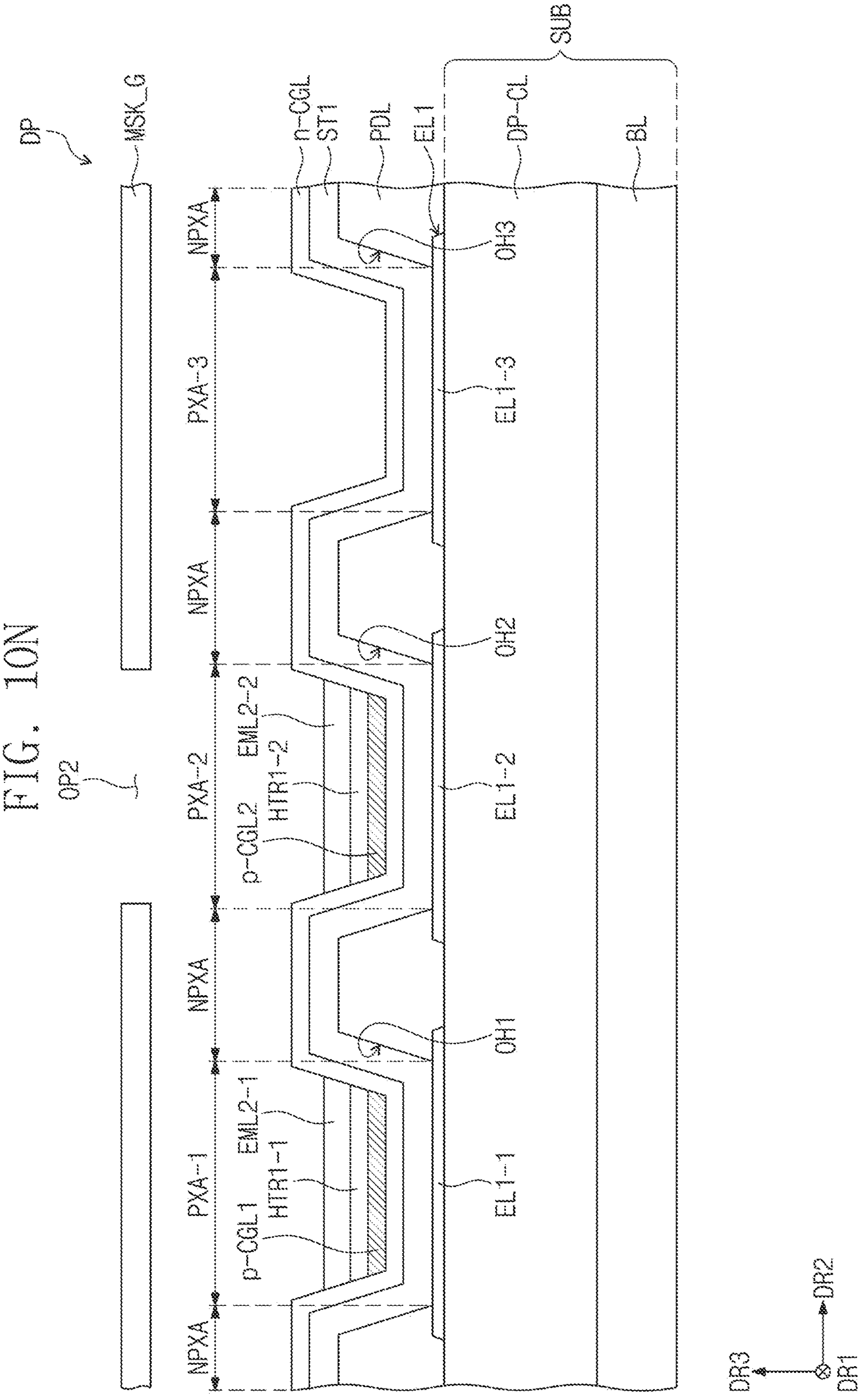
Figure 100:
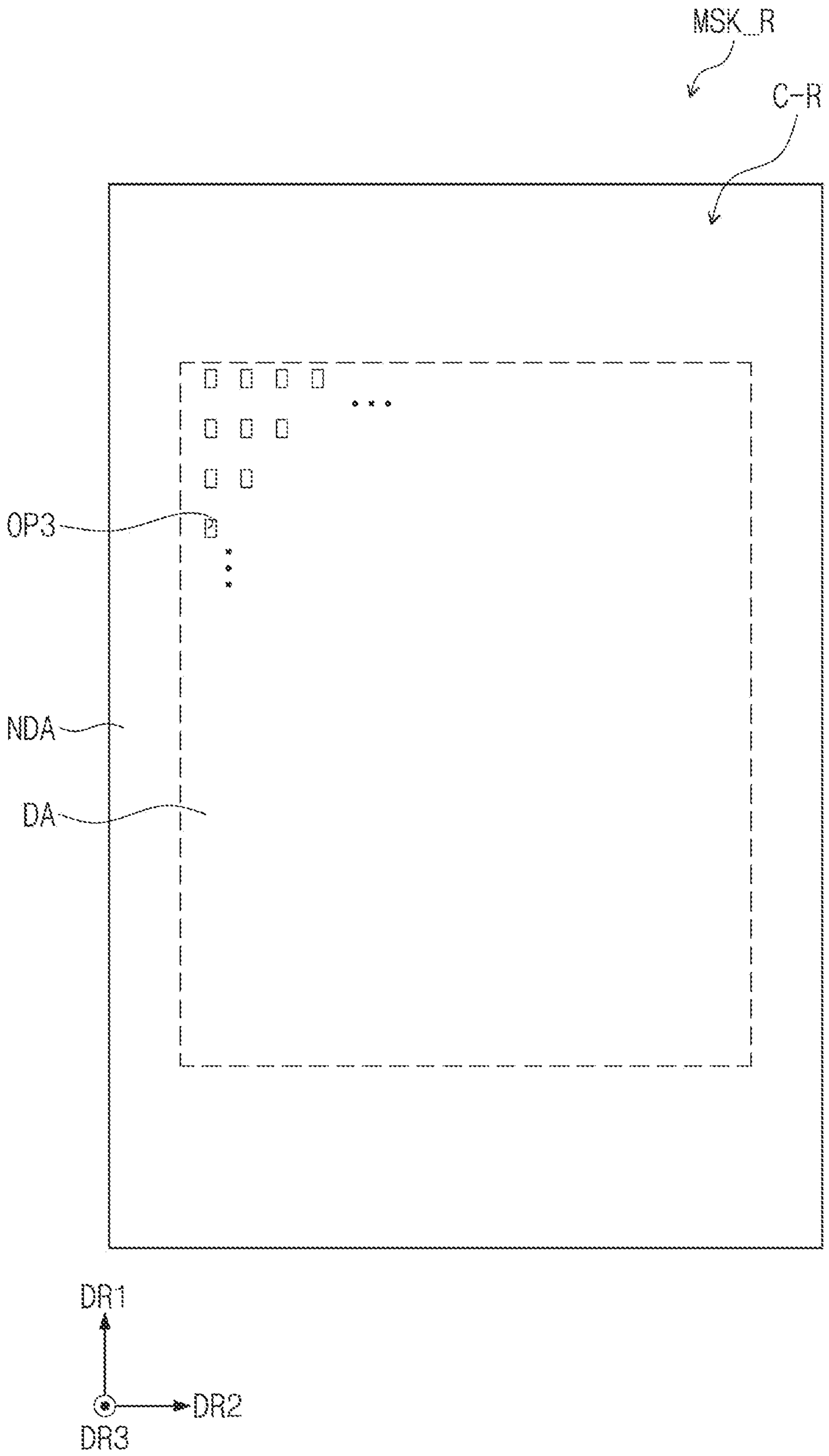

Referring to FIG. 10N, the step of forming the 2-2$^{nd}$ emission layer EML2-2 on the 1-2$^{nd}$ hole transport region HTR1-2 may be performed. By utilizing the second mask MSK_G, the 2-2$^{nd}$ emission layer EML2-2 may be formed on the 1-2$^{nd}$ hole transport region HTR1-2. The mask utilized for forming the 2-2$^{nd}$ emission layer EML2-2 may be the same as the mask utilized for forming the second p-type or kind charge generating layer p-CGL2 and the 1-2$^{nd}$ hole transport region HTR1-2. Accordingly, the 2-2$^{nd}$ emission layer EML2-2 may be patterned and formed only in an area corresponding to the second pixel opening part OH2.

In an embodiment, the second mask MSK_G may be utilized for forming the second p-type or kind charge generating layer p-CGL2, the 1-2$^{nd}$ hole transport region HTR1-2 and the 2-2$^{nd}$ emission layer EML2-2. After disposing the second mask MSK_G on the n-type or kind charge generating layer n-CGL, a fourth material for forming the second p-type or kind charge generating layer p-CGL2, a fifth material for forming the 1-2$^{nd}$ hole transport region HTR1-2, and a sixth material for forming the 2-2$^{nd}$ emission layer EML2-2 may be deposited in order (e.g., sequentially). Each of the fourth material, fifth material and sixth material passed through the second opening parts OP2 of the second mask MSK_G may constitute the second p-type or kind charge generating layer p-CGL2, the 1-2$^{nd}$ hole transport region HTR1-2, and the 2-2$^{nd}$ emission layer EML2-2 of the second light emitting element ED2 (FIG. 4 to FIG. 8).

In some embodiments, after the step of forming the 2-2$^{nd}$ emission layer EML2-2, a step of removing the second mask MSK_G may be performed.

The method of manufacturing the display device of an embodiment may further include a step of forming a third organic pattern after the step of forming the second organic pattern.

Referring to FIG. 10O to FIG. 10R, a step of forming the third organic pattern on the n-type or kind charge generating layer n-CGL may be performed after the step of forming the second organic pattern. The third organic pattern may be formed utilizing a third mask MSK_R. In the third unit cell C-R of the third mask MSK_R, multiple third opening parts OP3 may be defined.

The third mask MSK_R shown in FIG. 10O may be utilized for depositing the third p-type or kind charge generating layer p-CGL3, the 1-3$^{rd}$ hole transport region HTR1-3, and the 2-3$^{rd}$ emission layer EML2-3, constituting the third light emitting element ED3 of FIG. 6 to FIG. 8, on the working substrate WS of FIG. 10D. In the third unit cell C-R of the third mask MSK_R, multiple third opening parts OP3 may be defined. The third opening parts OP3 may be defined in the display area DA of the third unit cell C-R.

Figure 10P:
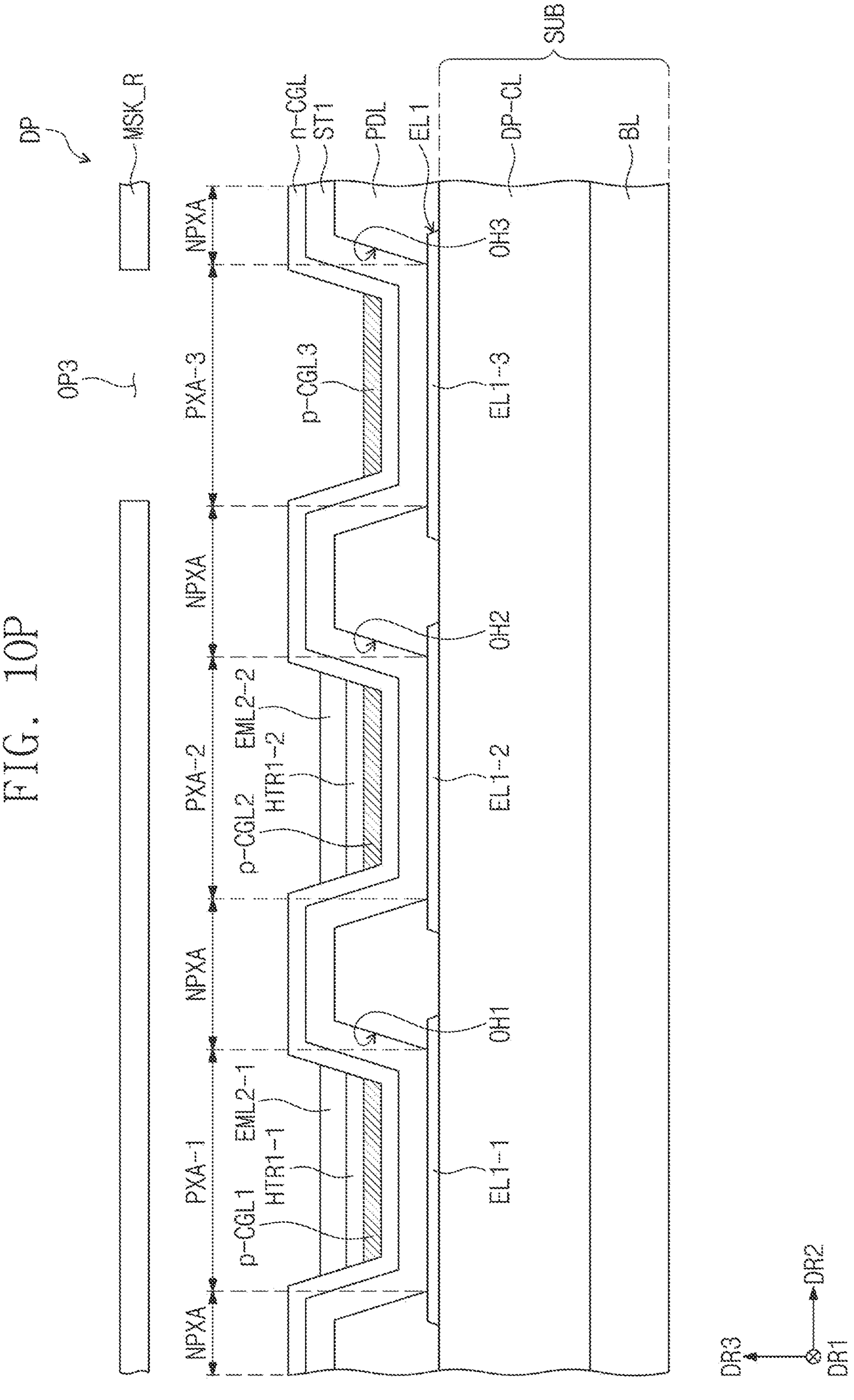
Figure 10Q:
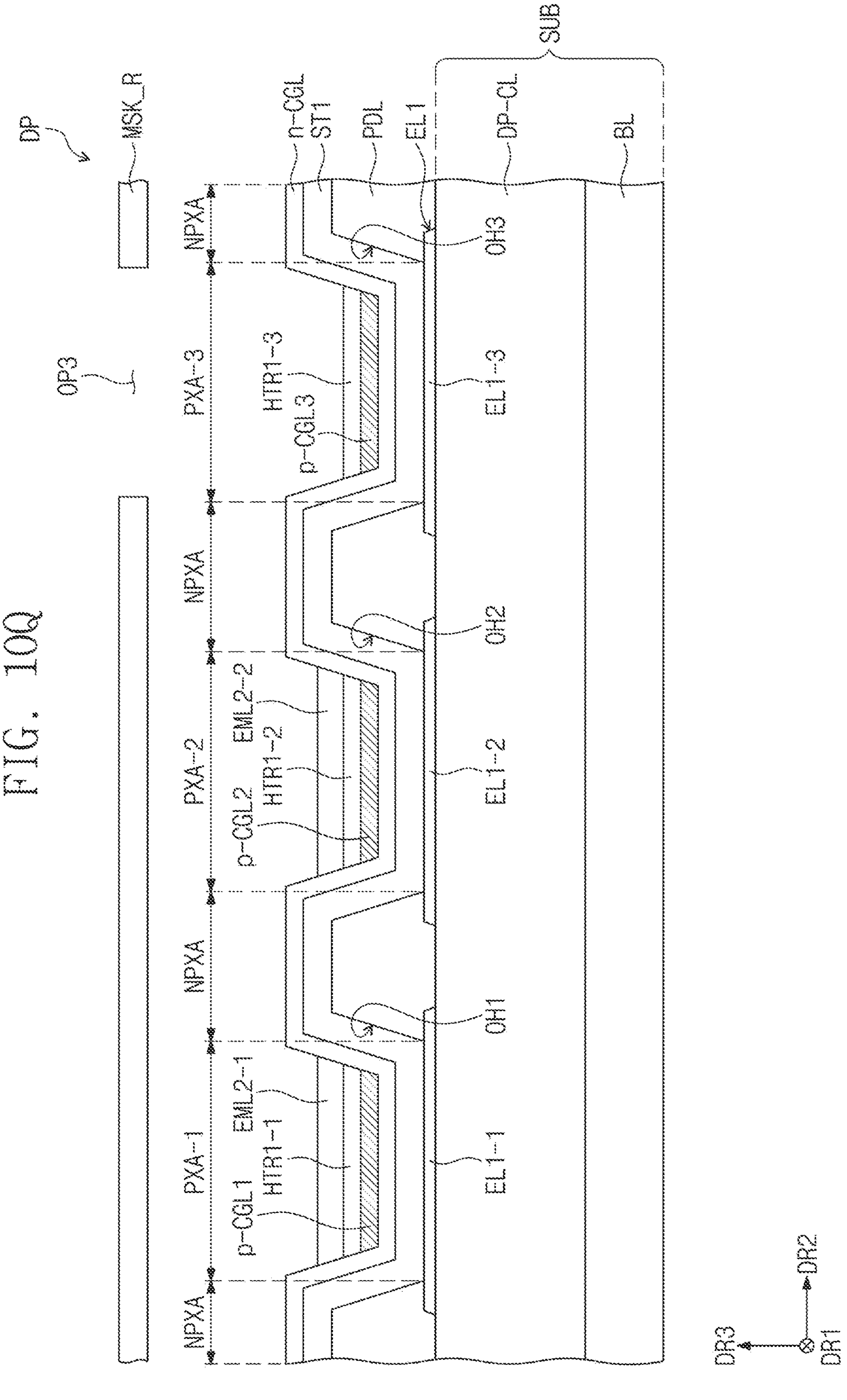
Figure 10R:
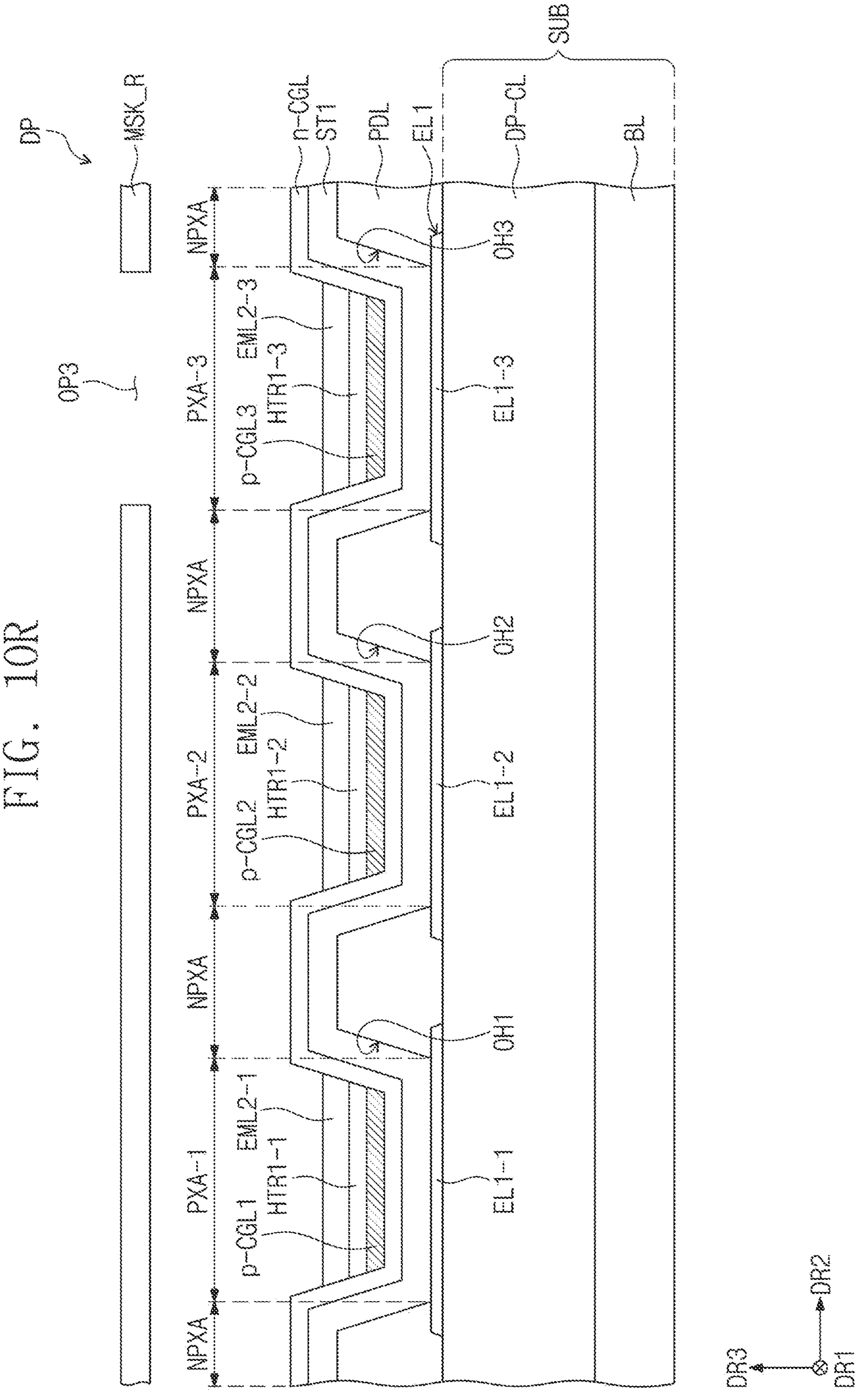
Figure 10S:
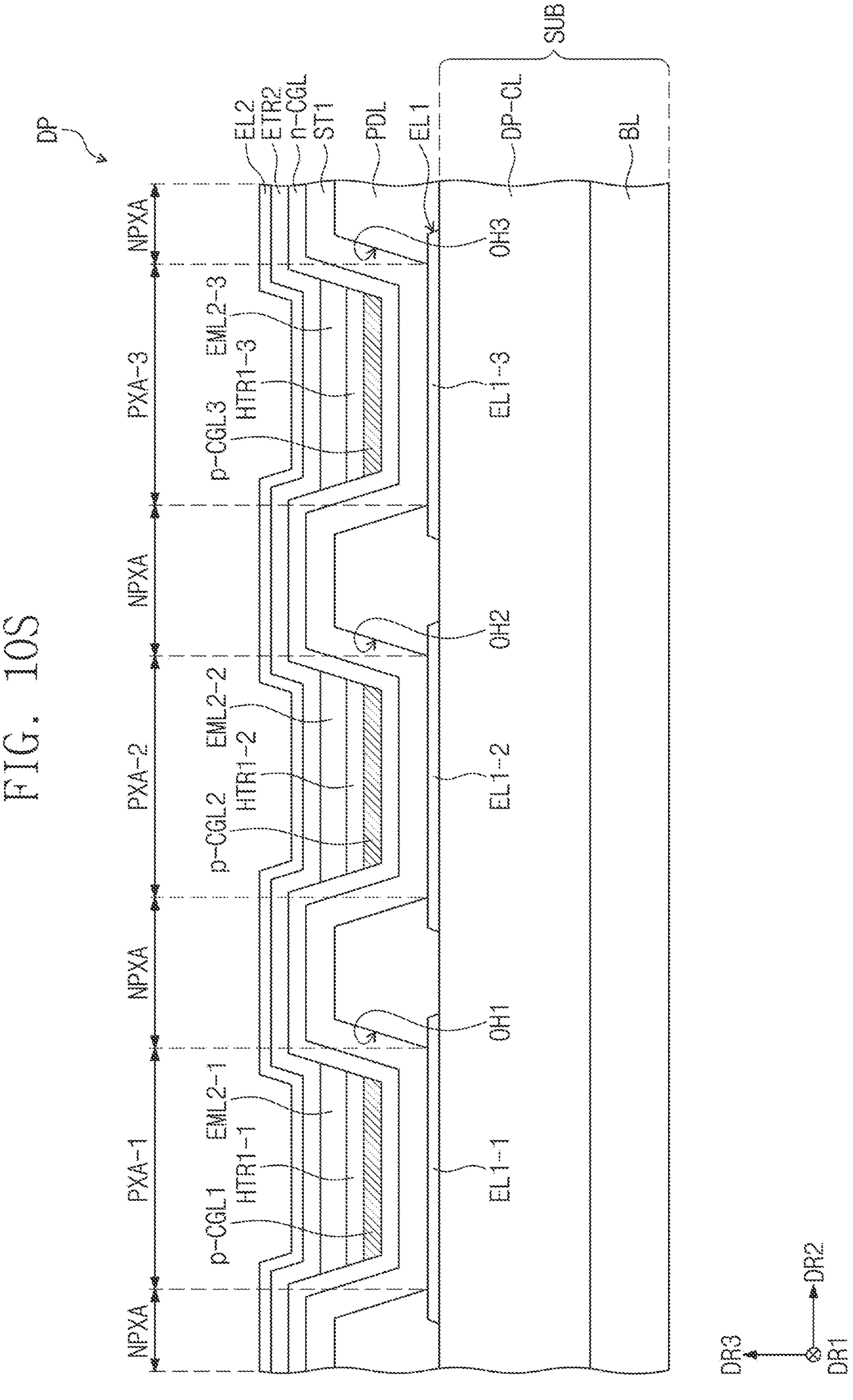

Referring to FIG. 10P to FIG. 10R, the third p-type or kind charge generating layer p-CGL3, the 1-3$^{rd}$ hole transport region HTR1-3, and the 2-3$^{rd}$ emission layer EML2-3 may be formed on the n-type or kind charge generating layer n-CGL in order (e.g., sequentially). All the third p-type or kind charge generating layer p-CGL3, the 1-3$^{rd}$ hole transport region HTR1-3, and the 2-3$^{rd}$ emission layer EML2-3 may be formed may be formed utilizing the third mask MSK_R.

Referring to FIG. 10P, on the substrate SUB on which the first organic pattern and the second organic pattern are formed, the third mask MSK_R may be disposed. By utilizing the third mask MSK_R, the third p-type or kind charge generating layer p-CGL3 may be formed on the n-type or kind charge generating layer n-CGL. In the third mask MSK_R, third opening parts OP3 corresponding to the third pixel area PXA-3 may be defined, and the third p-type or kind charge generating layer p-CGL3 may be patterned and formed only in an area corresponding to the third pixel opening part OH3.

Referring to FIG. 10Q, a step of forming the 1-3$^{rd}$ hole transport region HTR1-3 on the third p-type or kind charge generating layer p-CGL3 may be performed. By utilizing the third mask MSK_R, the 1-3$^{rd}$ hole transport region HTR1-3 may be formed on the third p-type or kind charge generating layer p-CGL3. The mask utilized for forming the 1-3$^{rd}$ hole transport region HTR1-3 may be the same as the third mask MSK_R utilized for forming the third p-type or kind charge generating layer p-CGL3. Accordingly, the 1-3$^{rd}$ hole transport region HTR1-3 may be patterned and formed only in an area corresponding to the third pixel opening part OH3.

Referring to FIG. 10R, a step of forming the 2-3$^{rd}$ emission layer EML2-3 on the 1-3$^{rd}$ hole transport region HTR1-3 may be performed. By utilizing the third mask MSK_R, the 2-3$^{rd}$ emission layer EML2-3 may be formed on the 1-3$^{rd}$ hole transport region HTR1-3. The mask utilized for forming the 2-3$^{rd}$ emission layer EML2-3 may be the same as the mask utilized for forming the third p-type or kind charge generating layer p-CGL3 and the 1-3$^{rd}$ hole transport region HTR1-3. Accordingly, the 2-3$^{rd}$ emission layer EML2-3 may be patterned and formed only in an area corresponding to the third pixel opening part OH3.

In an embodiment, the third mask MSK_R may be utilized for forming the third p-type or kind charge generating layer p-CGL3, the 1-3$^{rd}$ hole transport region HTR1-3 and the 2-3$^{rd}$ emission layer EML2-3. After disposing the third mask MSK_R on the n-type or kind charge generating layer n-CGL, a seventh material for forming the third p-type or kind charge generating layer p-CGL3, an eighth material for forming the 1-3$^{rd}$ hole transport region HTR1-3, and a ninth material for forming the 2-3$^{rd}$ emission layer EML2-3 may be deposited in order (e.g., sequentially). Each of the seventh material, eighth material and ninth material passed through the third opening parts OP3 of the third mask MSK_R may constitute the third p-type or kind charge generating layer p-CGL3, the 1-3$^{rd}$ hole transport region HTR1-3, and the 2-3$^{rd}$ emission layer EML2-3 of the third light emitting element ED3 (FIG. 6 to FIG. 8).

In an embodiment, the first material for forming the first p-type or kind charge generating layer p-CGL1, the fourth material for forming the second p-type or kind charge generating layer p-CGL2, and the seventh material for forming the third p-type or kind charge generating layer p-CGL3 may be all the same. However, an embodiment of the present disclosure is not limited thereto. At least one selected from among the first material, the fourth material and the seventh material may be different. In some embodiments, the second material for forming the 1-1$^{st}$ hole transport region HTR1-1, the fifth material for forming the 1-2$^{nd}$ hole transport region HTR1-2, and the eighth material for forming the 1-3$^{rd}$ hole transport region HTR1-3 may be all the same. However, an embodiment of the present disclosure is not limited thereto. At least one selected from among the second material, the fifth material and the eighth material may be different.

In some embodiments, a step of removing the third mask MSK_R may be performed after the step of forming the 2-3$^{rd}$ emission layer EML2-3.

Referring to FIG. 10S, after the steps for forming the first to third organic patterns, the steps of forming a second electron transport region ETR2 and a second electrode EL2 may be performed. On the 2-1$^{st}$ emission layer EML2-1, the 2-2$^{nd}$ emission layer EML2-2, and the 2-3$^{rd}$ emission layer EML2-3, the second electron transport region ETR2 may be formed. The second electron transport region ETR2 may be formed in common in multiple pixels utilizing an open mask. However, an embodiment of the present disclosure is not limited thereto. The second electron transport region ETR2 may be patterned and formed through a mask. For example, the second electron transport region ETR2 may be disposed in an area corresponding to the opening parts OH1, OH2 and OH3. For example, the second electron transport region ETR2 may be separately formed for individual pixels.

After the step of forming the second electron transport region ETR2, a step of forming the second electrode EL2 may be performed. The second electrode EL2 may be formed as a common layer on the second electron transport region ETR2. For example, the second electrode EL2 may be formed over the whole of the first to third pixel areas PXA-1, PXA-2 and PXA-3, and the non-pixel area NPXA.

In order to prevent or reduce the generation of lateral leakage current between adjacent pixels, a method of forming a p-type or kind charge generating layer for individual pixels utilizing a fine metal mask (FMM) may be utilized. However, when a p-type or kind charge generating layer is formed utilizing a FMM, a shadow distance where adjacent thin film patterns are deposited in overlap due to one or more suitable factors such as a deposition angle from a deposition source to the mask and the thickness of the mask, may be generated. When such a shadow distance is formed during the formation of the p-type or kind charge generating layer, overlapping portions of the p-type or kind charge generating layers may be produced, and the overlapping portions may act as a charge moving passage to generate the lateral leakage current between adjacent pixels.

According to the present disclosure, by patterning and forming the p-type or kind charge generating layer, the second hole transport region and the second emission layer, corresponding to each pixel area, as one organic pattern, in order utilizing multiple masks MSK_B, MSK_G and MSK_R overlapping with single pixels, the p-type or kind charge generating layer disposed in each pixel may be divided and separately disposed, though shadow due to the mask may occur, and the lateral leakage current may not be produced. For example, though an overlapping portion may be formed on a plane, the first to third charge generating layers p-CGL1, p-CGL2 and p-CGL3 may be separately disposed on a cross-section, and the lateral leakage current due to the p-type or kind charge generating layer may not be produced.

The display device according to an embodiment of the present disclosure includes a p-type or kind charge generating layer and a second hole transport region, which are separately disposed for each pixel, and may effectively block or reduce lateral leakage current to show improved display quality.

According to the manufacturing method of the display device according to an embodiment of the present disclosure, a p-type or kind charge generating layer, a second hole transport region, and a second emission layer, corresponding to each pixel area are regarded as one organic pattern and are patterned by pixels, and though shadow is produced by a mask, because the p-type or kind charge generating layer disposed in each pixel may be separately disposed up and down, lateral leakage current may be effectively blocked.

Although the embodiments of the present disclosure have been described, it is understood that the present disclosure should not be limited to these embodiments, but one or more suitable changes and modifications can be made by one ordinary skilled in the art within the spirit and scope of the present disclosure as hereinafter claimed, and equivalents thereof.

What is claimed is:

1. A display device, comprising:

a base layer in which multiple pixel areas comprising a first pixel area and a second pixel area adjacent to the first pixel area, and a non-pixel area around the multiple pixel areas;

a first electrode on the base layer;

a first light emitting stack on the first electrode and comprising a first emission layer;

an n-type charge generating layer on the first light emitting stack;

a p-type charge generating layer on the n-type charge generating layer;

a second light emitting stack comprising a hole transport region on the p-type charge generating layer, and a second emission layer on the hole transport region; and a second electrode on the second light emitting stack, wherein the p-type charge generating layer comprises:

a first p-type charge generating layer overlapping with the first pixel area; and a second p-type charge generating layer overlapping with the second pixel area and separate from the first p-type charge generating layer, and the hole transport region comprises:

a 1-1$^{st}$ hole transport region overlapping with the first pixel area; and a 1-2$^{nd}$ hole transport region overlapping with the second pixel area and separate from the 1-1$^{st}$ hole transport region.

2. The display device of claim 1, wherein the first emission layer comprises:

a 1-1$^{st}$ emission layer overlapping with the first pixel area; and a 1-2$^{nd}$ emission layer overlapping with the second pixel area, and the second emission layer comprises:

a 2-1$^{st}$ emission layer overlapping with the first pixel area; and a 2-2$^{nd}$ emission layer overlapping with the second pixel area.

3. The display device of claim 2, wherein the 2-1$^{st}$ emission layer and the 2-2$^{nd}$ emission layer are separate from each other.

4. The display device of claim 2, wherein the n-type charge generating layer is a common layer on the 1-1$^{st}$ emission layer and the 1-2$^{nd}$ emission layer.

5. The display device of claim 2, wherein a thickness of the 1-2$^{nd}$ emission layer is greater than a thickness of the 1-1$^{st}$ emission layer, and a thickness of the 2-2$^{nd}$ emission layer is greater than a thickness of the 2-1$^{st}$ emission layer.

6. The display device of claim 5, wherein the n-type charge generating layer has a constant thickness in the first pixel area and the second pixel area, and is configured to have a step on the 1-1$^{st}$ emission layer and the 1-2$^{nd}$ emission layer, and the step is defined as a height difference between a top surface of the n-type charge generating layer overlapping with the first pixel area and a top surface of the n-type charge generating layer overlapping with the second pixel area.

7. The display device of claim 2, wherein the 1-1$^{st}$ emission layer and the 1-2$^{nd}$ emission layer are configured to emit a first light, and the 2-1$^{st}$ emission layer and the 2-2$^{nd}$ emission layer are configured to emit a second light which is different from the first light.

8. The display device of claim 1, wherein the first light is blue light, and the second light is red light or green light.

9. The display device of claim 1, wherein the second p-type charge generating layer is overlapped with at least a portion of the first p-type charge generating layer on a plane, and the overlapping portion with the first p-type charge generating layer on the plane among the second p-type charge generating layer is separate from the first p-type charge generating layer on a cross-section.

10. The display device of claim 9, wherein the first p-type charge generating layer and the second p-type charge generating layer on the cross-section are separate from each other with at least one among the 1-1$^{st}$ hole transport region and the 1-2$^{nd}$ hole transport region therebetween.

11. The display device of claim 1, further comprising a buffer layer between the n-type charge generating layer and the p-type charge generating layer.

12. The display device of claim 1, wherein the second light emitting stack further comprises an electron transport region between the second emission layer and the second electrode, and the first light emitting stack further comprises:

a first hole transport region between the first electrode and the first emission layer; and a first electron transport region on the first emission layer.

13. The display device of claim 1, wherein the multiple pixel areas further comprise a third pixel area adjacent to the second pixel area, the p-type charge generating layer further comprises a third p-type charge generating layer which is overlapping with the third pixel area and is separate from the first p-type charge generating layer and the second p-type charge generating layer, and the hole transport region further comprises a 1-3$^{rd}$ hole transport region which is on the third p-type charge generating layer and is separate from the 1-1$^{st}$ hole transport region and the 1-2$^{nd}$ hole transport region.

14. A display device, comprising:

a base layer in which multiple pixel areas comprising a first pixel area configured to emit a first light and a second pixel area configured to emit a second light which is different from the first light, and a non-pixel area around the multiple pixel areas;

a first electrode on the base layer;

a 1-1$^{st}$ emission layer on the first electrode and overlapping with the first pixel area;

a 1-2$^{nd}$ emission layer on the first electrode and overlapping with the second pixel area;

an n-type charge generating layer on the 1-1$^{st}$ emission layer and the 1-2$^{nd}$ emission layer;

a first p-type charge generating layer on the n-type charge generating layer and overlapping with the first pixel area;

a second p-type charge generating layer on the n-type charge generating layer, overlapping with the second pixel area, and separate from the first p-type charge generating layer;

a 1-1$^{st}$ hole transport region on the first p-type charge generating layer;

a 1-2$^{nd}$ hole transport region on the second p-type charge generating layer and separate from the 1-1$^{st}$ hole transport region;

a 2-1$^{st}$ emission layer on the 1-1$^{st}$ hole transport region;

a 2-2$^{nd}$ emission layer on the 1-2$^{nd}$ hole transport region; and a second electrode on the 2-1$^{st}$ emission layer and on the 2-2$^{nd}$ emission layer.

15. The display device of claim 14, wherein the second p-type charge generating layer is overlapped with at least a portion of the first p-type charge generating layer in a plan view, and the overlapping portion with the first p-type charge generating layer in the plan view among the second p-type charge generating layer is separate from the first p-type charge generating layer in a cross-sectional view.

16. A method of manufacturing a display device, the method comprising:

preparing a substrate in which multiple pixel areas comprising a first pixel area and a second pixel area adjacent to the first pixel area, and a non-pixel area surrounding the multiple pixel areas;

forming a first electrode on the substrate;

forming a 1-1$^{st}$ emission layer overlapping with the first pixel area and a 1-2$^{nd}$ emission layer overlapping with the second pixel area on the first electrode;

forming an n-type charge generating layer on the 1-1$^{st}$ emission layer and the 1-2$^{nd}$ emission layer;

forming a first organic pattern comprising a first p-type charge generating layer, a 1-1$^{st}$ hole transport region, and a 2-1$^{st}$ emission layer which overlaps with the first pixel area on the n-type charge generating layer, by utilizing a first mask in which a first opening part overlapping with the first pixel area is defined;

forming a second organic pattern comprising a second p-type charge generating layer, a 1-2$^{nd}$ hole transport region, and a 2-2$^{nd}$ emission layer which overlaps with the second pixel area on the n-type charge generating layer, by utilizing a second mask in which a second opening part overlapping with the second pixel area is defined; and forming a second electrode on the first organic pattern and on the second organic pattern.

17. The method of manufacturing a display device of claim 16, wherein the forming of the first organic pattern comprises:

applying the first mask on the n-type charge generating layer;

forming the first p-type charge generating layer overlapping with the first pixel area on the n-type charge generating layer;

forming the 1-1$^{st}$ hole transport region on the first p-type charge generating layer;

forming the 2-1$^{st}$ emission layer on the 1-1$^{st}$ hole transport region; and removing the first mask.

18. The method of manufacturing a display device of claim 17, wherein the forming of the second organic pattern comprises:

disposing the second mask on the n-type charge generating layer;

forming the second p-type charge generating layer overlapping with the second pixel area on the n-type charge generating layer;

forming the 1-2$^{nd}$ hole transport region on the second p-type charge generating layer;

forming the 2-2$^{nd}$ emission layer on the 1-2$^{nd}$ hole transport region; and removing the second mask.

19. The method of manufacturing a display device of claim 18, wherein, during the forming of the second p-type charge generating layer, the second p-type charge generating layer is formed to overlap with at least a portion of the first p-type charge generating layer in a plan view, and the portion overlapping with the first p-type charge generating layer in the plan view among the second p-type charge generating layer is separated from the first p-type charge generating layer.

20. The method of manufacturing a display device of claim 16, wherein the forming of the n-type charge generating layer is performed by utilizing an open mask in which an opening part overlapping with the first pixel area and the second pixel area is defined.

* * * * *